(12) United States Patent
Moore

(10) Patent No.: US 10,708,691 B2
(45) Date of Patent: Jul. 7, 2020

(54) DYNAMIC EQUALIZATION IN A DIRECTIONAL SPEAKER ARRAY

(71) Applicant: EVA Automation, Inc., Redwood City, CA (US)

(72) Inventor: Jonathan Moore, Hove (GB)

(73) Assignee: EVA Automation, Inc., Menlo Park, CA (US)

(*) Notice: Subject to any disclaimer, the term of this patent is extended or adjusted under 35 U.S.C. 154(b) by 0 days.

(21) Appl. No.: 16/015,643

(22) Filed: Jun. 22, 2018

(65) Prior Publication Data
US 2019/0394569 A1 Dec. 26, 2019

(51) Int. Cl.
H04R 3/12 (2006.01)
H04R 1/40 (2006.01)
H03G 5/16 (2006.01)

(52) U.S. Cl.
CPC .............. *H04R 3/12* (2013.01); *H03G 5/165* (2013.01); *H04R 1/403* (2013.01); *H04R 2203/12* (2013.01); *H04R 2420/07* (2013.01); *H04R 2430/01* (2013.01); *H04R 2430/20* (2013.01)

(58) Field of Classification Search
CPC ...... H04R 3/12; H04R 1/403; H04R 2203/12; H04R 2420/07; H04R 2430/01; H04R 2430/20; H03G 5/165
USPC ........................................................ 381/103
See application file for complete search history.

(56) References Cited

U.S. PATENT DOCUMENTS

| | | | |
|---|---|---|---|
| 5,815,580 A | 9/1998 | Craven | 381/58 |
| 7,529,377 B2 | 5/2009 | Nackvi | 381/103 |
| 8,930,005 B2 | 1/2015 | Reimann | 700/94 |
| 9,042,556 B2 | 5/2015 | Kallai | 381/11 |
| 9,084,058 B2 | 7/2015 | Reilly | H04R 27/00 |
| 9,106,192 B2 | 8/2015 | Sheen | H03G 5/005 |
| 9,165,371 B2 | 10/2015 | Hampiholi | G06T 7/0085 |
| 9,219,460 B2 | 12/2015 | Bush | H03G 5/165 |
| 9,236,843 B2 | 1/2016 | Hess | H03G 3/00 |
| 9,264,839 B2 | 1/2016 | Oishi | G06F 3/165 |
| 9,313,591 B2 | 4/2016 | Sheen | H04R 27/00 |

(Continued)

FOREIGN PATENT DOCUMENTS

| EP | 0898364 | 2/1999 | H03H 21/00 |
|---|---|---|---|
| WO | WO2002041664 | 5/2002 | H04S 7/303 |

OTHER PUBLICATIONS http://www.techradar.com/news/the-makers-of-roomba-could-one-day-sell-maps-of-your-home.

(Continued)

*Primary Examiner* — Davetta W Goins
*Assistant Examiner* — Daniel R Sellers
(74) *Attorney, Agent, or Firm* — Steven Stupp

(57) ABSTRACT

An electronic device that provides dynamic equalization in a directional speaker array is described. Based at least in part on audio content and an acoustic radiation pattern associated with a second electronic device, the electronic device may determine drive signals for a set of drivers. Then, the electronic device may adjust the drive signals for at least a subset of the set of drivers based at least in part on a distortion margin in at least the subset of the drivers, where the distortion margin is based at least in part on the drive signals, a distortion threshold of at least the subset of the drivers and a volume setting. Next, based at least in part on the adjusted drive signals, the electronic device may output, using the set of drivers, the sound corresponding to the audio content.

20 Claims, 41 Drawing Sheets

(56) References Cited

U.S. PATENT DOCUMENTS

| | | | |
|---|---|---|---|
| 9,323,404 B2 | 4/2016 | Calatayud | G06F 3/044 |
| 9,344,829 B2 | 5/2016 | Oishi | G06F 3/165 |
| 9,348,354 B2 | 5/2016 | Millington | H04J 3/0664 |
| 9,363,601 B2 | 6/2016 | Ramos | H04R 3/12 |
| 9,367,283 B2 | 6/2016 | Kuper | G06F 3/16 |
| 9,369,104 B2 | 6/2016 | Ramos | H04R 5/04 |
| 9,379,683 B2 | 6/2016 | Marino | H03G 3/10 |
| 9,419,575 B2 | 8/2016 | Bush | H03G 5/165 |
| 9,426,598 B2 | 8/2016 | Walsh | H04S 7/301 |
| 9,432,791 B2 | 8/2016 | Chatterjee | H04S 7/301 |
| 9,439,021 B2 | 9/2016 | Oishi | G06F 3/165 |
| 9,439,022 B2 | 9/2016 | Oishi | G06F 3/165 |
| 9,455,679 B2 | 9/2016 | Marino | H03G 3/10 |
| 9,516,449 B2 | 12/2016 | Lehane | H04W 24/02 |
| 9,521,487 B2 | 12/2016 | Oishi | G06F 3/165 |
| 9,521,488 B2 | 12/2016 | Oishi | G06F 3/165 |
| 9,525,931 B2 | 12/2016 | Wiggin | H04R 1/023 |
| 9,538,300 B2 | 1/2017 | Sheen | H04R 27/00 |
| 9,544,707 B2 | 1/2017 | Ramos | H04R 5/04 |
| 9,549,258 B2 | 1/2017 | Ramos | H04R 3/12 |
| 9,658,820 B2 | 5/2017 | Millington | H04J 3/0664 |
| 9,665,341 B2 | 5/2017 | Lin | G06F 3/165 |
| 9,712,916 B2 | 7/2017 | Katsianos | H03G 3/00 |
| 9,727,303 B2 | 8/2017 | Millington | H04J 3/0664 |
| 9,734,242 B2 | 8/2017 | Millington | H04N 21/242 |
| 9,762,999 B1 | 9/2017 | Johnson | H04R 1/403 |
| 9,778,898 B2 | 10/2017 | Millington | H04J 3/0664 |
| 9,778,900 B2 | 10/2017 | Millington | H04J 3/0664 |
| 9,813,829 B2 | 11/2017 | Sheen | H04R 27/00 |
| 2002/0124097 A1 | 9/2002 | Isely | 709/231 |
| 2004/0131338 A1 | 7/2004 | Asada | 386/96 |
| 2004/0151325 A1* | 8/2004 | Hooley | F41H 13/0081 381/18 |
| 2005/0254662 A1 | 11/2005 | Blank | 381/58 |
| 2006/0153391 A1 | 7/2006 | Hooley | 381/17 |
| 2006/0204022 A1* | 9/2006 | Hooley | H04R 1/403 381/117 |
| 2009/0028358 A1 | 1/2009 | Suzuki | 381/97 |
| 2009/0034763 A1* | 2/2009 | Takumai | H04R 1/403 381/300 |
| 2009/0304211 A1* | 12/2009 | Tashev | H04R 3/12 381/182 |
| 2010/0053466 A1* | 3/2010 | Naka | H04N 5/4403 348/734 |
| 2010/0322435 A1 | 12/2010 | Suzuki | 381/92 |
| 2011/0069841 A1 | 3/2011 | Angeloff | 381/117 |
| 2012/0038827 A1* | 2/2012 | Davis | H04N 5/45 348/588 |
| 2012/0051568 A1* | 3/2012 | Kim | H04R 1/403 381/307 |
| 2012/0185769 A1* | 7/2012 | Whitley | H04H 60/04 715/716 |
| 2013/0058505 A1* | 3/2013 | Munch | G10K 11/32 381/120 |
| 2013/0223658 A1 | 8/2013 | Betlehem | 381/307 |
| 2014/0064526 A1* | 3/2014 | Otto | H04S 5/00 381/300 |
| 2014/0161265 A1 | 6/2014 | Chaikin | 381/59 |
| 2015/0382129 A1 | 12/2015 | Florencio | H04S 7/303 |
| 2016/0021481 A1 | 1/2016 | Johnson | H04S 7/305 |
| 2016/0174011 A1 | 6/2016 | Rider | H04S 7/303 |
| 2016/0295340 A1* | 10/2016 | Baker | H04R 1/403 |
| 2017/0195790 A1 | 7/2017 | Choisel | H04R 3/04 |
| 2017/0195815 A1* | 7/2017 | Christoph | H04S 7/303 |
| 2017/0238090 A1 | 8/2017 | Johnson | 381/335 |
| 2017/0329410 A1 | 11/2017 | Chiang | G06F 3/017 |
| 2017/0359467 A1 | 12/2017 | Norris | H04M 3/568 |
| 2017/0374465 A1 | 12/2017 | Family | H04R 3/12 |
| 2018/0063665 A1* | 3/2018 | Walker | G06F 3/04817 |
| 2018/0242095 A1 | 8/2018 | Patil | H04S 7/301 |
| 2018/0242097 A1* | 8/2018 | Kriegel | H04R 1/403 |
| 2018/0253276 A1 | 9/2018 | Kodama | G06F 3/165 |

OTHER PUBLICATIONS

U.S. Appl. No. 16/015,607, Non-Final Office Action, dated Jan. 8, 2019.

U.S. Appl. No. 16/015,607, Response to Non-Final Office Action, dated Apr. 7, 2019.

* cited by examiner

DYNAMIC EQUALIZATION IN A DIRECTIONAL SPEAKER ARRAY

CROSS REFERENCE TO RELATED APPLICATIONS

This application is related to: U.S. Non-Provisional application Ser. No. 16/015,607, "Closed-Loop Adaptation of 3D Sound," by Jonathan Moore, filed on Jun. 22, 2018; U.S. Non-Provisional application Ser. No. 16/015,690, "Volume Normalization," by Jonathan Moore, filed on Jun. 22, 2018; U.S. Non-Provisional application Ser. No. 16/015,781, "Automatic Room Filling," by Jonathan Moore, filed on Jun. 22, 2018; U.S. Non-Provisional application Ser. No. 16/016,451, "Dynamically Adapting Sound Based on Environmental Characterization," by Jonathan Moore, filed on Jun. 22, 2018; U.S. Non-Provisional application Ser. No. 16/016,469, "Dynamically Adapting Sound Based on Background Sound," by Jonathan Moore, filed on Jun. 22, 2018; U.S. Non-Provisional application Ser. No. 16/016,481, "Automatic De-Baffling," by Jonathan Moore, filed on Jun. 22, 2018; U.S. Non-Provisional application Ser. No. 16/016,489, "Sound Adaptation Based on Content and Context," by Jonathan Moore, filed on Jun. 22, 2018; U.S. Non-Provisional application Ser. No. 16/016,526, "Active Room Shaping and Noise Control," by Jonathan Moore, filed on Jun. 22, 2018; U.S. Non-Provisional application Ser. No. 16/016,533, "Dynamic Cross-Talk Cancellation," by Jonathan Moore, filed on Jun. 22, 2018; and U.S. Non-Provisional application Ser. No. 16/016,539, "Self-Configuring Speakers," by Jonathan Moore, filed on Jun. 22, 2018.

BACKGROUND

Field

The described embodiments relate to an adaptation technique. More specifically, the described embodiments include an adaptation technique that dynamically adapts the output sound from a set of drivers or speakers.

Related Art

Music often has a significant impact on an individual's emotions and perceptions. This is thought to be a result of connections or relationships between the areas of the brain that decipher, learn, and remember music with those that produce emotional responses, such as the frontal lobes and limbic system. Indeed, emotions are thought to be involved in the process of interpreting music, and concurrently are very important in the effect of music on the brain. Given this ability of music to 'move' a listener, audio quality is often an important factor in user satisfaction when listening to audio content and, more generally, when viewing and listening to audio/video (A/V) content.

However, it is often challenging to achieve high audio quality in an environment. For example, the acoustic sources (such as speakers, which are sometimes referred to as 'loudspeakers') may not be properly placed in the environment. Alternatively or additionally, a listener may not be located at an ideal position in the environment. In particular, in a stereo playback system, the so-called 'sweet spot,' where the amplitude differences and arrival time differences are small enough that an apparent image and localization of an original sound source are both maintained, is usually limited to a fairly small area between the speakers. When the listener is outside that area, the apparent image collapses and only one or the other independent audio channel output by the speakers may be heard. Furthermore, achieving high audio quality in the environment typically places strong constraints on synchronization of the speakers.

Consequently, when one or more of these factors is sub-optimal, the acoustic quality in the environment may be degraded. In turn, this may adversely impact listener satisfaction and the overall user experience when listening to audio content and/or A/V content.

SUMMARY

A first group of embodiments describe an electronic device that performs dynamic equalization in a directional speaker array. This electronic device includes an interface circuit that communicates with a second electronic device, and a set of drivers that outputs sound. Moreover, the electronic device receives, at the interface circuit, audio content and an acoustic radiation pattern associated with the second electronic device, where the acoustic radiation pattern has a beam with a principal direction. Then, the electronic device determines drive signals for the set of drivers based at least in part on the audio content and the acoustic radiation pattern. Furthermore, the electronic device adjusts the drive signals for at least a subset of the set of drivers based at least in part on a distortion margin in at least the subset of the drivers, where the distortion margin is based at least in part on the drive signals, a distortion threshold of at least the subset of the drivers and a volume setting. Next, the electronic device outputs, based at least in part on the adjusted drive signals and the acoustic radiation pattern, the sound corresponding to the audio content using the set of drivers.

Note that the adjusted drive signals may limit displacement of cones in at least the subset of the drivers to reduce sound distortion.

Moreover, the volume setting may correspond a sound pressure level (SPL).

Furthermore, the adjustment may back off from a directional acoustic radiation pattern toward an omnidirectional acoustic radiation pattern in at least a band of audio frequencies based at least in part on the distortion margin and a first threshold.

Additionally, the adjustment may reduce an amplitude of the drive signals in a second band of audio frequencies based at least in part on the distortion margin and a second threshold.

In some embodiments, when the volume setting exceeds a first threshold, the adjusted drive signals are associated with an omnidirectional acoustic radiation pattern. Alternatively, when the volume setting is below the first threshold, the adjusted drive signals may be associated with a directional acoustic radiation pattern.

Another embodiment provides a computer-readable storage medium for use with the electronic device. This computer-readable storage medium includes program instructions that, when executed by the electronic device, cause the electronic device to perform at least some of the aforementioned operations.

Another embodiment provides a method for adjusting drive signals. This method includes at least some of the operations performed by the electronic device.

Another embodiment provides the second electronic device. This second electronic device may perform at least some of the aforementioned operations, either in conjunction with or instead of the electronic device. Thus, the electronic device may determine the acoustic radiation pattern and/or the second electronic device may adjust the drive signals.

This Summary is only provided for purposes of illustrating some exemplary embodiments, so as to provide a basic understanding of some aspects of the subject matter described herein. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
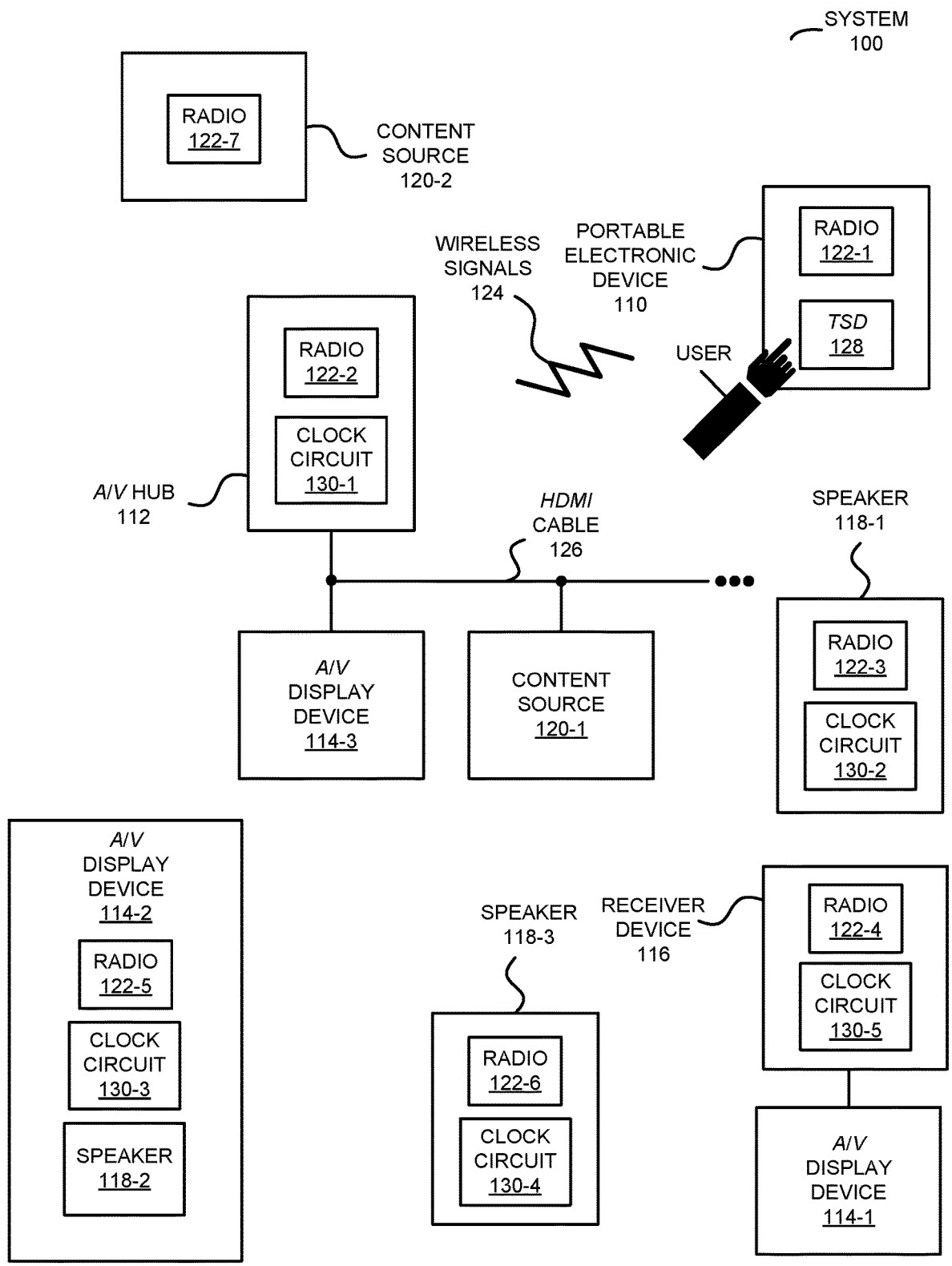
FIG. 1 is a block diagram illustrating an example of a system with electronic devices in accordance with an embodiment of the present disclosure.

In a first group of embodiments, an electronic device that provides dynamic equalization in a directional speaker array is described. Based at least in part on audio content and an acoustic radiation pattern associated with a second electronic device, the electronic device may determine drive signals for a set of drivers. Then, the electronic device may adjust the drive signals for at least a subset of the set of drivers based at least in part on a distortion margin in at least the subset of the drivers, where the distortion margin is based at least in part on the drive signals, a distortion threshold of at least the subset of the drivers and a volume setting. For example, the adjusted drive signals may limit displacement of cones in at least the subset of the drivers to reduce sound distortion. Next, based at least in part on the adjusted drive signals, the electronic device may output, using the set of drivers, the sound corresponding to the audio content.

By dynamically equalizing the drive signals for the directional speaker array (such as the set of drivers), this adaptation technique may provide an improved acoustic or listening experience to one or more individuals in an environment. This capability may be enhanced by adapting the acoustic radiation pattern with at least reduced sound distortion, so that the listening experience may be closer to ideal, in the sense of allowing the second electronic device to continue to faithfully reproduce the audio content as it was originally recorded or generated. In these ways, the adaptation technique may improve the user experience when using the electronic device and/or the second electronic device. Consequently, the adaptation technique may increase customer loyalty and revenue of a provider of the electronic device electronic device and/or the second electronic device.

In the discussion that follows, instances of one or more electronic devices, such as an audio/video (A/V) hub, an A/V display device, a portable electronic device, a receiver device, a speaker and/or a consumer-electronic device, may include one or more radios that wirelessly communicate packets or frames in accordance with one or more communication protocols, such as: an Institute of Electrical and Electronics Engineers (IEEE) 802.11 standard (which is sometimes referred to as 'Wi-Fi®,' from the Wi-Fi® Alliance of Austin, Tex.), Bluetooth® (from the Bluetooth Special Interest Group of Kirkland, Wash.), a cellular-telephone communication protocol, a near-field-communication standard or specification (from the NFC Forum of Wakefield, Mass.), and/or another type of wireless interface. For example, the cellular-telephone communication protocol may include or may be compatible with: a $2^{nd}$ generation of mobile telecommunication technology, a $3^{rd}$ generation of mobile telecommunications technology (such as a communication protocol that complies with the International Mobile Telecommunications-2000 specifications by the International Telecommunication Union of Geneva, Switzerland), a $4^{th}$ generation of mobile telecommunications technology (such as a communication protocol that complies with the International Mobile Telecommunications Advanced specification by the International Telecommunication Union of Geneva, Switzerland), and/or another cellular-telephone communication technique. In some embodiments, the communication protocol includes Long Term Evolution or LTE. However, a wide variety of communication protocols may be used (such as Ethernet). In addition, the wireless communication may occur via a wide variety of frequency bands, such as at or in: a 2 GHz wireless band, a 5 GHz wireless band, an ISM band, a 60 GHz wireless band, ultra-wide band, etc. Note that the electronic devices may communicate using infra-red communication that is compatible with an infra-red communication standard (including unidirectional or bidirectional infra-red communication).

Moreover, A/V content in following discussion (which is sometimes referred to as 'content') may include video and associated audio (such as music, sound, dialog, etc.), video only or audio only. The A/V content may be compatible with a wide variety of audio and/or video formats.

Communication among electronic devices is shown in FIG. 1, which presents a block diagram illustrating an example of a system 100 with a portable electronic device 110 (such as a remote control or a cellular telephone), one or more A/V hubs (such as A/V hub 112, and more generally a physical or software-based access point), one or more A/V display devices 114 (such as a television, a monitor, a computer and, more generally, a display associated with an electronic device), one or more receiver devices (such as receiver device 116, e.g., a local wireless receiver associated with a proximate A/V display device 114-1 that can receive frame-by-frame transcoded A/V content from A/V hub 112 for display on A/V display device 114-1), one or more speakers 118 (and, more generally, one or more electronic devices that include one or more speakers) that can receive and output audio data or content, and/or one or more content sources 120 associated with one or more content providers. For example, the one or more content sources 120 may include: a radio receiver, a video player, a satellite receiver, an access point that provides a connection to a wired network such as the Internet, a media or a content source, a consumer-electronic device, an entertainment device, a set-top box, over-the-top content delivered over the Internet or a network without involvement of a cable, satellite or multiple-system operator, a security camera, a monitoring camera, etc. Note that A/V hub 112, A/V display devices 114, receiver device 116 and speakers 118 are sometimes collectively referred to as 'components' in system 100. However, A/V hub 112, A/V display devices 114, receiver device 116 and/or speakers 118 are sometimes referred to as 'electronic devices.'

In particular, portable electronic device 110 and A/V hub 112 may communicate with each other using wireless communication, and one or more other components in system 100 (such as at least: one of A/V display devices 114, receiver device 116, one of speakers 118 and/or one of content sources 120) may communicate using wireless and/or wired communication. During the wireless communication, these electronic devices may wirelessly communicate while: transmitting advertising frames on wireless channels, detecting one another by scanning wireless channels, establishing connections (for example, by transmitting association requests), and/or transmitting and receiving packets or frames (which may include the association requests and/or additional information as payloads, such as information specifying communication performance, data, audio and/or video content, timing information, etc.).

Figure 41:
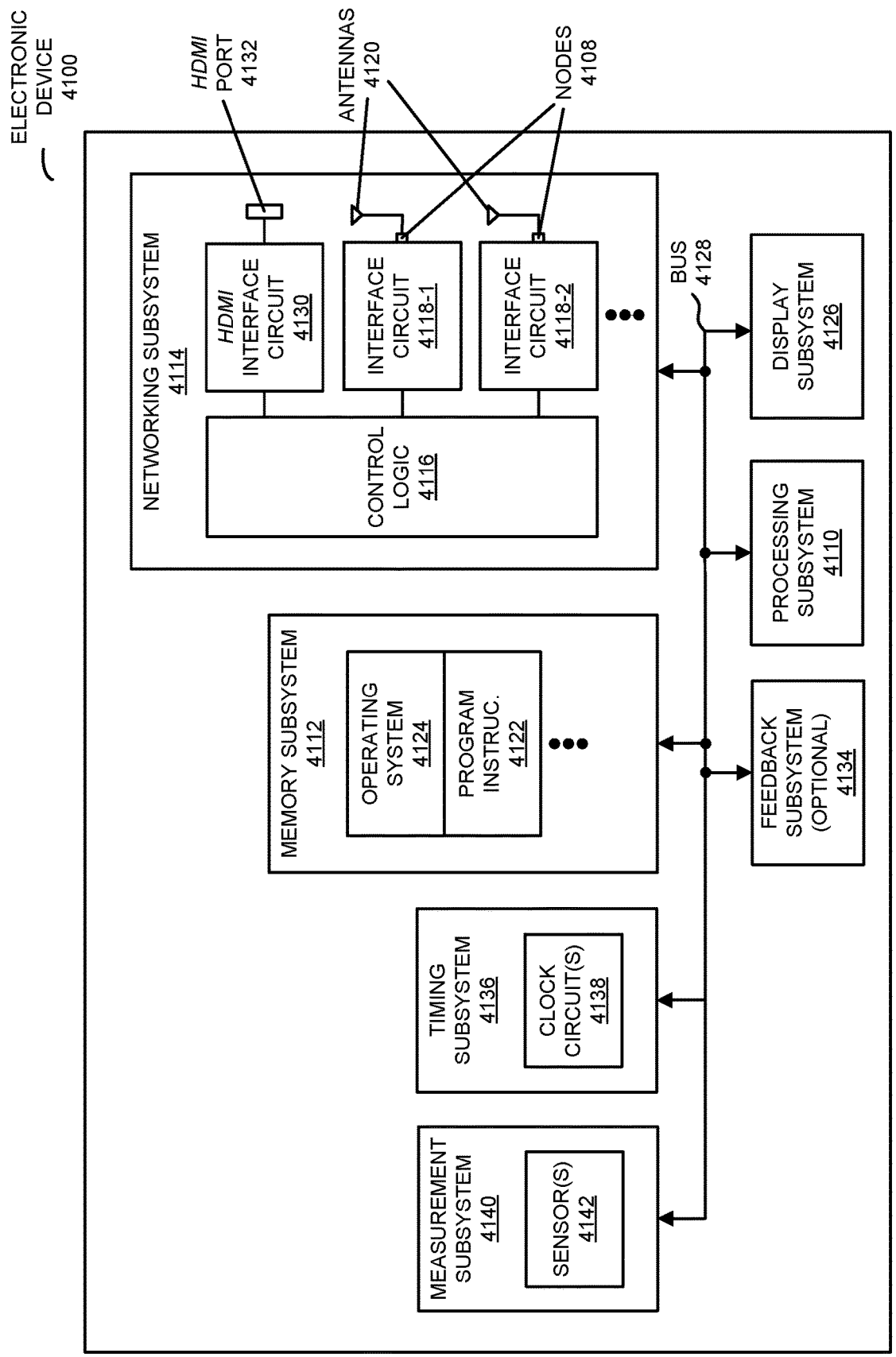
FIG. 41 is a block diagram illustrating an example of one of the electronic devices of FIG. 1 in accordance with an embodiment of the present disclosure.

As described further below with reference to FIG. 41, portable electronic device 110, A/V hub 112, A/V display devices 114, receiver device 116, speakers 118 and content sources 120 may include subsystems, such as: a networking subsystem, a memory subsystem and a processor subsystem. In addition, portable electronic device 110, A/V hub 112, receiver device 116, and/or speakers 118, and optionally one or more of A/V display devices 114 and/or content sources 120, may include radios 122 in the networking subsystems. Note that in some embodiments a radio or receiver device is in an A/V display device, e.g., radio 122-5 is included in A/V display device 114-2.) Moreover, note that radios 122 may be instances of the same radio or may be different from each other. More generally, portable electronic device 110, A/V hub 112, receiver device 116 and/or speakers 118 (and optionally A/V display devices 114 and/or content sources 120) can include (or can be included within) any electronic devices with the networking subsystems that enable portable electronic device 110, A/V hub 112 receiver device 116 and/or speakers 118 (and optionally A/V display devices 114 and/or content sources 120) to wirelessly communicate with each other. This wireless communication can comprise transmitting advertisements on wireless channels to enable electronic devices to make initial contact or detect each other, followed by exchanging subsequent data/management frames (such as association requests and responses) to establish a connection, configure security options (e.g., Internet Protocol Security), transmit and receive packets or frames via the connection, etc.

As can be seen in FIG. 1, wireless signals 124 (represented by a jagged line) are transmitted from radio 122-1 in portable electronic device 110. These wireless signals are received by at least one of: A/V hub 112, receiver device 116 and/or at least one of speakers 118 (and, optionally, one or more of A/V display devices 114 and/or content sources 120). For example, portable electronic device 110 may transmit packets. In turn, these packets may be received by a radio 122-2 in A/V hub 112. This may allow portable electronic device 110 to communicate information to A/V hub 112. While FIG. 1 illustrates portable electronic device 110 transmitting packets, note that portable electronic device 110 may also receive packets from A/V hub 112 and/or one or more other components in system 100. More generally, wireless signals may be transmitted and/or received by one or more of the components in system 100.

In the described embodiments, processing of a packet or frame in portable electronic device 110, A/V hub 112, receiver device 116 and/or speakers 118 (and optionally one or more of A/V display devices 114 and/or content sources 120) includes: receiving wireless signals 124 with the packet or frame; decoding/extracting the packet or frame from received wireless signals 124 to acquire the packet or frame; and processing the packet or frame to determine information contained in the packet or frame (such as the information associated with a data stream). For example, the information from portable electronic device 110 may include user-interface activity information associated with a user interface displayed on touch-sensitive display (TSD) 128 in portable electronic device 110, which a user of portable electronic device 110 uses to control at least: A/V hub 112, at least one of A/V display devices 114, at least one of speakers 118 and/or at least one of content sources 120. (In some embodiments, instead of or in additional to touch-sensitive display 128, portable electronic device 110 includes a user interface with physical knobs and/or buttons that a user can use to control at least: A/V hub 112 one of A/V display devices 114, at least one of speakers 118 and/or one of content sources 120.) Alternatively, the information from portable electronic device 110, A/V hub 112, one or more of A/V display devices 114, receiver device 116, one or more of speakers 118 and/or one or more of content sources 120 may specify communication performance about the communication between portable electronic device 110 and one or more other components in system 100. Moreover, the information from A/V hub 112 may include device-state information or system-state information about a current device or system state of one or more of A/V display devices 114, at least one of speakers 118 and/or one of content sources 120 (such as on, off, play, rewind, fast forward, a selected channel, selected A/V content, a content source, etc.), or may include user-interface information for the user interface (which may be dynamically updated based at least in part on the device-state information, system-state information and/or the user-interface activity information). Furthermore, the information from at least A/V hub 112 and/or one of content sources 120 may include audio and/or video (which is sometimes denoted as 'audio/video' or 'A/V' content) that are provided by at least one of speakers 118 and/or displayed or presented on one or more of A/V display devices 114, as well as display or presentation instructions that specify how the audio and/or video are to be displayed, presented or output. However, as noted previously, the audio and/or video may be communicated between components in system 100 via wired communication. Therefore, as shown in FIG. 1, there may be a wired cable or link, such as a high-definition multimedia-interface (HDMI) cable 126, such as between A/V hub 112 and A/V display device 114-3.

Note that A/V hub 112 may determine display instructions (with a display layout) for the A/V content based at least in part on a format of a display in A/V display device 114-1. Alternatively, A/V hub 112 can use predetermined display instructions or A/V hub 112 can modify or transform the A/V content based at least in part on the display layout so that the modified or transformed A/V content has an appropriate format for display on the display. Moreover, the display instructions may specify information to be displayed on the display in A/V display device 114-1, including where A/V content is displayed (such as in a central window, in a tiled window, etc.). Consequently, the information to be displayed (i.e., an instance of the display instructions) may be based at least in part on a format of the display, such as: a display size, display resolution, display aspect ratio, display contrast ratio, a display type, etc. In some embodiments, the A/V content includes HDMI content. However, in other embodiments A/V content that is compatible with another format or standard, such as: H.264, MPEG-2, a QuickTime video format, MPEG-4, MP4, and/or TCP/IP. Moreover, the video mode of the A/V content may be 720p, 1080i, 1080p, 1440p, 2000, 2160p, 2540p, 4000p and/or 4320p.

Alternatively or additionally, the display instructions determined by A/V hub 112 for the A/V content may be based at least in part on a desired acoustic effect (such as monophonic, stereophonic or multi-channel sound), a desired acoustic equalization, predefined acoustic characteristics of a surrounding environment (such as an acoustic transfer function, acoustic loss, acoustic delay, acoustic noise in the environment, ambient sound in the environment, and/or one or more reflections) and/or a current location of one or more users in the environment relative to A/V display device 114-1 and/or one or more of speakers 118. For example, the display instructions may include a temporal relationship or coordination among the playback times of audio output by speakers 118 to achieve the desired acoustic effect. As described further below with reference to FIGS. 2-40, one or more of the components in FIG. 1 (such as A/V hub 112) may perform measurements (such as optical, acoustic, infrared, wireless-ranging and/or time-of-flight measurements) of or in an environment that includes the one or more speakers 118, which may be used to determine and/or dynamically adapt one or more acoustic radiation patterns of the one or more speakers 118. Note that an environment may include a room, a portion of a room, at least a partial enclosure, multiple rooms (such as adjacent rooms in a structure or a building), or a region in which sound may be received or output.

Furthermore, note that when A/V hub 112 receives the audio, video or A/V content from one of content sources 120, A/V hub 112 may provide the A/V content and display instructions to A/V display device 114-1 and/or one or more of speakers 118 as frames or packets with the A/V content are received from one of content sources 120 (e.g., in real time), so that the A/V content is displayed on the display in A/V display device 114-1 and/or is output by one or more of speakers 118 (such as using one of the acoustic radiation patterns). For example, A/V hub 112 may collect the A/V content in a buffer until an audio or video frame is received, and then A/V hub 112 may provide the complete frame to A/V display device 114-1 and/or one or more of speakers 118. Alternatively, A/V hub 112 may provide packets with portions of an audio or video frame to A/V display device 114-1 and/or one or more of speakers 118 as they are received. In some embodiments, the display instructions may be provided to A/V display device 114-1 and/or one or more of speakers 118 differentially (such as when the display instructions change), regularly or periodically (such as one of every N frames or packets) or in each packet.

Moreover, note that the communication between portable electronic device 110, A/V hub 112, one or more of A/V display devices 114, receiver device 116, one or more of speakers 118 and/or one or more content sources 120 may be characterized by a variety of performance metrics, such as: a received signal strength indicator (RSSI), a data rate, a data rate discounting radio protocol overhead (which is sometimes referred to as a 'throughput'), an error rate (such as a packet error rate, or a retry or resend rate), a mean-square error of equalized signals relative to an equalization target, intersymbol interference, multipath interference, a signal-to-noise ratio, a width of an eye pattern, a ratio of number of bytes successfully communicated during a time interval (such as 1-10 s) to an estimated maximum number of bytes that can be communicated in the time interval (the latter of which is sometimes referred to as the 'capacity' of a channel or link), and/or a ratio of an actual data rate to an estimated maximum data rate (which is sometimes referred to as 'utilization'). Moreover, the performance during the communication associated with different channels may be monitored individually or jointly (e.g., to identify dropped packets).

The communication between portable electronic device 110, A/V hub 112, one of A/V display devices 114, receiver device 116 one of speakers 118 and/or one or more of content sources 120 in FIG. 1 may involve one or more independent, concurrent data streams in different wireless channels (or even different communication protocols, such as different Wi-Fi communication protocols) in one or more connections or links, which may be communicated using multiple radios. Note that the one or more connections or links may each have a separate or different identifier (such as a different service set identifier) on a wireless network in system 100 (which may be a proprietary network or a public network). Moreover, the one or more concurrent data streams may, on a dynamic or packet-by-packet basis, be partially or completely redundant to improve or maintain the performance metrics even when there are transient changes (such as interference, changes in the amount of information that needs to be communicated, movement of portable electronic device 110 and, thus, an individual associated with or using the portable electronic device 110, etc.), and to facilitate services (while remaining compatible with the communication protocol, e.g., a Wi-Fi communication protocol) such as: channel calibration, determining of one or more performance metrics, performing quality-of-service characterization without disrupting the communication (such as performing channel estimation, determining link quality, performing channel calibration and/or performing spectral analysis associated with at least one channel), seamless handoff between different wireless channels, coordinated communication between components, etc. These features may reduce the number of packets that are resent, and, thus, may decrease the latency and avoid disruption of the communication and may enhance the experience of one or more users that are viewing A/V content on one or more of A/V display devices 114 and/or listening to audio output by one or more of speakers 118.

As noted previously, a user may control at least A/V hub 112, at least one of A/V display devices 114, at least one of speakers 118 and/or at least one of content sources 120 via the user interface displayed on touch-sensitive display 128 on portable electronic device 110. In particular, at a given time, the user interface may include one or more virtual icons that allow the user to activate, deactivate or change functionality or capabilities of at least: A/V hub 112, at least one of A/V display devices 114, at least one of speakers 118 and/or at least one of content sources 120. For example, a given virtual icon in the user interface may have an associated strike area on a surface of touch-sensitive display 128. If the user makes and then breaks contact with the surface (e.g., using one or more fingers or digits, or using a stylus) within the strike area, portable electronic device 110 (such as a processor executing a program module or program instructions) may receive user-interface activity information indicating activation of this command or instruction from a touch-screen input/output (110) controller, which is coupled to touch-sensitive display 128. (Alternatively, touch-sensitive display 128 may be responsive to pressure. In these embodiments, the user may maintain contact with touch-sensitive display 128 with an average contact pressure that is usually less than a threshold value, such as at least 10-20 kPa, and may activate a given virtual icon by increase the average contact pressure with touch-sensitive display 128 above the threshold value.) In response, the program instructions may instruct an interface circuit in portable electronic device 110 to wirelessly communicate the user-interface activity information indicating the command or instruction to A/V hub 112, and A/V hub 112 may communicate the command or the instruction to the target component in system 100 (such as A/V display device 114-1 or one of the one or more speakers 118). This instruction or command may result in A/V display device 114-1 turning on or off, displaying A/V content from a particular content source, performing a trick mode of operation (such as fast forward, reverse, fast reverse or skip), etc. For example, A/V hub 112 may request the A/V content from content source 120-1, and then may provide the A/V content to along with display instructions to A/V display device 114-1, so that A/V display device 114-1 displays the A/V content. Alternatively or additionally, A/V hub 112 may provide audio content associated with video content from content source 120-1 to one or more of speakers 118.

As noted previously, it is often challenging to achieve high audio quality in an environment (such as a room, a building, a vehicle, etc.). In particular, achieving high audio quality in the environment typically places strong constraints on coordination of the loudspeakers, such as speakers 118. For example, the coordination may need to be maintained to 1-5 μs accuracy. This (Note that these and other numerical values in the discussion are non-limiting exemplary values. Consequently, the accuracy may be different, such as 10 or 50 μs.) In the absence of suitable coordination, the acoustic quality in the environment may be degraded, with a commensurate impact on listener satisfaction and the overall user experience when listening to audio content and/or A/V content.

This challenge may be addressed by directly or indirectly coordinating speakers 118 with A/V hub 112 (and, thus, with each other). As described further below with reference to FIGS. 2 and 3, in some embodiments coordinated playback of audio content by speakers 118 may be facilitated using wireless communication. In particular, because the speed of light is almost six orders of magnitude faster than the speed of sound, the propagation delay of wireless signals in an environment (such as a room) is negligible relative to the desired coordination accuracy of speakers 118. For example, the desired coordination accuracy of speakers 118 may be on the order of a microsecond, while the propagation delay in a typical room (e.g., over distances of at most 10-30 m) may be one or two orders of magnitude smaller. Consequently, by including information specifying transmit times in packets transmitted by A/V hub 112 to a given one of speakers 118, and by logging or storing the receive times of these packets at the given speaker, the timing of a playback operation (such as playing audio) can be coordinated within a predefined value (such as, e.g., within 1-5 μs). In particular, A/V hub 112 may transmit frames or packets that include transmit times, based at least in part on an interface clock provided by clock circuit 130-1 (such as an interface clock circuit in or associated with an interface circuit in A/V hub 112), when A/V hub 112 transmitted the frames or packets, and an interface circuit in one or more of speakers 118 (such as speaker 118-1) may log or store receive times, based at least in part on an interface clock provided by clock circuit 130-2 (such as an interface clock circuit in or associated with the interface circuit in speaker 118-1), when the packets were received. Based at least in part on the differences between the transmit times and the receive times, the interface circuit in speaker 118-1 may calculate relative drift as a function of time between the interface clock provided by clock circuit 130-1 and the interface clock provided by clock circuit 130-2.

Then, the interface circuit in speaker 118-1 may adjust, based at least in part on the relative drift, clock circuit 130-2 to eliminate the relative drift. For example, the interface circuit in speaker 118-1 may adjust a frequency-locked-loop (FLL) circuit in clock circuit 130-2 to frequency lock the interface clock provided by clock circuit 130-1 and the interface clock provided by clock circuit 130-2. Moreover, the interface circuit in speaker 118-1 may determine a remaining time offset between the interface clock provided by clock circuit 130-1 and the interface clock provided by clock circuit 130-2.

This remaining time offset may be used to correct the phase between lock the interface clock provided by clock circuit 130-1 and the interface clock provided by clock circuit 130-2 when performing a playback operation, such as outputting audio or content data received from A/V hub 112. In particular, the interface circuit in speaker 118-1 may receive, via wireless communication, a frame or a packet with information from A/V hub 112 specifying a future time when speaker 118-1 is to perform the playback operation. Next, the interface circuit in speaker 118-1 may modify the future time based at least in part on the remaining time offset to determine a corrected future time, and speaker 118-1 may perform the playback operation at the corrected future time.

Alternatively or additionally, the roles of A/V hub 112 and speaker 118-1 in the coordination technique may be reversed, such that A/V hub 112 performs at least some of the aforementioned operations performed by speaker 118-1. Thus, instead of A/V hub 112 transmitting packets with the transmit times to speaker 118-1, speaker 118-1 may transmitted the packets to A/V hub 112. Then, A/V hub 112 may perform analogous operations to those of speaker 118-1 described above, and may transmit a frame or a packet to speaker 118-1 with information specifying the corrected future time to speaker 118-1.

While the preceding embodiments achieve and/or maintain the coordination of the playback operation between the clock domain of A/V hub 112 and the clock domain of speaker 118-1 to within the predefined value using the interface circuit in A/V hub 112 and/or speaker 118-1, in other embodiments the coordination of the playback operation is performed, at least in part, using software executed by a processor in speaker 118-1 and/or A/V hub 112.

In some embodiments, techniques such as wireless ranging or radio-based distance measurements may be used to facilitate coordination of the playback operation. For example, wireless ranging may be used to determine and correct for the propagation delay of light between A/V hub 112 and/or speaker 118-1 when it is not at least one or two orders of magnitude smaller than the predefined value, such as when A/V hub 112 and speaker 118-1 are in different rooms. (When the distances are within a room and the electronic devices are stationary, the propagation delay usually introduces a negligible static contribution to the remaining time offset.) Typically, the distance between A/V hub 112 and speaker 118-1 is determined based at least in part on the product of the time of flight (the difference of the transmit time and the receive time in a common clock domain) and the speed of propagation. Note that the distance may be determined using wireless ranging performed by A/V hub 112 and/or speaker 118-1.

Moreover, one or more additional techniques may be used to identify and/or exclude multi-path wireless signals during the coordination of playback operation. For example, A/V hub 112 and/or speakers 118 may determine the angle of arrival (including non-line-of-sight reception) using: a directional wireless antenna, the differential time of arrival at an array of wireless antennas with known location(s), and/or the angle of arrival at two radios having known location (e.g., trilateration or multilateration).

While the preceding example illustrated wireless ranging with a common clock domain in A/V hub 112 and/or speaker 118-1, in other embodiments the wireless ranging is performed when the interface clock provided by clock circuit 130-1 and the interface clock provided by clock circuit 130-2 are not coordinated. For example, the position of A/V hub 112 and/or speakers 118 may be estimated based at least in part on the speed of propagation and the time of arrival data of wireless signals 124 at several receivers at different known locations (which is sometimes referred to as 'differential time of arrival') even when the transmission time is unknown or unavailable. More generally, a variety of radio-location techniques may be used, such as: determining distance based at least in part on a difference in the power of the received signal strength indicator (RSSI) relative to the original transmitted signal strength (which may include corrections for absorption, refraction, shadowing and/or reflection); determining the angle of arrival at a radio (including non-line-of-sight reception) using a directional wireless antenna or based at least in part on the differential time of arrival at an array of wireless antennas with known location(s); determining the distance based at least in part on backscattered wireless signals; and/or determining the angle of arrival at least two radios having known location (i.e., trilateration or multilateration). Note that wireless signals 124 may include transmissions over GHz or multi-GHz bandwidths to create pulses of short duration (such as, e.g., approximately 1 ns), which may allow the distance to be determined within 0.3 m (e.g., 1 ft). In some embodiments, the wireless ranging is facilitated using location information, such as a location of one or more of electronic devices in FIG. 1 that are determined or specified by a local positioning system, a Global Positioning System, a cellular-telephone network and/or a wireless network.

Although we describe the network environment shown in FIG. 1 as an example, in alternative embodiments, different numbers or types of electronic devices may be present. For example, some embodiments include more or fewer electronic devices. As another example, in another embodiment, different electronic devices are transmitting and/or receiving packets or frames. While electronic devices in FIG. 1 are illustrated with a single instance of radios 122, in other embodiments one or more of these components may include multiple radios.

Coordination of a Playback Operation Using an Interface Circuit

Figure 2:
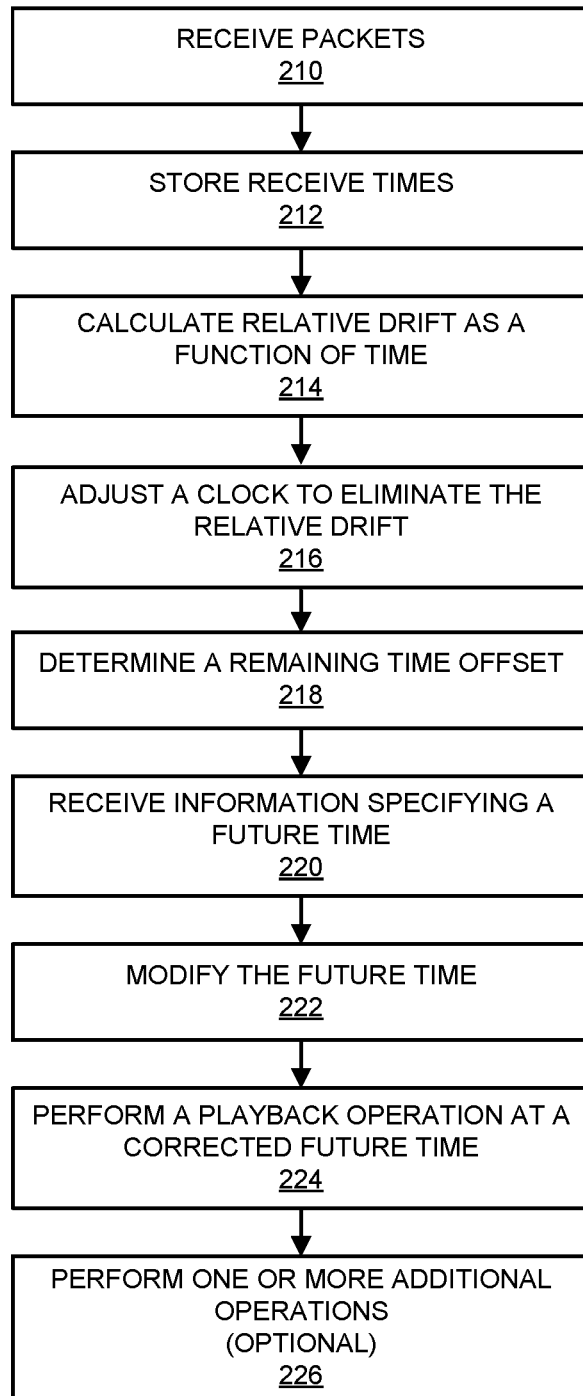
FIG. 2 is a flow diagram illustrating an example of a method for coordinating a playback operation in accordance with an embodiment of the present disclosure.

We now describe embodiments of a coordination technique. In some embodiments, the coordination technique is implemented, at least in part, using hardware (such as an interface circuit) and/or software. This is shown in FIG. 2, which presents a flow diagram illustrating an example of a method 200 for coordinating a playback operation. Method 200 may be performed by an interface circuit in an electronic device (which may be a slave) such as one of A/V display devices 114 (FIG. 1) or one of speakers 118 (FIG. 1).

During operation, the interface circuit may receive, via wireless communication, packets (operation 210) from a second electronic device (which may be a master), where a given packet includes a transmit time, based at least in part on a second clock in the second electronic device when the second electronic device transmitted the given packet. Note that the transmit time may be included in the given packet in a payload and/or a media access control (MAC) header. In some embodiments, the packets include control packets. Alternatively or additionally, the packets may include data packets.

In response to receiving the packet(s), the interface circuit may store receive times (operation 212) when the packets were received, where the receive times are based at least in part on a clock in the electronic device. Note that the transmit times may correspond to the leading edges or the trailing edges the packets. Similarly, the receive times may correspond to the leading edges or the trailing edges the packets.

Then, the interface circuit may calculate, based at least in part on differences between the transmit times and the receive times, relative drift as a function of time (operation 214) between the clock and the second clock, and may adjust, based at least in part on the relative drift, a clock circuit (such as an interface clock circuit in or associated with the interface circuit) that provides the clock to eliminate the relative drift (operation 216). For example, the adjustments may be based at least in part on the differences for successive packets, and the adjustments may frequency lock the clock and the second clock.

Moreover, the interface circuit may determine a remaining time offset (operation 218) between the clock and the second clock.

Furthermore, the interface circuit may receive, via the wireless communication, information from the second electronic device specifying a future time (operation 220) when the electronic device is to perform the playback operation.

Additionally, the interface circuit may modify the future time (operation 222) based at least in part on the remaining time offset to determine a corrected future time.

Next, the electronic device may perform the playback operation at the corrected future time (operation 224), where the adjusting the clock and the modifying the future time coordinate the playback operation in a clock domain of the clock to within a predefined value of a clock domain of the second clock.

In some embodiments, the packets include audio data in payloads, and the electronic device stores the audio data in a queue. In these embodiments, the playback operation includes outputting the audio data from the queue. (However, in other embodiments the playback operation includes displaying video, which may be coordinated with the audio to prevent unintended timing offsets between sound and images that a viewer could notice.) Note that adjusting the clock (operation 216) and the modifying the future time (operation 222) may coordinate the playback operation.

Moreover, the interface circuit (and/or the electronic device) may optionally perform one or more additional operations (operation 226). For example, the transmit time and the receive time may be stored on opposite ends of a payload of the given packet. Thus, the transmit time may be at the beginning of the payload and the receive time may be appended to the end of the payload. In these embodiments, the interface circuit or a processor executing software in the electronic device may determine a duration of the payload and the interface circuit may add the duration to the remaining offset time.

Figure 3:
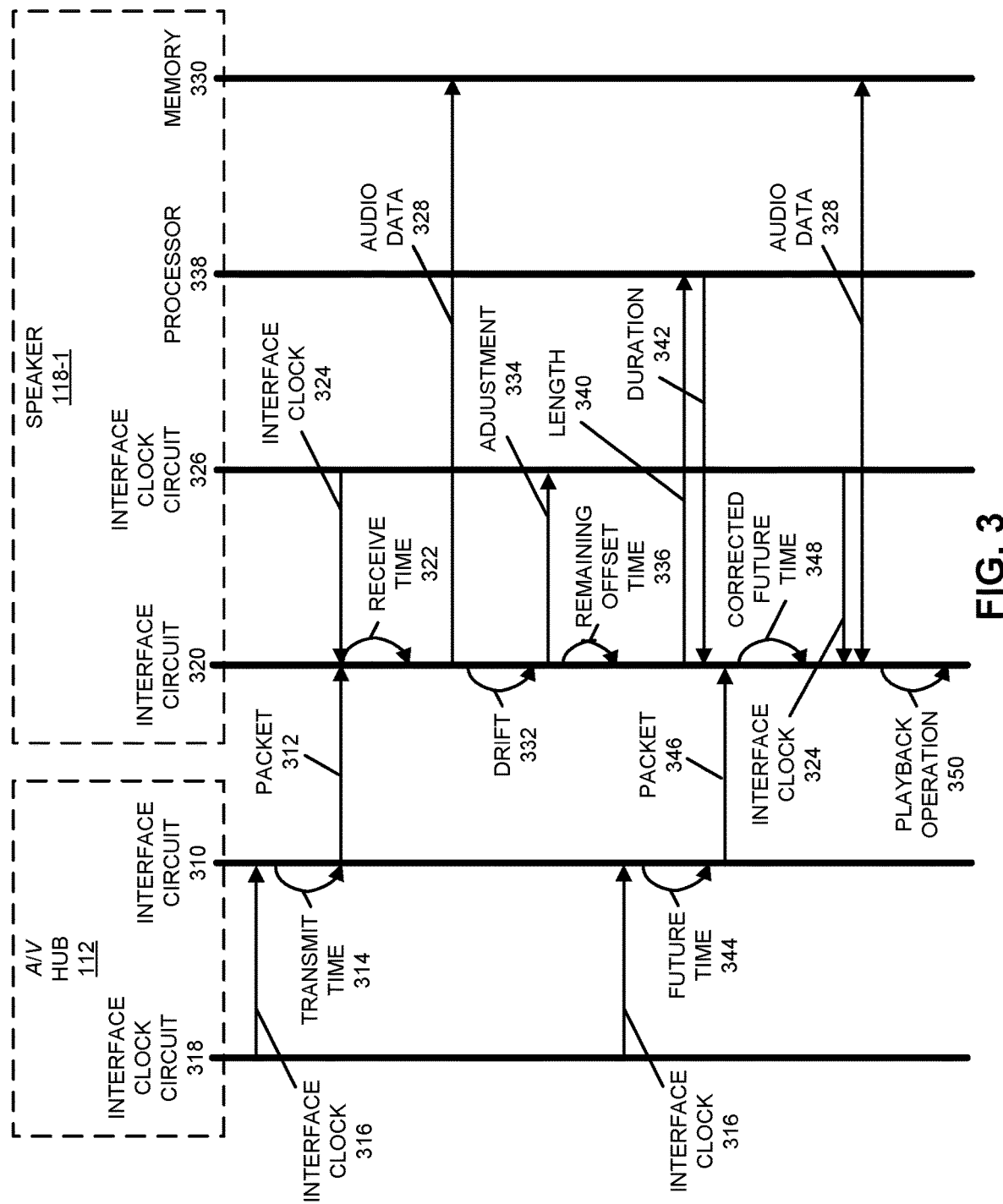
FIG. 3 is a drawing illustrating an example of communication among the electronic devices in FIG. 1 in accordance with an embodiment of the present disclosure.

FIG. 3 presents a drawing illustrating an example of communication between A/V hub 112 and speaker 118-1. In particular, interface circuit 310 in 24/V hub 112 may transmit one or more packets (such as packet 312) to speaker 118-1. Each packet may include a corresponding transmit time 314, based at least in part on an interface clock 316 provided by an interface clock circuit 318 in or associated with an interface circuit 310 in A/V hub 112, when A/V hub 112 transmitted packet 312. When an interface circuit 320 in speaker 118-1 receives the packets, it may include receive times in the packets (or it may store the receive times in memory 330), where for each packet the corresponding receive time 322 may be based at least in part on an interface clock 324 provided by an interface clock circuit 326 in or associated with interface circuit 320.

Then, interface circuit 320 may calculate, based at least in part on differences between the transmit times and the receive times, relative drift 332 as a function of time between interface clock 316 and interface clock 324, and may adjust 334, based at least in part on relative drift 332, interface clock circuit 326 to eliminate relative drift 332. Moreover, interface circuit 320 may determine a remaining time offset 336 between interface clock 316 and interface clock 324.

In some embodiments, the transmit times and the receive times may be stored on opposite ends of payload of the packets. In these embodiments, interface circuit 320 or a processor 338 executing software in speaker 118-1 may determine a duration 342 or time associated with a length 340 of the payload and interface circuit 320 may add duration 342 to remaining offset time 336.

Furthermore, interface circuit 310 may transmit packet 346 that includes information that specifies a future time 344 when speaker 118-1 is to perform a playback operation 350. After receiving packet 346, interface circuit 320 may modify future time 344 based at least in part on remaining time offset 336 to determine a corrected future time 348.

Next, speaker 118-1 may perform playback operation 350 at corrected future time 348. For example, interface circuit 318 or a processor 338 executing software may perform playback operation 350. In particular, the packets and/or additional packets may include audio data 328 in payloads, and speaker 118-1 may store audio data 328 in a queue in memory 330. In these embodiments, playback operation 350 includes outputting audio data 328 from the queue, including driving an electrical-to-acoustic transducer in speaker 118-1 based at least in part on audio data 328 so speaker 118-1 outputs sound. Note that adjusting 334 the interface clock 324 and modifying future time 344 may coordinate playback operation 350 in a clock domain of interface clock 324 to within a predefined value of a clock domain of interface clock 316.

As noted previously, in some embodiments the roles of the clock master and the slave in the coordination technique may be reversed.

In an exemplary embodiment, the coordination technique is used to provide channel coordination and phasing for surround sound or multi-channel sound. In particular, some individuals can perceive playback coordination variation of 5 µs, which can produce an audible twilight effect. Moreover, if the relative clock drift is sufficiently large, audible flutter can occur between clock adjustments. Furthermore, global playback coordination between speakers and a headset (or headphones) may be needed to avoided jumps or echoes that can degrade the user experience. Consequently, the coordination technique may need to maintain playback coordination of two or more speakers within, e.g., 1-5 µs.

In order to achieve this coordination capability, in some embodiments the coordination technique may include transmit time information in packets transmitted by an interface circuit (i.e., in the physical layer), such as the interface circuit in an A/V hub (which may function as an access point in a wireless local area network) or audio receiver that provides data packets to one or more speakers (and, more generally, a recipient) in a system. In particular, the A/V hub may include a transmit timestamp in each user datagram protocol (UDP) data packet, such as in the payload. Thus, in some embodiments, the coordination may not use an access-point beacon or a specialty packet. Moreover, the communication of the coordination information may be unidirectional, such as from the A/V hub to a speaker or from the speaker to the A/V hub (as opposed to back and forth or bidirectional communication).

Note that the timestamp may include a counter value corresponding to an interface clock in or associated with the interface circuit in the A/V hub. In some embodiments, the counter values are high resolution, such as, e.g., 32 B. For example, the counter values or timestamps are associated with an Integrated Inter-IC Sound Bus ($I^2S$).

When an interface circuit in the recipient receives a packet from the A/V hub, the interface circuit may append a receive time to the payload in the data packet. For example, the receive time may include a counter value corresponding to an interface clock in or associated with the interface circuit in the recipient. In some embodiments, there may be 24 B in a data packet that is used for storing timing information, such as 4 B at the start of the payload that is used to store the transmit time at the A/V hub and 4 B at the end of the payload that is used to store the receive time at the recipient.

Then, using the transmit times (which may provide information about the master time base) and the receive times from multiple packets, the interface circuit may track and correct drift between the clocks in the interface circuits in the A/V hub and the recipient, and may determine the remaining time offset. Next, the interface circuit may use the remaining time offset to modify the future time based at least in part on the remaining time offset to determine the corrected future time when the recipient performs the playback operation (such as playback of audio data included in the data packets).

Note that in some embodiments the transmit times and the receive times are included when data packets are, respectively, transmitted and received during a test mode of the interface circuits in the A/V hub and the recipient. This test mode may be set or selected by software executed by processors in the A/V hub and/or the recipient.

In some embodiments, instead of modifying the future time based at least in part on the remaining time offset, the electronic device may transmit the remaining time offset to the second electronic device, and the second electronic device may correct the future time for the remaining time offset (such as by subtracting the remaining time offset from the future time) prior to transmitting the modified future time to the second electronic device. Thus, in some embodiments, the second electronic device may pre-compensate the future time for the remaining time offset. Furthermore, in some embodiments the coordination includes synchronization in the time domain within a temporal or phase accuracy and/or the frequency domain within a frequency accuracy.

Dynamic Adaptation of an Acoustic Radiation Pattern

A/V hub 112 and/or the one or more speakers 118 in FIG. 1 may provide a system with situational awareness and the ability to accordingly determine and implement one or more acoustic radiation patterns that dynamically modify the sound provided by the one or more speakers 118 (such as the directivity and/or width of the sound).

In particular, A/V hub 112 and/or at least some of the one or more speakers 118 may, individually or in concert, may be able to perform one or more types of measurements of or in an environment (such as a room) that includes the A/V hub 112 and/or the one or more speakers 118. Thus, A/V hub 112 and/or the one or more speakers 118 may be able to passively or actively monitor or sense the environment. For example, A/V hub 112 and/or at least some of the one or more speakers 118 may include one or more types of sensors, such as: one or more optical sensors (such as a CMOS image sensor, a CCD, a camera, etc.) that acquire 2D or 3D information about the environment in the visible spectrum or outside the visible spectrum (such as in the infrared), one or more microphones (such as an acoustic array), a wireless-ranging sensor (such as an interface and one or more associated antennas) and/or another type of sensor. In this way, the A/V hub 112 and/or the one or more speakers 118 may obtain information about the environment at least in proximity to A/V hub 112 and/or the one or more speakers 118.

Using the measurements, A/V hub 112 and/or the one or more speakers 118 may adapt one or more acoustic radiation patterns of the one or more speakers 118. For example, the one or more speakers 118 may be equipped with a steerable array of drivers (which may be independently steered) that allow the directivity and/or beam width to be adapted based at least in part on the measurements. Note that a 'driver' or 'loudspeaker' is a transducer that converts an electrical signal to sound waves.

Additionally, A/V hub 112 and/or the one or more speakers 118 may use machine learning (such as a predictive classifier or a regression model based at least in part on a supervised learning technique, e.g., a regression technique, support vector machines, LASSO, logistic regression, a neural network, etc.) and information about user preferences, past behaviors (such as an A/V-content viewing history at different times and locations), user-interface activity (such as previous user selections) and/or characteristics of A/V content to intelligently adapt the one or more acoustic radiation patterns of the one or more speakers 118. In particular, A/V hub 112 and/or the one or more speakers 118 may be able to learn from past acoustic experiences to predict desired future acoustic experiences.

These capabilities may allow A/V hub 112 and/or the one or more speakers 118 to understand and implement a listener's intent with reduced or no effort by the listener. For example, as described further below with reference to FIGS. 4-8, the acoustic radiation patterns of the one or more speakers 118 may be adapted based at least in part on locations of one or more listeners. This may allow closed-loop adaptation, so that the sound can be dynamically steered to the listeners or adapted based at least in part on the number of listeners and their locations. Thus, A/V hub 112 and/or the one or more speakers 118 may be able to automatically (without user action or intervention) steer the sweet spot to achieve an improved or optimal acoustic experience regardless of where the listener(s) are in the environment.

Figure 13:
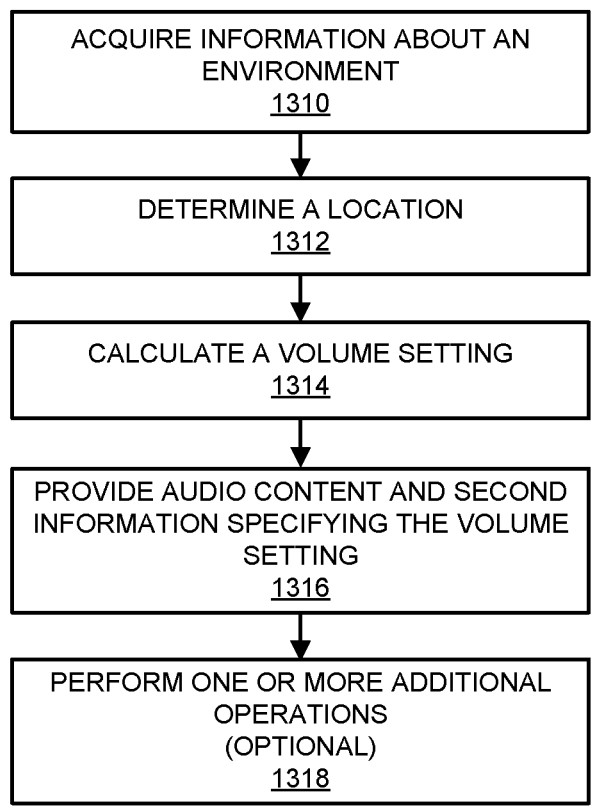
FIG. 13 is a flow diagram illustrating an example of a method for calculating a volume setting in accordance with an embodiment of the present disclosure.

Moreover, as described further below with reference to FIGS. 13-15, these capabilities may enable proximity sensing, so the sound volume can be adjusted and maintained as a distance to a listener varies.

Furthermore, as described further below with reference to FIG. 16-18 or 19-21, the acoustic radiation pattern(s) may be adjusted as one or more acoustic characteristics of the environment change, such as a number of listeners in the environment. Alternatively or additionally, instead of being calibrated during an initial setup to compensate for the room characteristics, the capabilities may enable 'room proofing,' such as dynamic compensation for changes in the acoustic characteristics of a room when, e.g., patio doors open, curtains are closed. This environmental awareness may be used to actively compensate for changes to create a consistent acoustic experience regardless of the environment.

Figure 25:
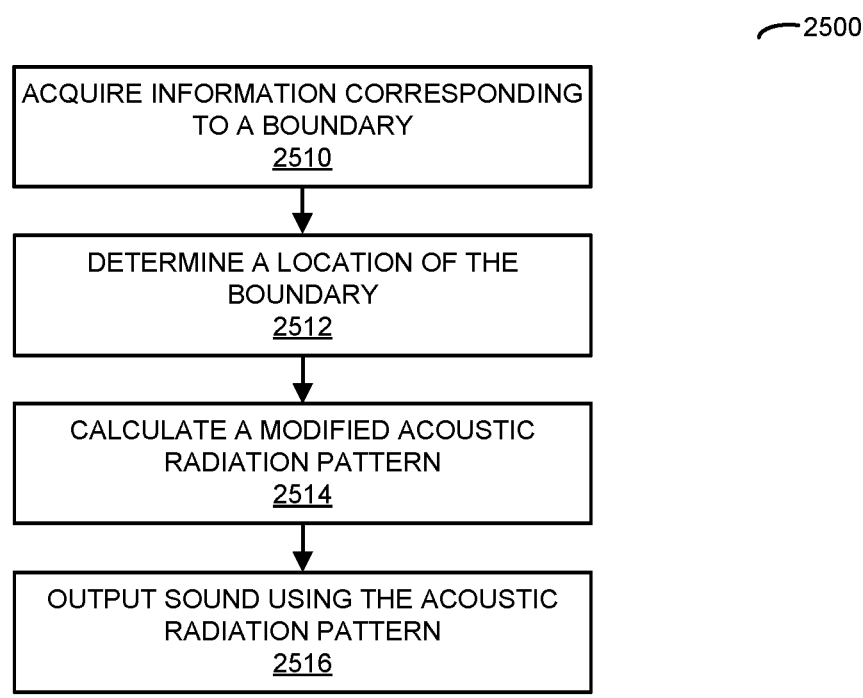
FIG. 25 is a flow diagram illustrating an example of a method for outputting audio content in accordance with an embodiment of the present disclosure.

Similarly, as described further below with reference to FIGS. 25-27, the capabilities may enable 'position proofing.' For example, due to reflections, speakers usually are positioned away from other objects. If a speaker has too little 'breathing space,' such as if it is placed too close to a wall, reflection of low-frequency sound can create a booming sound or increased perception of reverberation. However, the array of drivers in the one or more speakers 118 may be used to reduce or cancel out the reflection(s).

Figure 28:
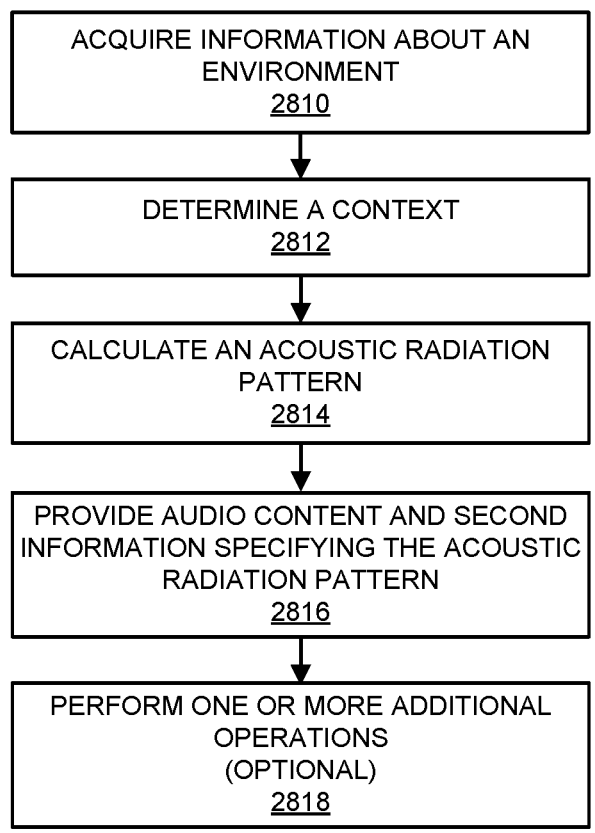
FIG. 28 is a flow diagram illustrating an example of a method for calculating an acoustic radiation pattern in accordance with an embodiment of the present disclosure.

As described further below with reference to FIGS. 28-30, in some embodiments the one or more acoustic radiation patterns are adapted based at least in part on audio content and/or context. This may allow A/V hub 112 and/or the one or more speakers 118 to provide a more intimate listening experience with a narrower and more direction acoustic radiation pattern when appropriate (such as depending on a type of music, the listeners and/or the number of listeners). For example, by changing digital signal processing to one or more drivers, the one or more speakers 118 can control the envelopment from big or wide sound, to narrow or intimate sound.

Moreover, A/V hub 112 and/or the one or more speakers 118 may implement 'room shaping' by actively modify at least an acoustic characteristic of the environment. For example, as described further below with reference to FIGS. 31-33, multiple speakers 118 may be used to change a reverberation time of the environment. This may the one or more acoustic radiation patterns may, from an acoustic perspective, effectively make it seem as if a wall in a room is not there. More generally, the acoustic color or characteristics of an environment may be determined by reverberations and sound distortions that bounce of the walls and objects in the environment. The one or more speakers 118 may not have their drivers in a single plane or direction. Instead, the drivers may be pointed or oriented in different directions (such as on the faces of a triangle, in a semi-circular or circular arrangement, or in a spherical arrangement). The array of drivers may project or direct sound to the right or correct locations in a room, thereby creating a more realistic acoustic image of the recorded audio content. For example, the one or more speakers 118 may beam the sound of a band of musicians towards a listener, and may project ambience of a recording into a room.

Furthermore, using the one or more types of sensors and one or more predictive classifiers and/or regression models, A/V hub 112 and/or the one or more speakers 118 may predict a listener's emotional state or activity state and may accordingly select appropriate A/V content for the listener. Thus, A/V hub 112 and/or the one or more speakers 118 may be able to understand listeners' habits and preferences to appropriately tailor the acoustic experience.

In these ways, A/V hub 112 and/or the one or more speakers 118 may provide a superlative and consistent acoustic experience to listeners at different locations in the environment, even when one or more acoustic characteristics of the environment dynamically change and/or when the one or more speakers 118 are at suboptimal locations in the environment (such as near a wall or boundary).

Figure 4:
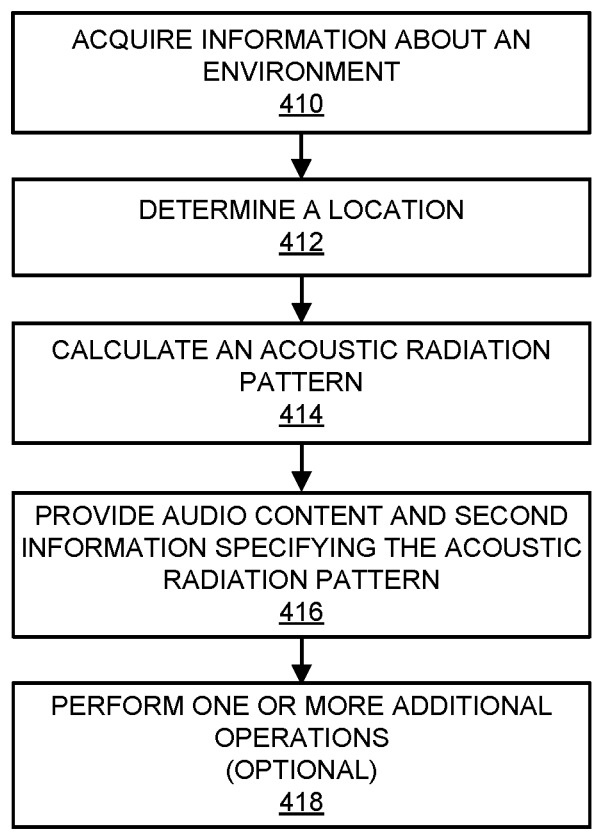
FIG. 4 is a flow diagram illustrating an example of a method for calculating an acoustic radiation pattern in accordance with an embodiment of the present disclosure.

One embodiment of the adaptation technique provides closed-loop observation and adaptation of 3D sound. This is shown in FIG. 4, which presents a flow diagram illustrating an example of a method 400 for calculating an acoustic radiation pattern. This technique may be performed by an electronic device (such as A/V hub 112), which may communicate with a second electronic device (such as one of speakers 118).

During operation, the electronic device may acquire information about an environment (operation 410), which may include the second electronic device. Notably, the electronic device may include a sensor that acquires the information, and acquiring the information may involve performing a measurement using the sensor. Moreover, the sensor may include an image sensor that captures one or more images, such as a camera, a CMOS image sensor, a CCD, etc. For example, the sensor may capture an image and a second image at a different time than the image, such as with a predefined delay or time interval e.g., 1, 3 or 5 s, etc. In some embodiments, the information includes the image, and the electronic device may receive a second image associated with the second electronic device, which has a known location relative to a location of the electronic device. Consequently, the image and the second image may provide or may be used to provide stereoscopic or 3D information about the environment.

Note that the electronic device may acquire stereoscopic information in a region or a full panorama in the environment using one image sensor (such as with a hemispherical lens) or multiple image sensors for improved reliability and resolution (such as four image sensors with different fields of view, different image sensors for use at different light intensity or light levels). The image sensors may operate in different optical spectrums, such as with visible or infrared light.

Alternatively or additionally, the sensor may include an acoustic sensor that measures sound, such as a microphone or an acoustic transducer, an array of microphones, a beam-forming array of microphones, a phased acoustic array, etc. Therefore, the measured sound may specify 2D or 3D sound in the environment as a function of time. Moreover, the sound may be measured in one or more directions. Thus, the acoustic sensor may have a directional response or may have an omnidirectional response. In some embodiments, the electronic device receives additional measured sound associated with the second electronic device. Note that the sound measurements may be real or complex, e.g., the sound measurements may include amplitude and/or phase information.

Based at least in part on the information, the electronic device may determine a location (operation 412) of at least an individual relative to location of the second electronic device. The location may be determined based at least in part on the stereoscopic information associated with the image and the second image. In particular, the location of the individual may be determined using an image-processing technique, such as: normalizing a magnification or a size of the individual in a given image, rotating the image to a predefined orientation, extracting the features that may be used to identify the individual, etc. Note that the extracted features may include: edges associated with objects in a given image, corners associated with the objects, lines associated with objects, conic shapes associated with objects, color regions within a given image, and/or texture associated with objects. In some embodiments, the features are extracted using a description technique, such as: scale invariant feature transform (SIFT), speed-up robust features (SURF), a binary descriptor (such as ORB), binary robust invariant scalable keypoints (BRISK), fast retinal keypoint (FREAK), etc. Moreover, in some embodiments, the location is determined based at least in part on a length specified by the image, such as a known or predefined height of an object at a known location in an environment that includes the second electronic device and/or a height or a width of the environment. For example, one or more dimensions of a room that includes the second electronic device may be predefined or predetermined. Note that determining the location may involve detecting motion of the individual or estimating a path of the individual through the environment.

Alternatively or additionally, the information may include the sound, and the location may be determined based at least in part on the measured sound and/or the additional measured sound. For example, the sound of the individual's footsteps, breathing, heart beat and/or voice may be monitored. Using the predefined or predetermined dimensions of a room (such as a width and a length) and/or a predefined or predetermined acoustic response of the room (such as acoustic transfer functions of the environment at different locations relative to the location of the electronic device, a reverberation time of the room, etc.), the location of the individual can be estimated. In some embodiments, the individual's location is determined using the predefined or predetermined dimensions of the room and phase information between sound associated with the individual that is received via a direct path and sound associated with the individual that is received indirectly, such as reflected sound from an object (e.g., furniture), a wall or boundary in the environment.

In some embodiments, the electronic device includes an acoustic transducer that outputs acoustic signals at one or more frequencies or in one or more bands of frequencies. For example, the output acoustic signals may be outside a range of human hearing, such as ultrasonic frequencies or frequencies greater than 20 kHz. The electronic device may output the acoustic signals (such as periodically, e.g., every 50 or 100 ms), as needed when changes in the environment are observed or detected in an image, etc.) using the acoustic transducer, and the measured sound may correspond to reflections of the acoustic signals.

Note that acquiring the information may involve the electronic device performing wireless ranging or a radiolocation technique using an interface circuit and one or more antennas in the electronic device. For example, the electronic device may use wireless signals that are compatible with an IEEE 802.11 specification to perform the wireless ranging.

Thus, in general, the measurements may be performed by the electronic device and/or the second electronic device using one or more sensors, which may include different types of sensors or multiple instances of a type of sensor (such as image sensors that are positioned at different locations on the electronic device or that have different fields of view or listening in the environment). Therefore, in some embodiments the measurements and, thus, the information may be acquired collaboratively by the electronic device and the second electronic device.

Then, based at least in part on the determined location and a predefined acoustic response of the second electronic device (such as a transfer function of a driver that specifies nonlinear sound distortion or response in output sound at one or more frequencies or one or more bands of frequencies as a function of drive amplitude), the electronic device may calculate an acoustic radiation pattern (operation 414) of the second electronic device. As described further below with reference to FIGS. 6 and 7, the acoustic radiation pattern may have a beam with a principal direction corresponding to the determined location, and the acoustic radiation pattern may, at least in part, limit sound distortion of the second electronic device when the second electronic device outputs audio content using the acoustic radiation pattern. Consequently, the acoustic radiation pattern may be calculated to directionally orient or focus the output sound towards the current location of the individual while reducing or eliminating sound distortion in the output sound. For example, as described further below with reference to FIGS. 6 and 7, achieving a directional acoustic radiation pattern at low frequencies (such as bass frequencies between 100-400 Hz) can be difficult. Therefore, the calculated acoustic radiation pattern at low frequencies may trade off the directivity with the sound distortion based on the capabilities of the second electronic device, so that the acoustic experience or sound quality is not compromised. Note that the acoustic radiation pattern may specify amplitude levels and/or time delays of one or more speakers in the second electronic device.

Next, the electronic device may provide the audio content and second information specifying the acoustic radiation pattern (operation 416) for the second electronic device. The second electronic device may optionally output sound corresponding to the audio content using the acoustic radiation pattern. Note that in this embodiment or other embodiments in this discussion, the output sound may be mono audio, stereo or multi-channel audio.

In some embodiments, the electronic device optionally performs one or more additional operations (operation 418). For example, the electronic device may repeat one or more of the aforementioned operations as a function of time to dynamically steer the acoustic radiation pattern towards the individual. Alternatively or additionally, there may be more than one instance of the second electronic device, and the electronic device may calculate acoustic radiation patterns for one or more additional instances of the second electronic device either separately or jointly with the acoustic radiation pattern for the second electronic device, so that when the second electronic device and the additional instances of the second electronic device output the audio content using the calculated acoustic radiation patterns a desired 3D sound or sound field can be achieved in the environment. Note that the sound output by the second electronic device and the additional instances of the second electronic device may be coordinated using the coordination technique.

While the preceding discussion illustrated method 400 being performed by the electronic device, in some embodiments the second electronic device may perform at least some of the aforementioned operations, either in conjunction with or instead of the electronic device.

Figure 5:
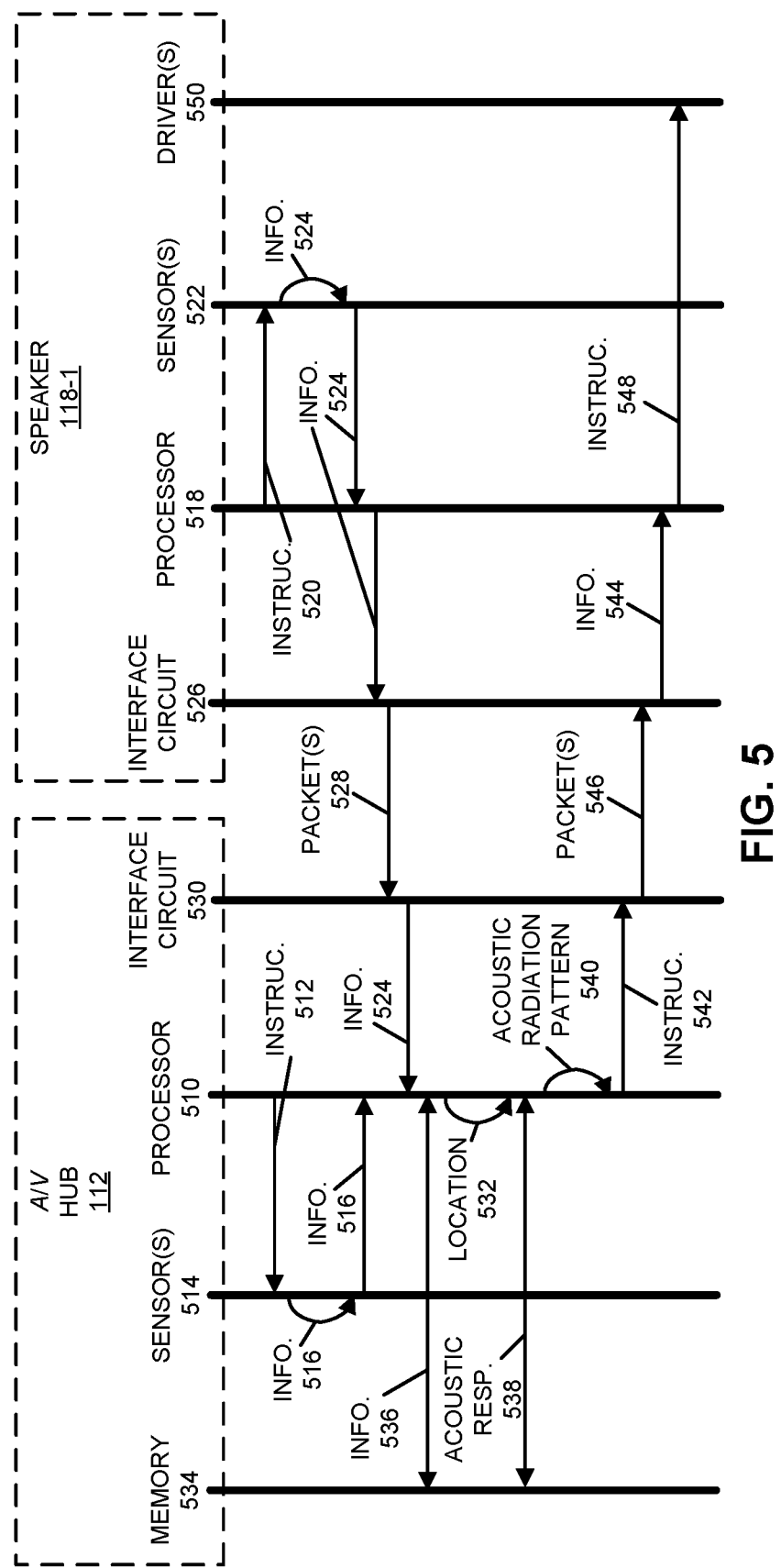
FIG. 5 is a drawing illustrating an example of communication among the electronic devices in FIG. 1 in accordance with an embodiment of the present disclosure.

FIG. 5 presents a drawing illustrating an example of communication between A/V hub 112 and speaker 118-1. In particular, processor 510 in A/V hub 112 executing program instructions may instruct 512 one or more sensors 514 in A/V hub 112 to perform measurements to acquire information 516 (such as one or more images or sounds) about an environment. Then, the one or more sensors 514 may provide information 516 to processor 510.

Alternatively or additionally, processor 518 in speaker 118-1 executing program instructions may instruct 520 one or more sensors 522 in speaker 118-1 to perform measurements to acquire information 524 (such as one or more additional images or sounds) about the environment. After receiving information 524, processor 518 may provide information 524 to interface circuit 526 in speaker 118-1, which may transmit one or more packets 528 or frames with information 524 to interface circuit 530 in A/V hub 112, which after receiving the one or more packets 528 may provide information 524 to processor 510. Note that the measurements performed by A/V hub 112 and/or speaker 118-1 may be time stamped so that processor 510 can associate and/or compare information 516 and 524.

After receiving information 516 and/or 524, processor 510 may determine a location 532 of at least an individual relative to a location of speaker 118-1. For example, location 532 may be determined using predefined or predetermined information 536 about the environment (such as a height, width or length of the environment, a size of an object in the environment, one or more acoustic transfer functions of the environment, a reverberation time of the environment, etc.), which is stored in memory 534.

Then, based at least in part on location 532 and a predefined acoustic response 538 of the second electronic device (such as information about nonlinear sound distortion, which is stored in memory 534), processor 510 may calculate an acoustic radiation pattern 540 of speaker 118-1.

Next, processor 510 may instruct 542 interface circuit 530 to provide information 544 with audio content and information specifying the acoustic radiation pattern 540 to speaker 118-1 in one or more packets 546 or frames. After receiving information 544, interface circuit 526 may provide this information to processor 518, which may instruct 548 one or more acoustic transducers or drivers 550 to output sound corresponding to the audio content using the acoustic radiation pattern 540.

While some of the interactions among components in FIG. 5 are illustrated by a line with a single arrow for unilateral communication or a line with a double arrow for bilateral communication, note that the interactions illustrated in FIG. 5 and in the following embodiments may involve unilateral or bilateral communication.

Figure 6:
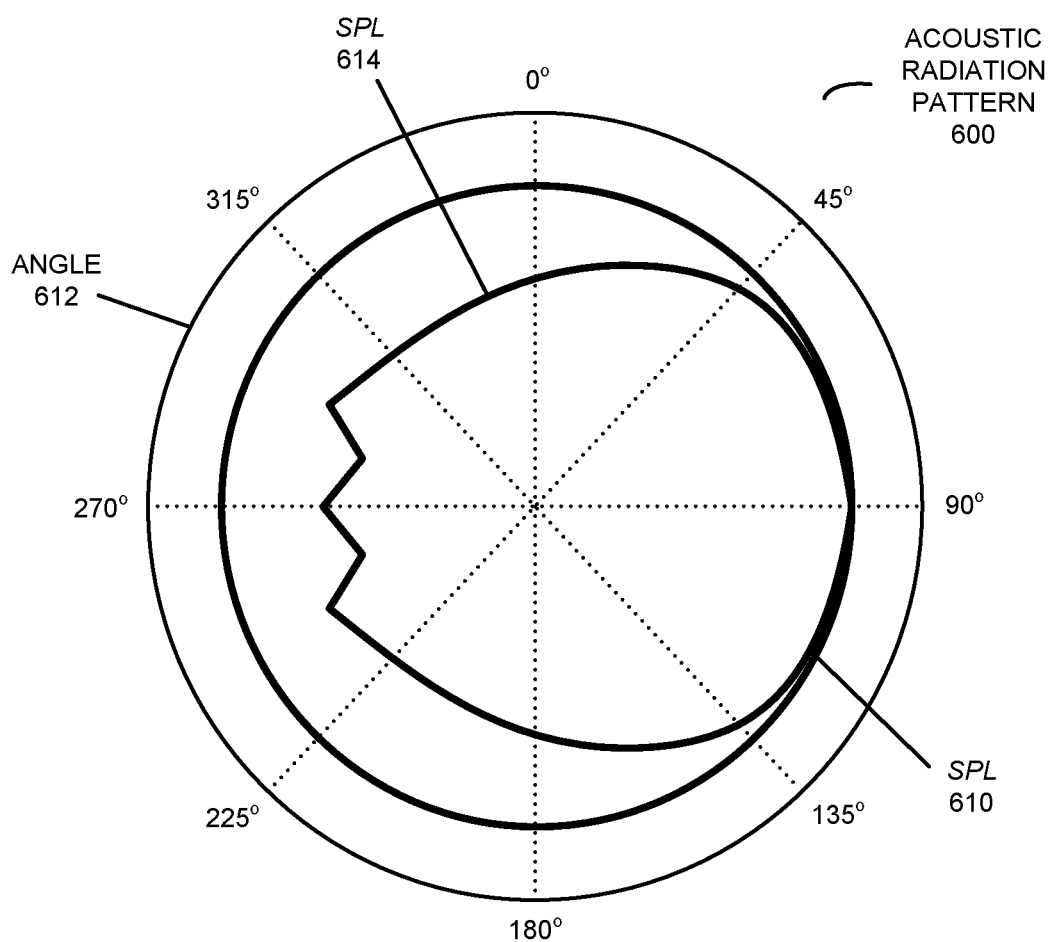
FIG. 6 is a drawing illustrating an example of an acoustic radiation pattern of an electronic device in accordance with an embodiment of the present disclosure.
Figure 7:
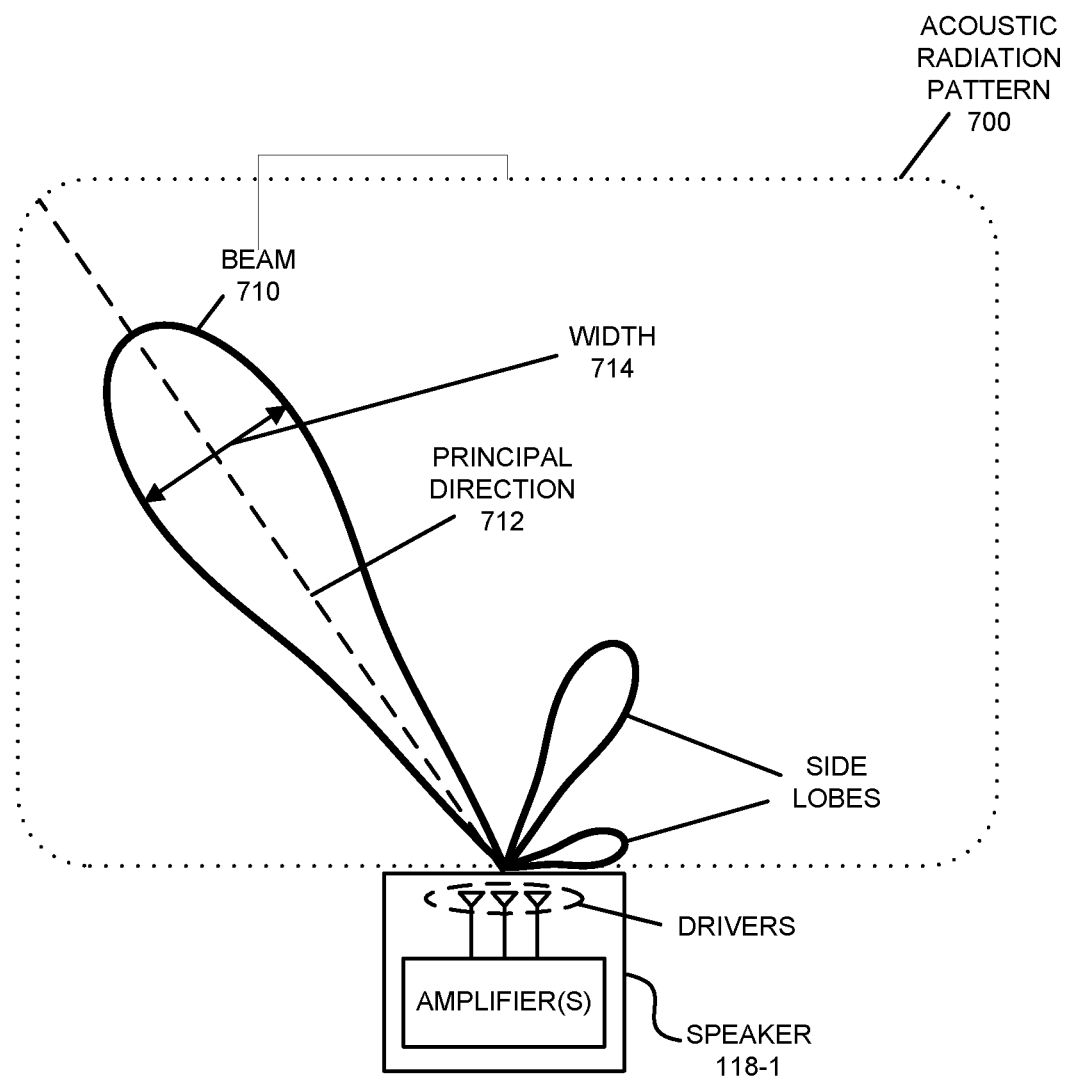
FIG. 7 is a drawing illustrating an example of an acoustic radiation pattern of an electronic device in accordance with an embodiment of the present disclosure.

FIG. 6 presents a drawing illustrating an example of an acoustic radiation pattern 600 of an electronic device, such as one of speakers 118. As illustrated by the polar response, i.e., sound pressure level (SPL) as a function of angle 612 in a 2D plane, shown in FIG. 6, this acoustic radiation pattern may initially have an SPL 610 that is omnidirectional. By adjusting the amplitudes and/or phases to one or more drivers, acoustic radiation pattern 600 may be modified, so that SPL 614 is directional. This is further illustrated in FIG. 7, which presents a drawing of an example of an acoustic radiation pattern 700 of an electronic device, such as speaker 118-1. In particular, acoustic radiation pattern 700 may have a beam 710 with a principal direction 712 and a width 714 (such as a full width at half maximum or a width at −3 dB amplitude). Note that while FIGS. 6 and 7 present polar responses of the electronic device, in general the acoustic radiation pattern of the electronic device may be 3D.

Note that drivers are usually not directive. In practice, this means that a speaker with one or more drivers on a single side will emit sound in all directions. The sound that bounces of the walls or objects in the environment typically create a time-delayed and distorted version of the original sound. By adding one or more drivers on an opposite side of the speaker or that face in different directions and selecting appropriate amplitudes and phases of the drive signals, the sound on one side of the speaker (such as the opposite side of the speaker) can be reduced or cancelled. While the overall SPL decreases, by collaboratively using multiple drivers the sound becomes more directional. For example, the acoustic radiation pattern may have a 'heart shape', such as a cardioid response. Note that in the cardioid response, higher frequencies are more directive than lower frequencies. This is because the lower frequencies have longer wavelengths. Furthermore, by changing the amplitudes and/or phases of the drive signals, the acoustic radiation pattern (such as the principal direction and/or width) of the electronic device can be changed.

In some embodiments, the electronic device includes multiple tweeters and mid-range units, and at least one omnidirectional bass unit. This is because large drivers usually cannot move fast enough to produce high-frequency sound because of inertia. Alternatively, a single small driver can produce mid-frequencies and high-frequencies, but often does not have the required surface area to move enough air to create low frequencies. However, by using multiple smaller drivers, the surface area adds up so that the SPL and the dynamic range at low frequencies can be increased. Typically, the drivers need to be in close proximity to achieve directional sound. For example, in some embodiments the electronic device includes up to 8 tweeters (for use at frequencies greater than 3 kHz), up to 8 mid-range drivers (for use in frequencies between 0.3-3 kHz), and up to 8 bass units (for use at frequencies below 300 Hz). These drivers may be used to produce sound using approximately $2^{nd}$ order or quadrupole polar responses in a horizontal plane.

Figure 8:
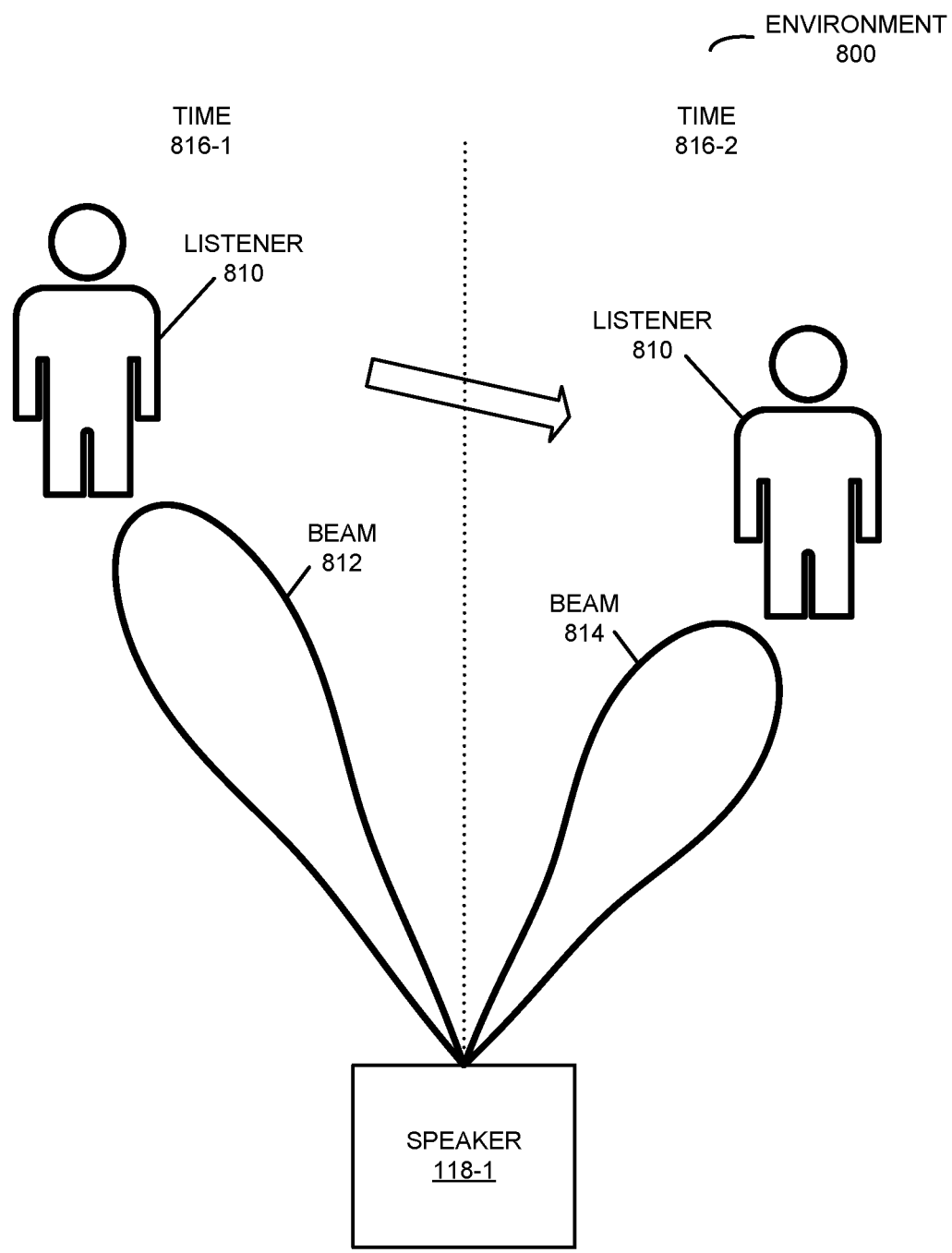
FIG. 8 is a drawing illustrating an example of closed-loop observation and adaptation of three-dimensional (3D) sound in accordance with an embodiment of the present disclosure.

FIG. 8 presents a drawing illustrating an example of closed-loop observation and adaptation of 3D sound or a sound field. Notably, as at least an individual (such as listener 810) moves in environment 800, the adaption technique may be used to monitor their movements and speaker 118-1 may dynamically steer the sound to their location at different times 816, such as using beam 812 at time 816-1 and beam 814 at time 816-2.

For example, by using a spatially directional speaker with a processor, a beamforming array of microphones, image processing and/or wireless communication, a self-contained audio system may adapt to its environment. In particular, a speaker in this self-contained audio system may radiate sound in an adaptable manner. By using closed-loop observation, the processor can determine a mode of operation (such as an acoustic radiation pattern) based at least in part on observations of the immediate environment. As described in additional embodiments below, the self-contained audio system may adapt to the physical placement of the speaker, a listener's needs, audio content, and/or the context to create a consistent and desired sound quality in the environment.

Figure 9:
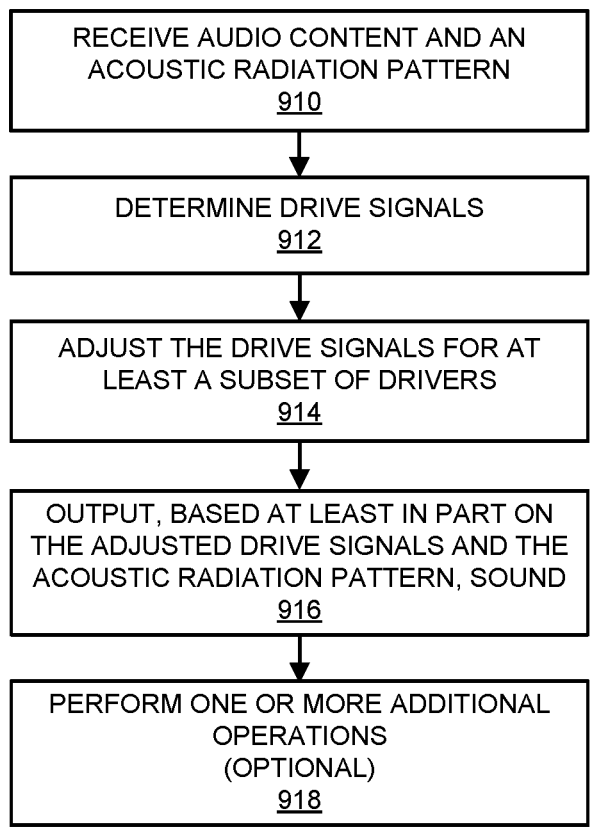
FIG. 9 is a flow diagram illustrating an example of a method for adjusting drive signals in accordance with an embodiment of the present disclosure.

Another embodiment of the adaptation technique provides dynamic equalization in a directional speaker or driver array. This is shown in FIG. 9, which presents a flow diagram illustrating an example of a method 900 for adjusting drive signals. This technique may be performed by an electronic device (such as one of speakers 118, which may include a set of drivers), which may communicate with a second electronic device (such as A/V hub 112).

During operation, the electronic device may receive audio content and an acoustic radiation pattern (operation 910) associated with the second electronic device, where the acoustic radiation pattern has a beam with a principal direction.

Then, the electronic device may determine drive signals (operation 912) for the set of drivers based at least in part on the audio content and the acoustic radiation pattern.

Furthermore, the electronic device may adjust the drive signals for at least a subset of the set of drivers (operation 914) based at least in part on a distortion margin in at least the subset of the drivers, where the distortion margin is based at least in part on the drive signals, a distortion threshold of at least the subset of the drivers and a volume setting. For example, the distortion margin may be determined or specified by a transfer function of a driver that specifies nonlinear sound distortion or response in output sound at one or more frequencies or one or more bands of frequencies as a function of drive amplitude. Note that the volume setting may correspond an SPL.

The adjusted drive signals may limit displacement of cones in at least the subset of the drivers to reduce sound distortion, such as nonlinear sound distortion. Moreover, the adjustment may back off from a directional acoustic radiation pattern toward an omnidirectional acoustic radiation pattern in at least a band of audio frequencies (such as between 100-400 Hz) based at least in part on the distortion margin and a first threshold. In some embodiments, when the volume setting exceeds a second threshold (which may correspond to zero distortion margin over a band of frequencies, such as between 100-400 Hz, between 0.1-3 kHz or between 0.1-10 kHz), the adjusted drive signals are associated with an omnidirectional acoustic radiation pattern. Alternatively, when the volume setting is below the second threshold, the adjusted drive signals may be associated with a directional acoustic radiation pattern. Furthermore, the adjustment may reduce an amplitude of the drive signals in a second band of audio frequencies (such as between 100-400 Hz) based at least in part on the distortion margin and a third threshold.

Next, the electronic device may output, based at least in part on the adjusted drive signals and the acoustic radiation pattern, the sound (operation 916) corresponding to the audio content using the set of drivers.

In some embodiments, the electronic device optionally performs one or more additional operations (operation 918). For example, instead of or in addition to adjusting the drive signals, the electronic device may modify the acoustic radiation pattern. Moreover, in some embodiments operations 912 and 914 are combined or are performed concurrently.

While the preceding discussion illustrated method 900 being performed by the electronic device, in some embodiments the second electronic device may perform at least some of the aforementioned operations, either in conjunction with or instead of the electronic device.

Figure 10:
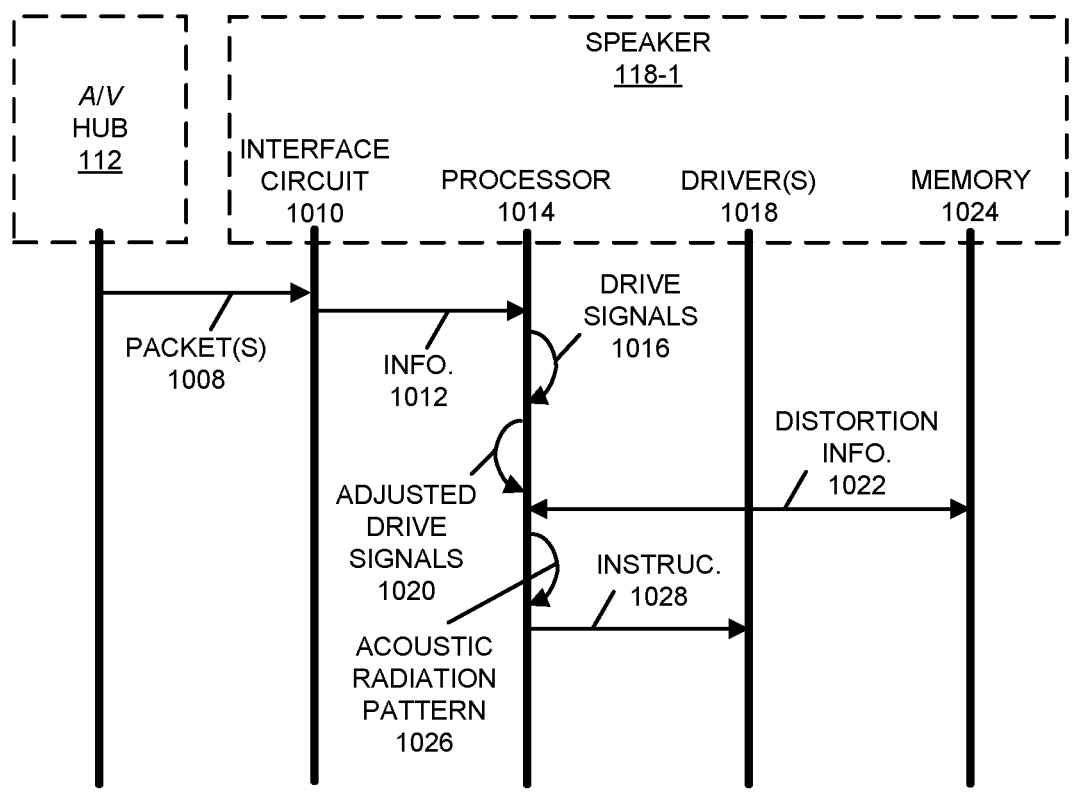
FIG. 10 is a drawing illustrating an example of communication among the electronic devices in FIG. 1 in accordance with an embodiment of the present disclosure.

FIG. 10 presents a drawing illustrating an example of communication between A/V hub 112 and speaker 118-1. In particular, interface circuit 1010 in speaker 118-1 may receive information 1012 specifying audio content and an acoustic radiation pattern in one or more packets 1008 or frames from A/V hub 112. After receiving information 1012, interface circuit 1010 may provide it to processor 1014 in speaker 118-1, which may execute program instructions.

Then, processor 1014 may determine drive signals 1016 for a set of one or more drivers 1018 in speaker 118-1 based at least in part on the audio content and the acoustic radiation pattern.

Furthermore, processor 1014 may adjust 1020 the drive signals for at least a subset of the set of drivers 1018 based at least in part on a distortion margin in at least the subset of the drivers, where the distortion margin is based at least in part on the drive signals, a distortion threshold of at least the subset of the drivers and a volume setting. For example, the distortion threshold and, more generally, distortion information 1022 may be stored in memory 1024 in speaker 118-1. Alternatively or additionally, processor 1014 may optionally adjust an acoustic radiation pattern 1026 based at least in part on a distortion margin in at least the subset of the drivers.

Next, processor 1014 may instruct 1028 the set of drivers 1018 to output, based at least in part on the adjusted drive signals and the acoustic radiation pattern, sound corresponding to the audio content.

Figure 11:
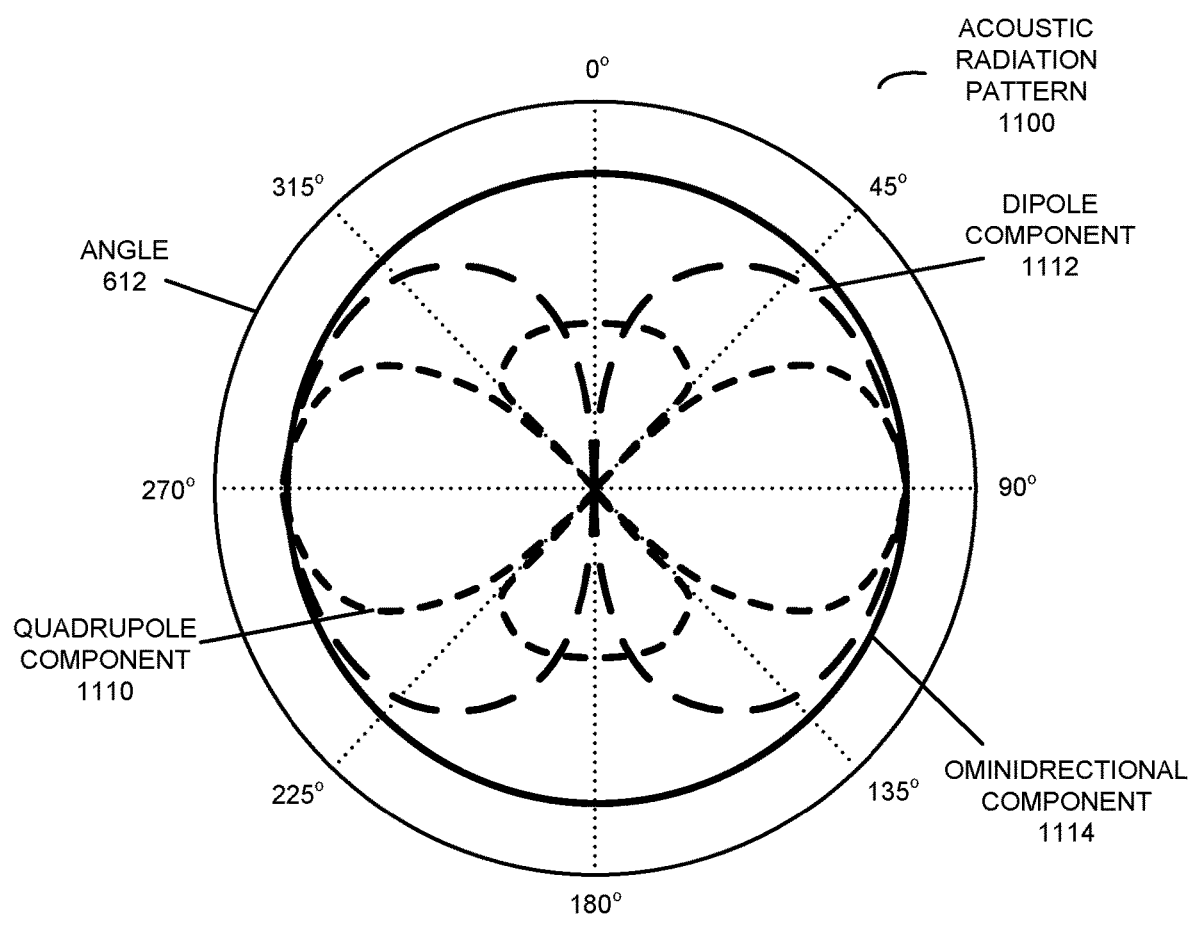
FIG. 11 is a drawing illustrating an example of dynamic equalization in a directional speaker array in accordance with an embodiment of the present disclosure.

FIG. 11 presents a drawing illustrating an example of dynamic equalization in a directional speaker array. As shown in FIG. 11, when a volume setting exceeds a first threshold, a quadrupole component 1110 of an acoustic radiation pattern 1100 may be removed by adjusting drive signals. Then, when a volume setting exceeds a second threshold, a dipole component 1112 of the acoustic radiation pattern 1100 may be removed from the adjusted drive signals, leaving an omnidirectional component 1114. Furthermore, when a volume setting exceeds a third threshold, frequencies corresponding to bass (such as frequencies between 20-400 Hz) may be filtered out of the adjusted drive signals.

Figure 12:
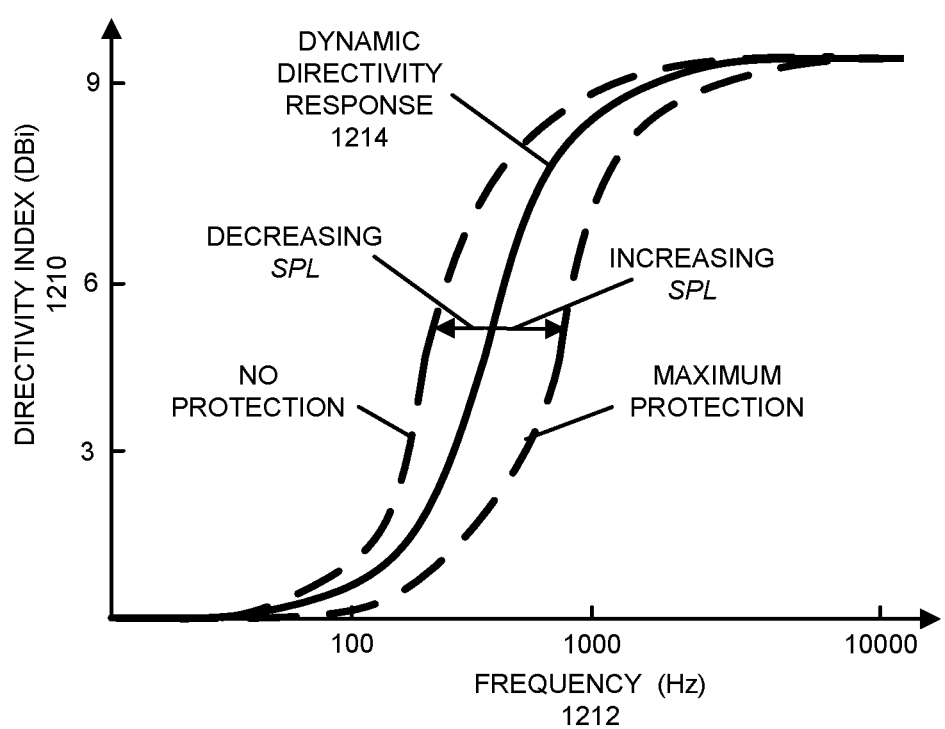
FIG. 12 is a drawing illustrating an example of dynamic equalization in a directional speaker array in accordance with an embodiment of the present disclosure.

FIG. 12 presents a drawing illustrating an example of dynamic equalization in a directional speaker array. In particular, FIG. 12 presents a directivity index 1210 (in dBi) as a function of frequency 1212 (Hz). Note that dynamic directivity response 1214 varies as a function of the volume setting (in SPL). For low values of the volume setting, the drive signals may not need to be adjusted. Alternatively, as the volume setting is increased, the drive signals may need to be adjusted to prevent sound distortion (at the cost of a less directional acoustic radiation pattern in at least a band of frequencies, such as between 250-400 Hz).

In some embodiments, in order to provide directional sound with an array of drivers, an acoustic radiation pattern or response with increasingly higher-order components is generated. These higher order components of the acoustic radiation patterns are often progressively less efficient at radiating energy at low frequencies and, therefore, often require considerable equalization. For example, a typical directional speaker (such as a set of drivers) may have a monopole component (i.e., a $0^{th}$-order response), a dipole component (i.e., a $1^{st}$-order response) and/or a quadrupole component (i.e., a $2^{nd}$-order response) to increase the array directivity or directionality. In these embodiments, for a 3D array, the maximum directivity indices may be, respectively, 0, 6 and 9.5 dBi.

However, this directivity is often at the expense of useable bandwidth or dynamic range. For example, in order for the $1^{st}$ and $2^{nd}$-order components to have the same bandwidth as the $0^{th}$-order response, these components may need low-frequency boost equalization of 6 dB/octave and 12 dB/octave, respectively. This boost equalization is significant and may be difficult to achieve. Therefore, at high values of the volume setting (such as 110 dB) the quadrupole and to a lesser extent dipole component may have limited headroom available.

In order to provide directional sound with useable bandwidth and low-frequency extension, the drivers and amplifiers may need to be protected from reaching their nonlinear sound-distortion limits. For example, a transfer function for a driver that specifies the nonlinear sound-distortion limits may be calculated using electro-mechanical modelling software. Then, as the volume setting is increased, lower frequency components of the acoustic radiation pattern may be filtered out in a controlled manner, starting with the higher-order components. At low volume settings (such as less than 70 dB relative to 20 µPa), the electronic device may be able to produce a maximum directivity of sound (such as 9.5 dBi). As the volume setting increases, the directivity may be reduced accordingly. Notably, at medium sound volume (such as around 70 dB relative to 20 µPa), the acoustic radiation pattern may only include the $0^{th}$ and $1^{st}$-order components in order to achieve 6 dBi. Moreover, at higher volume settings (in excess of 100 or 110 dB relative to 20 µPa), the acoustic radiation pattern may only include the $0^{th}$-order component, i.e., a monopole or an omnidirectional pattern. Furthermore, at extreme volume levels, limiters, such as global high-pass filtering, may be used to limit low-frequency cone displacement while keeping the mid- and high-frequencies at a perceived constant loudness. (Note that this approach is sometimes referred to as 'dynamic equalization.') The aforementioned adjustment of the drive signals may allow dynamic reduction of the components, as opposed to only filtering out the bass. Note that the dynamic equalization may be implemented so that, as much as possible, it is unnoticeable or minimally perceptual.

Thus, the aforementioned adjustment of the drive signals may provide a volume-level-dependent dynamic order-reduction and high-pass filter. At low volume settings, the set of drivers in the electronic device may have high directivity capability. Then, at medium volume settings, the set of drivers may have medium directivity capability. Moreover, at high volume settings the set of drivers may not have directivity. Furthermore, at extreme volume settings, the bass may be filtered out, so that the majority of the audio spectrum (such as from 400-20 kHz) is unaffected. Note that the specific thresholds for the volume setting may depend on the physical size of the electronic device. Typically, the bass is not filtered for volume settings below 100 dB. Furthermore, in a typical larger electronic device or speaker, the SPL may approach 110 dB (relative to 20 µPa at 1 m) before the low frequencies are filtered.

Another embodiment of the adaptation technique provides volume normalization. This is shown in FIG. 13, which presents a flow diagram illustrating an example of a method 1300 for calculating a volume setting. This technique may be performed by an electronic device (such as A/V hub 112), which may communicate with a second electronic device (such as one of speakers 118).

During operation, the electronic device may acquire information about an environment (operation 1310), which may include the second electronic device. Note that the electronic device may include a sensor that acquires the information, and acquiring the information may involve performing a measurement using the sensor. For example, the sensor may include an image sensor and/or an acoustic sensor. Alternatively or additionally, acquiring the information may involve receiving the information, which is associated with the second electronic device (e.g., the second electronic device may measure and provide the information). Moreover, acquiring the information may involve the electronic device performing wireless ranging using an interface circuit and at least an antenna. Furthermore, the electronic device may include an acoustic transducer that outputs acoustic signals, and the electronic device may output the acoustic signals using the acoustic transducer and the information may correspond to reflections of the acoustic signals. More generally, embodiments of how the electronic device may acquire the information were described previously with reference to FIG. 4.

Then, based at least in part on the information, the electronic device may determine a location (operation 1312) of at least an individual relative to a location of the second electronic device.

Furthermore, based at least in part on the determined location, the electronic device may calculate a volume setting (operation 1314) of a speaker or a driver in the second electronic device. Note that the volume setting may increase as a distance between the location of the individual and the location of the second electronic device increases. In this way, the volume setting may be dynamically adjusted as the individual moves in the environment so that the SPL is approximately constant as a function of the distance.

Alternatively or additionally, the volume setting may be based at least in part on a size of a display device (such as a television or a computer monitor) in the environment. For example, the electronic device may adapt a sound width based at least in part on a distance between the location of the individual and the location of the second electronic device. In this way, the volume setting may include or may be based at least in part on psycho-acoustics, so that the SPL varies with the relative distance and the size of the display device.

Note that the volume setting may be one of a set of categorical levels. Thus, the volume setting may have discrete values.

Next, the electronic device may provide audio content and second information specifying the volume setting (operation 1316) and/or the sound width for the second electronic device. The second electronic device may optionally output sound corresponding to the audio content using the volume setting.

In some embodiments, the electronic device optionally performs one or more additional operations (operation 1318). For example, the electronic device may determine and provide an acoustic radiation pattern to the second electronic device. Consequently, in some embodiments, the second electronic device may optionally output sound corresponding to the audio content using the volume setting and the acoustic radiation pattern.

Alternatively or additionally, the electronic device may detect a gesture performed by the individual or may measure a spoken command of the individual, and the volume level may be calculated based at least in part on the detected gesture. In this way, the individual may manually or verbally set of adjust the volume level. This capability may allow the individual to override the automatic adjustment of the volume setting by the electronic device.

In some embodiments, the electronic device communicates with a third electronic in the environment (such as another one of the speakers 118), and the location of at least the individual may be relative to a location of the third electronic device. Based at least in part on the determined location, the electronic device may calculate a second volume setting of a speaker or driver in the third electronic device. Then, the electronic device may provide the audio content and third information specifying the second volume setting for the third electronic device. Moreover, when the individual is closer to the location of the second electronic device than the location of the third electronic device, the volume setting may be less than the second volume setting. Alternatively, when the individual is closer to the location of the third electronic device than the location of the second electronic device, the second volume setting may be less than the volume setting.

While the preceding discussion illustrated method 1300 being performed by the electronic device, in some embodiments the second electronic device may perform at least some of the aforementioned operations, either in conjunction with or instead of the electronic device. For example, the second electronic device and/or one or more other electronic devices in the environment may perform measurements of the information.

Figure 14:
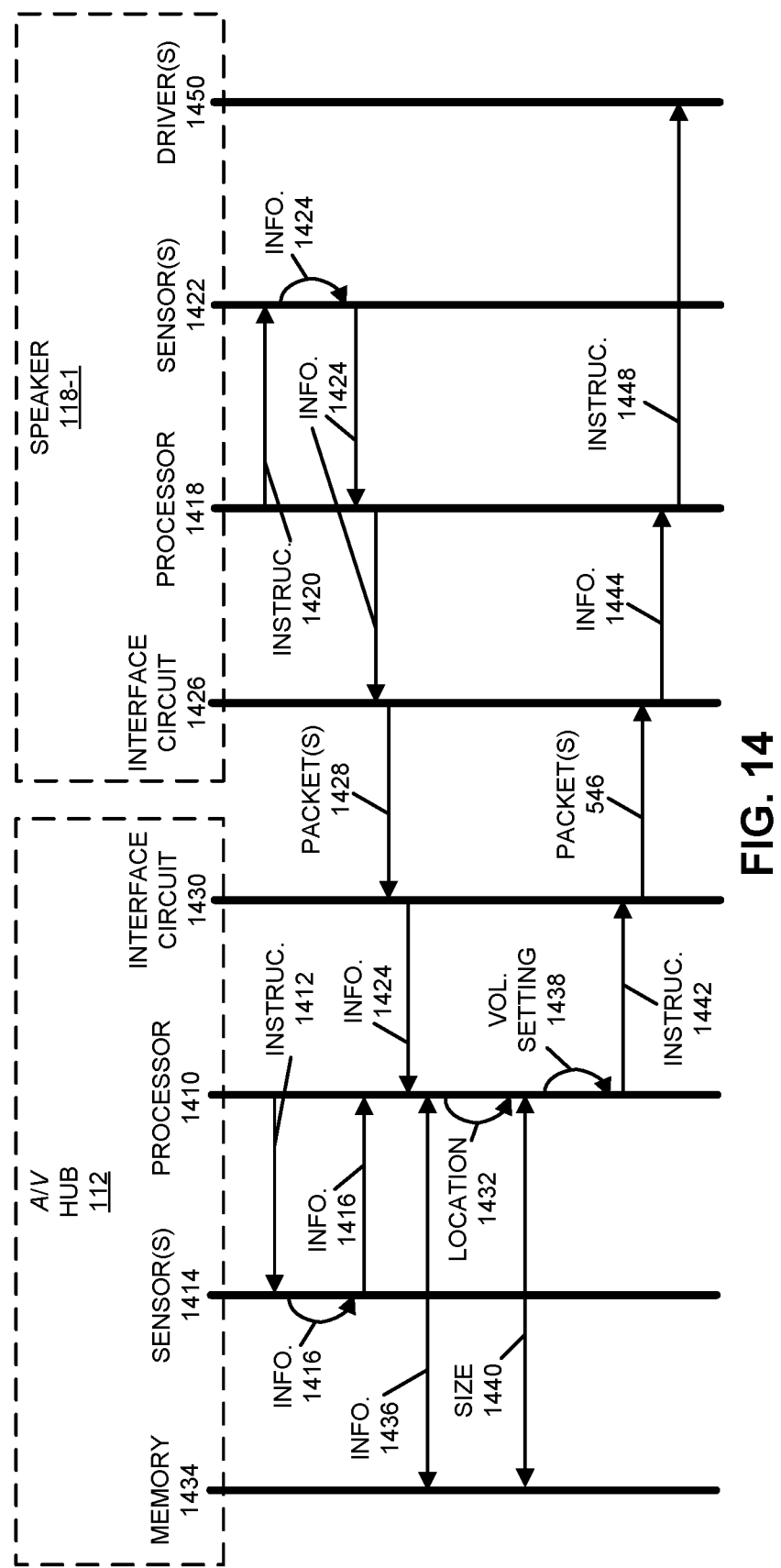
FIG. 14 is a drawing illustrating an example of communication among the electronic devices in FIG. 1 in accordance with an embodiment of the present disclosure.

FIG. 14 presents a drawing illustrating an example of communication between A/V hub 112 and speaker 118-1. In particular, processor 1410 in A/V hub 112 executing program instructions may instruct 1412 one or more sensors 1414 in A/V hub 112 to perform measurements to acquire information 1416 (such as one or more images or sounds) about an environment. Then, the one or more sensors 1414 may provide information 1416 to processor 1410.

Alternatively or additionally, processor 1418 in speaker 118-1 executing program instructions may instruct 1420 one or more sensors 1422 in speaker 118-1 to perform measurements to acquire information 1424 (such as one or more additional images or sounds) about the environment. After receiving information 1424, processor 1418 may provide information 1424 to interface circuit 1426 in speaker 118-1, which may transmit one or more packets 1428 or frames with information 1424 to interface circuit 1430 in A/V hub 112, which after receiving the one or more packets 1428 may provide information 1424 to processor 1410. Note that the measurements performed by A/V hub 112 and/or speaker 118-1 may be time stamped so that processor 1410 can associate and/or compare information 1416 and 1424.

After receiving information 1416 and/or 1424, processor 1410 may determine a location 1432 of at least an individual relative to a location of speaker 118-1. For example, location 1432 may be determined using predefined or predetermined information 1436 about the environment (such as a height, width or length of the environment, a size of an object in the environment, one or more acoustic transfer functions of the environment, a reverberation time of the environment, etc.), which is stored in memory 1434.

Then, based at least in part on location 1432, processor 1410 may calculate a volume setting 1438 of a driver in speaker 118-1. In some embodiments, volume setting 1438 is based at least in part on a size 1440 of a display device in the environment, which is stored in memory 1434.

Next, processor 1410 may instruct 1442 interface circuit 1430 to provide information 1444 with audio content and information specifying the volume setting 1438 to speaker 118-1 in one or more packets 546 or frames. After receiving information 1444, interface circuit 1426 may provide this information to processor 1418, which may instruct 1448 one or more acoustic transducers or drivers 1450 to output sound corresponding to the audio content using the volume setting 1438.

Figure 15:
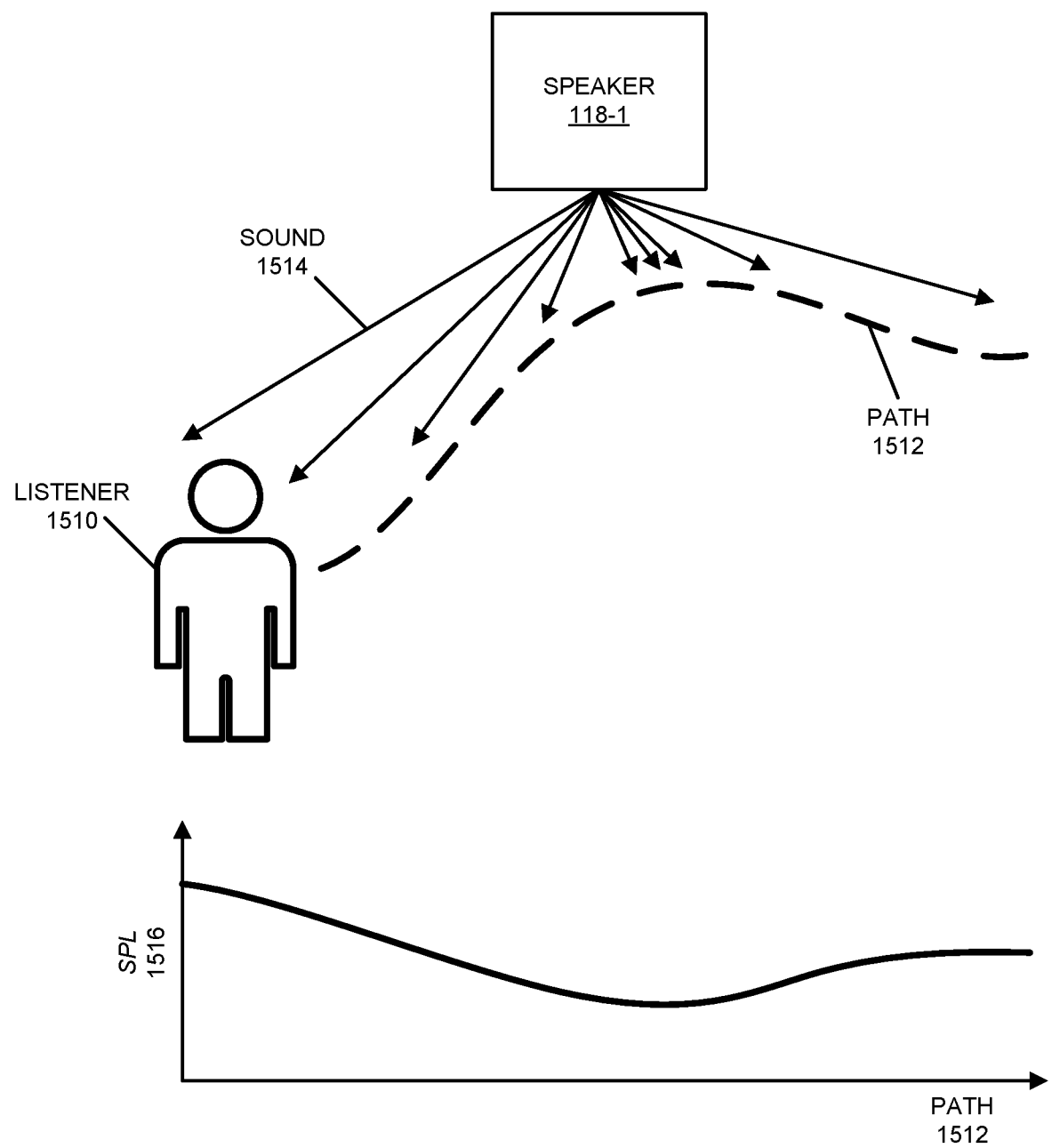
FIG. 15 is a drawing illustrating an example of volume normalization in accordance with an embodiment of the present disclosure.

FIG. 15 presents a drawing illustrating an example of volume normalization. As an individual (such as listener 1510) moves on a path 1512 through an enclosed space while listening to a loudspeaker (such as speaker 118-1), they may perceive variations in loudness that are caused by experiencing differing ratios of direct sound and reverberation or diffuse sound that the speaker creates in the room. In typical living spaces, there is a complicated relationship between this perceived loudness or comfort level and where a listener is located. By monitoring an individual's physical location relative to speaker 118-1, and optionally by allowing the individual to give feedback to adjust their ideal volume level (or volume setting, such as SPL 1516) at various locations, sound 1514 output by the speaker can be trained and/or adapted to provide a consistent sound experience or comfort level regardless of the individual's position along path 1512.

This capability may be used in a variety of scenarios. For example, a listener may be seated on a sofa, approximately equal distance from two speakers that are playing a channel from a stereo source. The volumes of the speakers may initially be equal, but can change as a function of a listener's position or location, such as when they move off center. When the listener's position changes, the volume settings may be changed, such as using a linear rule. Thus, the adaptation technique may be used to provide balance control for the volume settings of the speakers. In addition, the listener can use a gesture (which may be identified using an image-processing technique) or another input (such as a spoken command) to manually specify or adjust the volume setting. For example, a listener may hold their hand parallel to the group, and may increase (or decrease) the volume setting by moving their hand up (or down). In some embodiments, the listener's past or previous behavior can be used to train a predictive model that is used to predict the volume setting, thereby eliminating the need for the listener to specify the volume setting in the future.

In another example, there may be single speaker and a listener's position may be dynamically changing. The listener may select or may set a particular volume setting or level. Then, as they walk around a room, closer or further away from the speaker, the volume setting may be adjusted to maintain the volume level perceived by the listener. Once again, the listener can use a gesture or a voice command to manually specify the volume setting.

In examples with more than one listener, the volume setting may be adjusted based on the nearest listener's location or the average or mean location of the listeners. More generally, the volume setting may be adjusted based at least in part on one or more moments (such as the standard deviation) of the spatial distribution of the listeners in the environment, characteristics of the listeners (such as predefined preferences or previous volume settings they have specified), and/or characteristics of the audio content that is being played. Note that the listeners may be identified in the environment using one or more techniques, such as: based at least in part on identifiers of their cellular telephones (such as a MAC address, a cellular telephone number or a BTLE beacon), face recognition, voice recognition, biometric identification, etc.

Figure 16:
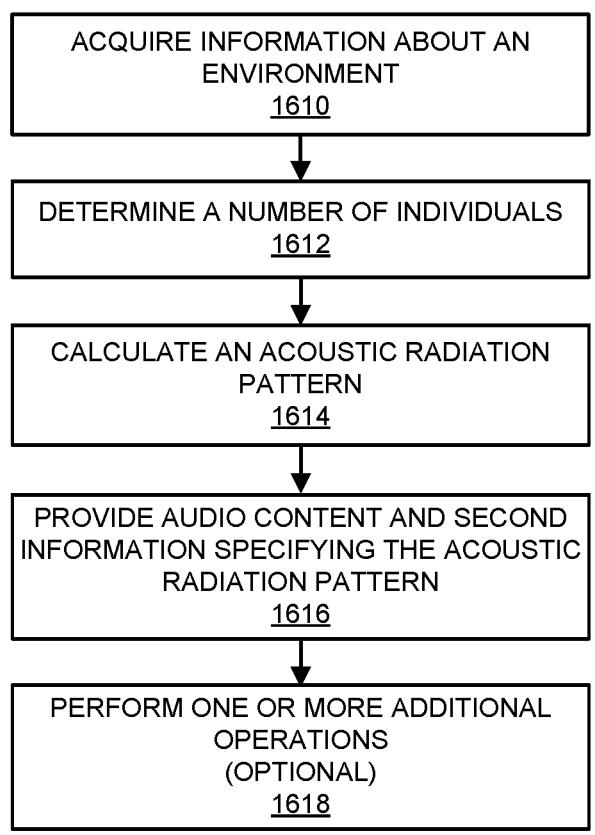
FIG. 16 is a flow diagram illustrating an example of a method for calculating an acoustic radiation pattern in accordance with an embodiment of the present disclosure.

Another embodiment of the adaptation technique provides automatic room filling. This is shown in FIG. 16, which presents a flow diagram illustrating an example of a method 1600 for calculating an acoustic radiation pattern. This technique may be performed by an electronic device (such as A/V hub 112), which may communicate with a second electronic device (such as one of speakers 118).

During operation, the electronic device may acquire information about an environment (operation 1610), which may include the second electronic device. Note that the electronic device may include a sensor that acquires the information, and acquiring the information may involve performing a measurement using the sensor. For example, the sensor may include an image sensor and/or an acoustic sensor. Alternatively or additionally, acquiring the information may involve receiving the information, which is associated with the second electronic device (e.g., the second electronic device may measure and provide the information). Moreover, acquiring the information may involve the electronic device performing wireless ranging using an interface circuit and at least an antenna. Furthermore, the electronic device may include an acoustic transducer that outputs acoustic signals, and the electronic device may output the acoustic signals using the acoustic transducer and the information may correspond to reflections of the acoustic signals. More generally, embodiments of how the electronic device may acquire the information were described previously with reference to FIG. 4.

Then, based at least in part on the information, the electronic device may determine a number of individuals (operation 1612) in the environment.

Furthermore, based at least in part on the determined number of individuals, the electronic device may calculate an acoustic radiation pattern (operation 1614). Note that the acoustic radiation pattern may include a beam having a principal direction. Moreover, the width of the beam may be narrower when there is one individual in the environment, and the width of the beam may be wider when there is more than one individual in the environment.

Next, the electronic device may provide audio content and second information specifying the acoustic radiation pattern (operation 1616) for the second electronic device. The second electronic device may optionally output sound corresponding to the audio content using the acoustic radiation pattern.

In some embodiments, the electronic device optionally performs one or more additional operations (operation 1618). For example, the electronic device may determine locations of the individuals based at least in part on the information, the electronic device, and the acoustic radiation pattern is based at least in part on the locations of the individuals.

While the preceding discussion illustrated method 1600 being performed by the electronic device, in some embodiments the second electronic device may perform at least some of the aforementioned operations, either in conjunction with or instead of the electronic device. For example, the second electronic device and/or one or more other electronic devices in the environment may perform measurements of the information.

Figure 17:
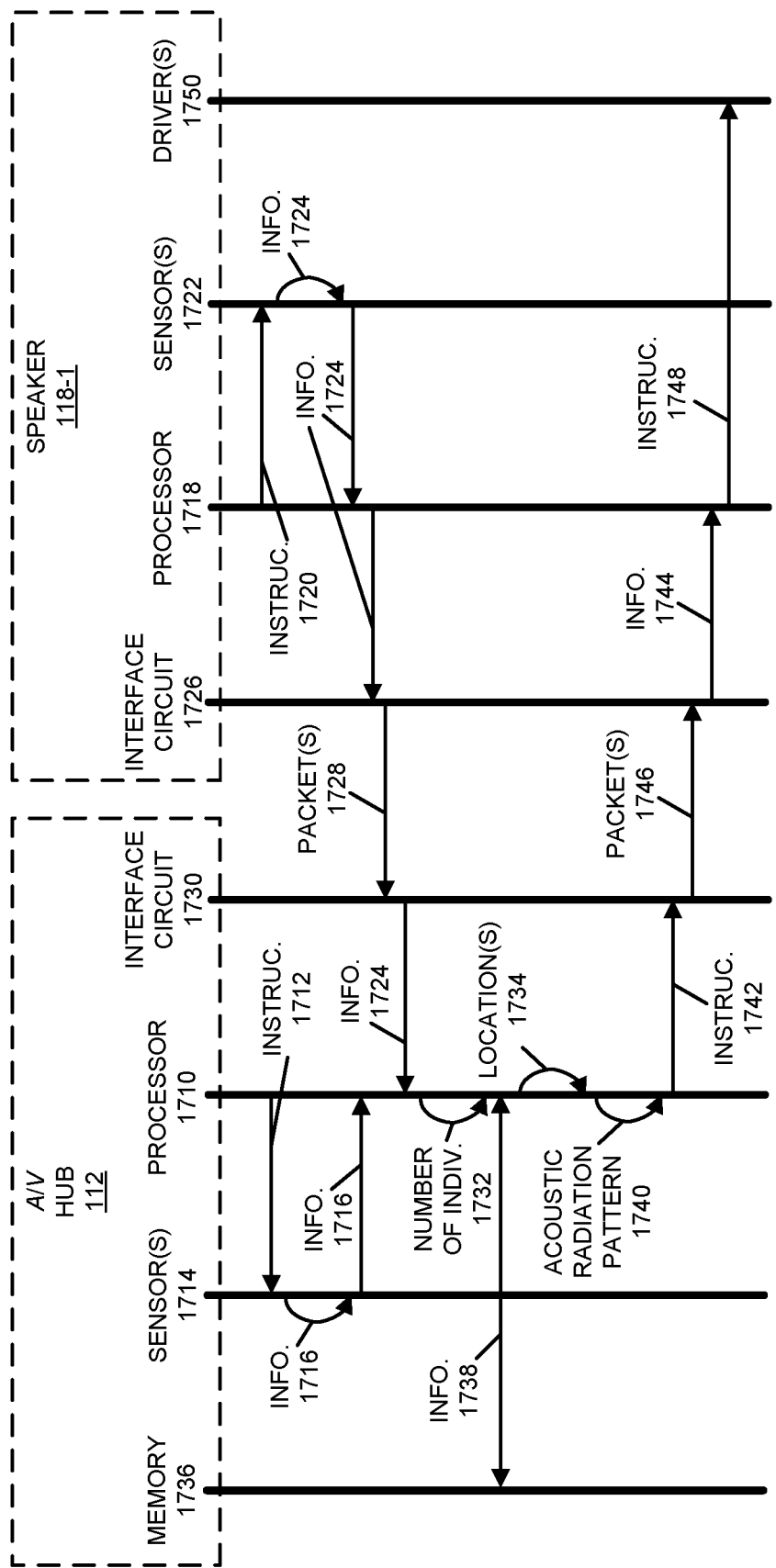
FIG. 17 is a drawing illustrating an example of communication among the electronic devices in FIG. 1 in accordance with an embodiment of the present disclosure.

FIG. 17 presents a drawing illustrating an example of communication between A/V hub 112 and speaker 118-1. In particular, processor 1710 in A/V hub 112 executing program instructions may instruct 1712 one or more sensors 1714 in A/V hub 112 to perform measurements to acquire information 1716 (such as one or more images or sounds) about an environment. Then, the one or more sensors 1714 may provide information 1716 to processor 1710.

Alternatively or additionally, processor 1718 in speaker 118-1 executing program instructions may instruct 1720 one or more sensors 1722 in speaker 118-1 to perform measurements to acquire information 1724 (such as one or more additional images or sounds) about the environment. After receiving information 1724, processor 1718 may provide information 1724 to interface circuit 1726 in speaker 118-1, which may transmit one or more packets 1728 or frames with information 1724 to interface circuit 1730 in A/V hub 112, which after receiving the one or more packets 1728 may provide information 1724 to processor 1710. Note that the measurements performed by A/V hub 112 and/or speaker 118-1 may be time stamped so that processor 1710 can associate and/or compare information 1716 and 1724.

After receiving information 1716 and/or 1724, processor 1710 may determine a number of individuals 1732 in the environment. In some embodiments, based at least in part on information 1716 and/or 1724, processor 1710 may determine locations 1734 of the individuals relative to a location of speaker 118-1. For example, locations 1734 may be determined using predefined or predetermined information 1738 about the environment (such as a height, width or length of the environment, a size of an object in the environment, one or more acoustic transfer functions of the environment, a reverberation time of the environment, etc.), which is stored in memory 1736.

Then, based at least in part on the number of individuals 1732 and/or locations 1734, processor 1710 may calculate an acoustic radiation pattern 1740.

Next, processor 1710 may instruct 1742 interface circuit 1730 to provide information 1744 with audio content and information specifying the acoustic radiation pattern 1740 to speaker 118-1 in one or more packets 1746 or frames.

After receiving information 1744, interface circuit 1726 may provide this information to processor 1718, which may instruct 1748 one or more acoustic transducers or drivers 1750 to output sound corresponding to the audio content using the acoustic radiation pattern 1740.

Figure 18:
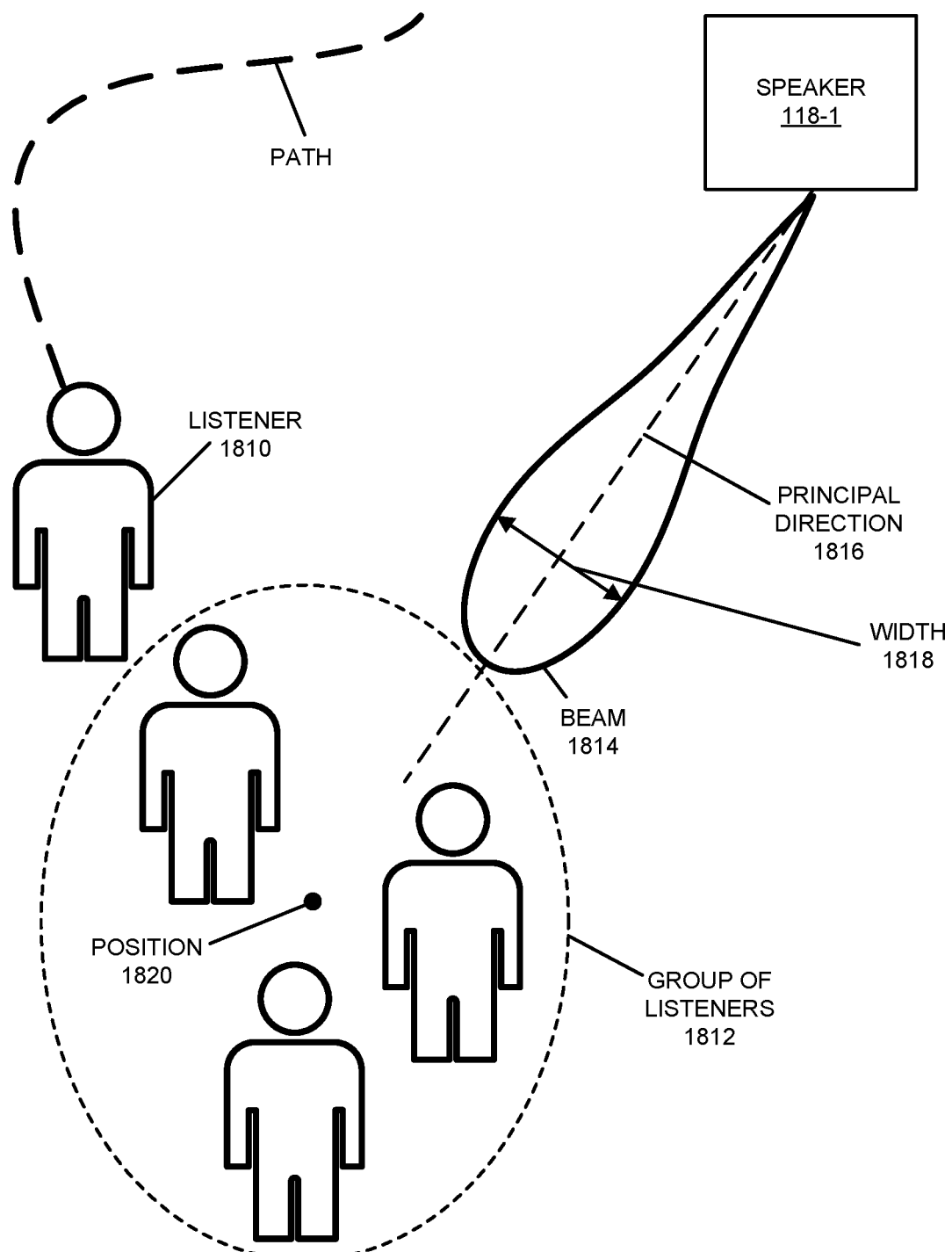
FIG. 18 is a drawing illustrating an example of automatic room filling in accordance with an embodiment of the present disclosure.

FIG. 18 presents a drawing illustrating an example of automatic room filling. The dynamics of a listener 1810, or group of listeners 1812, e.g., their physical locations in an environment may affect how sound should be output into the environment by speaker 118-1. For example, listener 1810 may move through the environment, while the positions of the group of listeners 1812 may be static or at least quasi-static (such slowly varying over minutes or a longer time scale).

By evaluating group behavior (including the number of individuals and/or their locations), an acoustic radiation pattern may be determined. For example, by determining the audience size and/or locations, A/V hub 112 may calculate an appropriate acoustic radiation pattern, such as a beam 1814 having a principal direction 1816 pointing towards an average or mean position 1820 of the individuals and/or a width 1818 that encompasses the locations of the individuals. Moreover, when there is more than one speaker (such as speakers 118-1 and 118-2) in the environment, these speakers can provide a uniform sound field that is relevant to the current audience and their disposition in the environment.

In some embodiments, the automatic room filling may adjust the acoustic radiation pattern based at least in part on the number of individuals, from omnidirectional (such as with a directivity of 0 dBi), to specifically radiating sound at a single listener (such as with a directivity that may approach 6 dBi or more).

Figure 19:
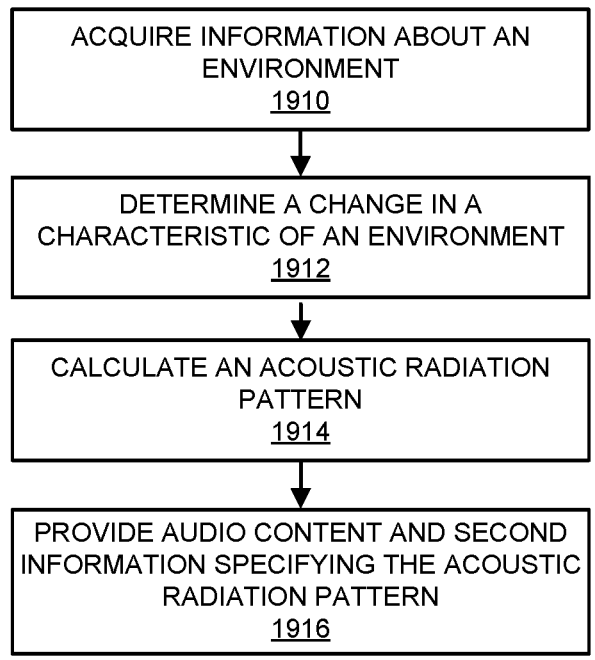
FIG. 19 is a flow diagram illustrating an example of a method for calculating an acoustic radiation pattern in accordance with an embodiment of the present disclosure.

Another embodiment of the adaptation technique dynamically adapts sound based at least in part on environmental characterization. This is shown in FIG. 19, which presents a flow diagram illustrating an example of a method 1900 for calculating an acoustic radiation pattern. This technique may be performed by an electronic device (such as A/V hub 112), which may communicate with a second electronic device (such as one of speakers 118).

During operation, the electronic device may acquire information (operation 1910) about an environment, which may include the second electronic device. Note that the electronic device may include a sensor that acquires the information, and acquiring the information may involve performing a measurement using the sensor. For example, the sensor may include an image sensor and/or an acoustic sensor. Alternatively or additionally, acquiring the information may involve receiving the information, which is associated with the second electronic device (e.g., the second electronic device may measure and provide the information). Moreover, acquiring the information may involve the electronic device performing wireless ranging using an interface circuit and at least an antenna. Furthermore, the electronic device may include an acoustic transducer that outputs acoustic signals, and the electronic device may output the acoustic signals using the acoustic transducer and the information may correspond to reflections of the acoustic signals. More generally, embodiments of how the electronic device may acquire the information were described previously with reference to FIG. 4.

Then, based at least in part on the information, the electronic device may determine a change in a characteristic of the environment (operation 1912). For example, the change in the characteristic may include or may correspond to: changing a state of a window (such as open or closed), changing a state of a window covering (such as opening of closing blinds or curtains), changing a state of a door (such as open or closed), changing a number of individuals in the environment, and/or changing a position of a piece of furniture in the environment. Thus, the change in the characteristics may include a change in a state of a portal to the environment or of the environment itself. In some embodiments, the change in the characteristic includes a change in a delay between a direct sound path and a first reflected sound path (such as an increase or a decrease in the relative delay of at least 5-10%), or a change in a reverberation time of the environment (such as a reduction in the RT60 time from 700 ms to 400 ms), which is associated with at least a frequency (such as 0.125, 0.5 or 2 kHz).

Furthermore, based at least in part on the determined change in the characteristic, the electronic device may calculate an acoustic radiation pattern (operation 1914), where the calculated acoustic radiation pattern reduces an effect of the change in the characteristic on sound in the environment. Note that the acoustic radiation pattern may include a beam having a principal direction. Moreover, based at least in part on the change in the characteristic, the acoustic radiation pattern may include: a change in a phase in a first band of frequencies, filtering to reduce an amplitude of a spectral response in a second band of frequencies, and/or filtering to increase the amplitude of the spectral response in a third band of frequencies.

Next, the electronic device may provide audio content and second information specifying the acoustic radiation pattern (operation 1916) for the second electronic device. The second electronic device may optionally output sound corresponding to the audio content using the acoustic radiation pattern.

While the preceding discussion illustrated method 1900 being performed by the electronic device, in some embodiments the second electronic device may perform at least some of the aforementioned operations, either in conjunction with or instead of the electronic device. For example, the second electronic device and/or one or more other electronic devices in the environment may perform measurements of the information.

Figure 20:
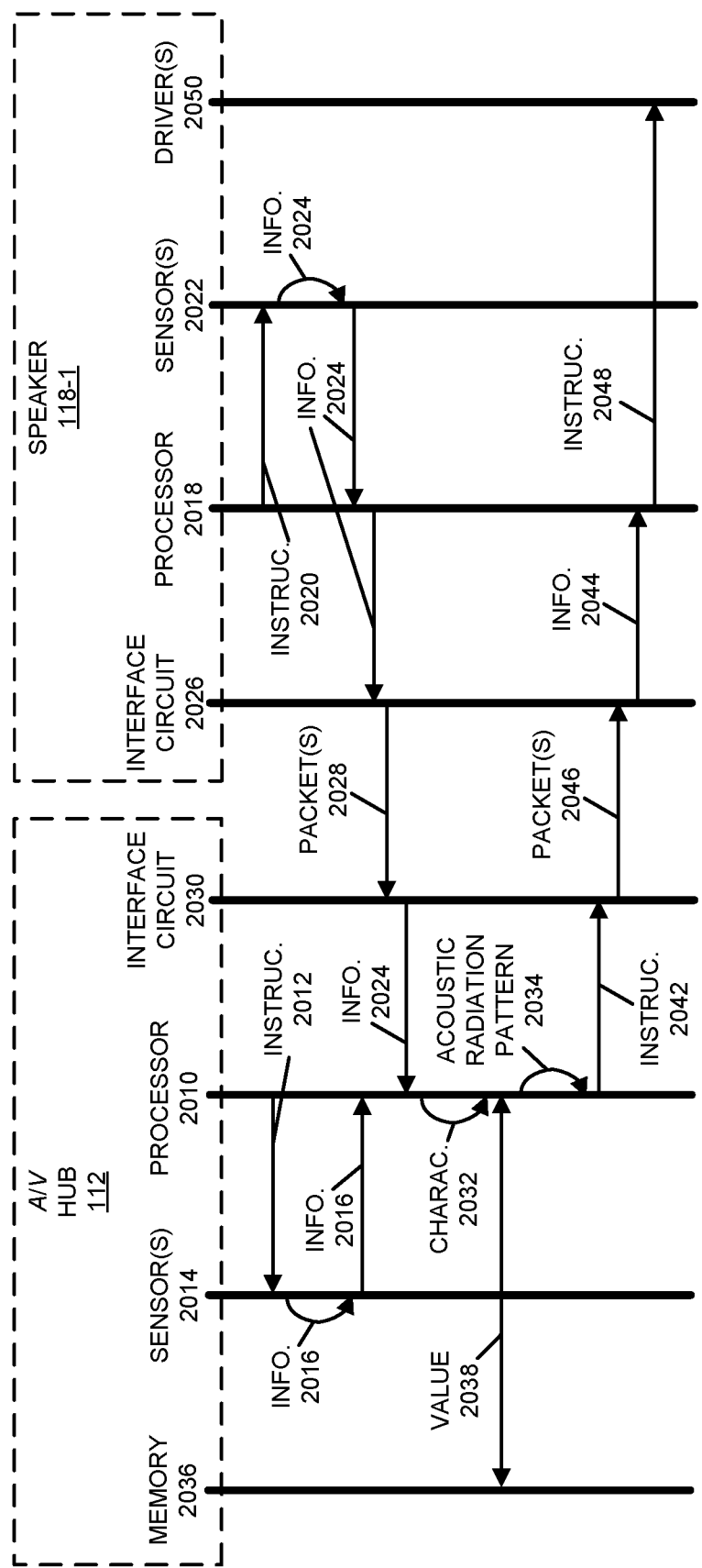
FIG. 20 is a drawing illustrating an example of communication among the electronic devices in FIG. 1 in accordance with an embodiment of the present disclosure.

FIG. 20 presents a drawing illustrating an example of communication between A/V hub 112 and speaker 118-1. In particular, processor 2010 in A/V hub 112 executing program instructions may instruct 2012 one or more sensors 2014 in A/V hub 112 to perform measurements to acquire information 2016 (such as one or more images or sounds) about an environment. Then, the one or more sensors 2014 may provide information 2016 to processor 2010.

Alternatively or additionally, processor 2018 in speaker 118-1 executing program instructions may instruct 2020 one or more sensors 2022 in speaker 118-1 to perform measurements to acquire information 2024 (such as one or more additional images or sounds) about the environment. After receiving information 2024, processor 2018 may provide information 2024 to interface circuit 2026 in speaker 118-1, which may transmit one or more packets 2028 or frames with information 2024 to interface circuit 2030 in A/V hub 112, which after receiving the one or more packets 2028 may provide information 2024 to processor 2010. Note that the measurements performed by A/V hub 112 and/or speaker 118-1 may be time stamped so that processor 2010 can associate and/or compare information 2016 and 2024.

After receiving information 2016 and/or 2024, processor 2010 may determine a change in a characteristic 2032 of the environment.

Furthermore, based at least in part on the change in the characteristic 2032, processor 2010 may calculate an acoustic radiation pattern 2034, where the calculated acoustic radiation pattern reduces an effect of the change in the characteristic 2032 on sound in the environment. In some embodiments, acoustic radiation pattern 2034 is calculated based at least in part on a previous value 2038 of the characteristic, which is stored in memory 2036.

Next, processor 2010 may instruct 2042 interface circuit 2030 to provide information 2044 with audio content and information specifying the acoustic radiation pattern 2034 to speaker 118-1 in one or more packets 2046 or frames. After receiving information 2044, interface circuit 2026 may provide this information to processor 2018, which may instruct 2048 one or more acoustic transducers or drivers

2050 to output sound corresponding to the audio content using the acoustic radiation pattern 2034.

Figure 21:
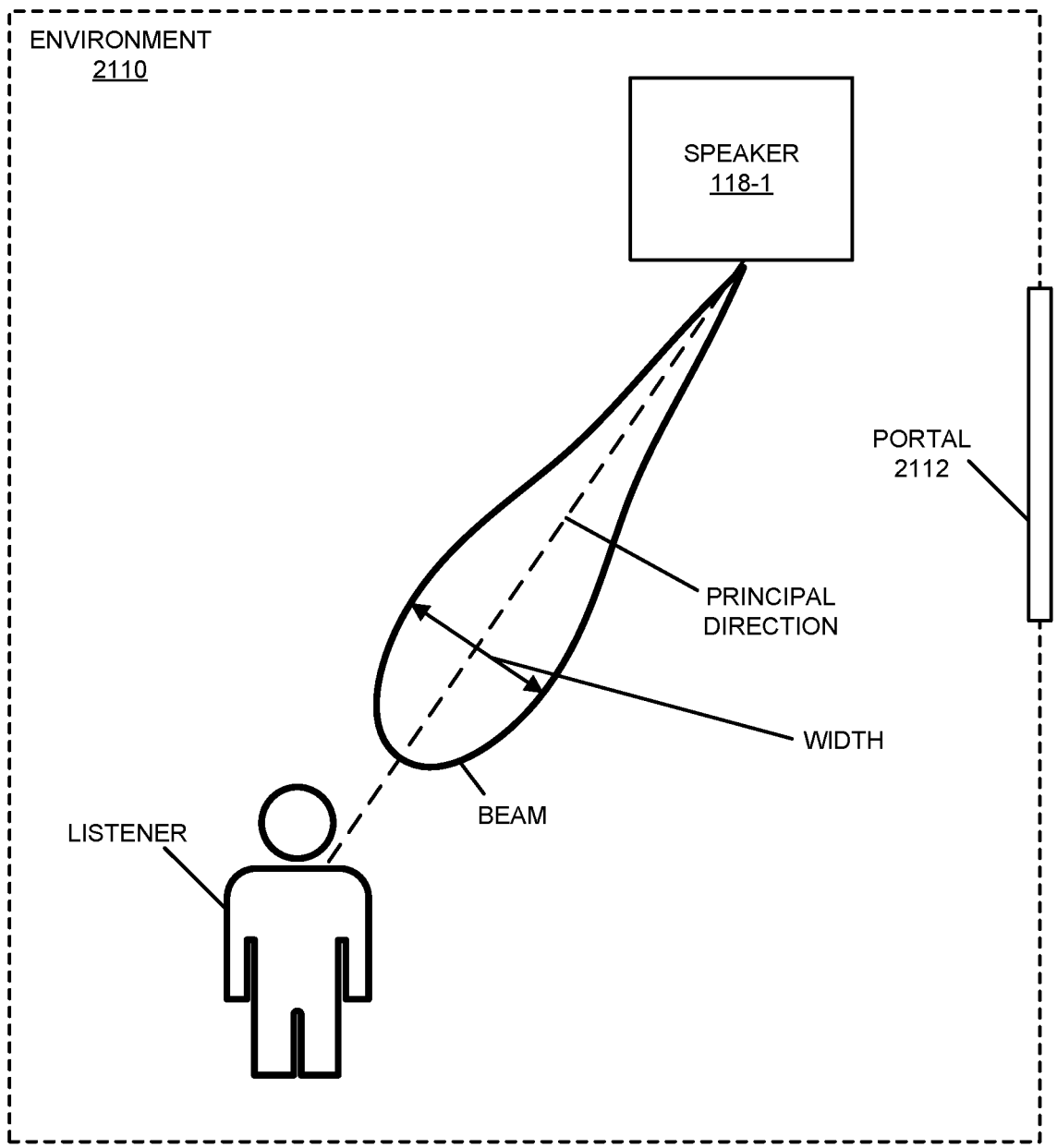
FIG. 21 is a drawing illustrating an example of dynamically adapting sound based at least in part on environmental characterization in accordance with an embodiment of the present disclosure.

FIG. 21 presents a drawing illustrating an example of dynamically adapting sound based at least in part on environmental characterization. Using the adaptation technique, A/V hub 112 may characterize and calculate an appropriate acoustical radiation response for the current state of environment 2110. For example, A/V hub 112 may dynamically estimate the acoustic energy absorption associated with the number of individuals in a room and/or a change in the physical space (such as a portal 2112, e.g., curtains, a door and/or a window being opened or closed, etc.). Thus, A/V hub 112 may dynamically determine a state of portal 2112.

The resulting change in absorption and, thus, the reverberation time associated with such dynamic changes in the environment can be reduced or eliminated by frequency-dependent acoustic level equalization in one or more bands of frequencies and/or by adjusting the spatial energy distribution output by multiple drivers (i.e., the acoustic radiation pattern). The adjustment(s) may provide a more-consistent and comfortable sound presentation.

For example, A/V hub 112 may determine the effect of the number of people in a room on the reverberation time of the room, such as an increase in the damping, which may reduce the reverberation time. Accordingly, the A/V hub 112 may adjust the amount of high frequencies (such as above 3 kHz) being output by speaker 118-1 using equalization. Alternatively or additionally, if A/V hub 112 detects that a large door or patio window is open, it may determine that an increase in high frequencies or diffuse energy is need to reduce the effect on the reverberation time. Consequently, A/V hub 112 may calculate an acoustic radiation pattern that outputs high frequencies in directions other than the detected location(s) of one or more listeners in the environment.

Figure 22:
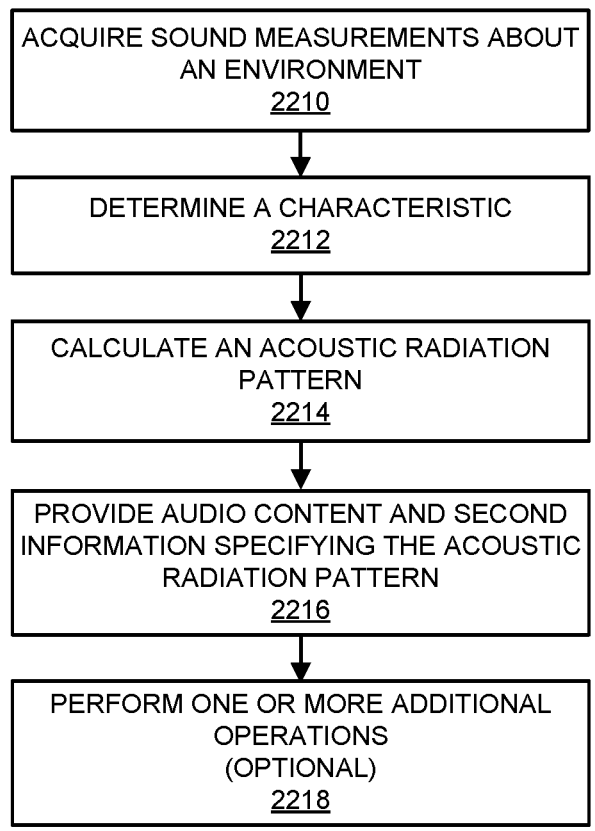
FIG. 22 is a flow diagram illustrating an example of a method for calculating an acoustic radiation pattern in accordance with an embodiment of the present disclosure.

Another embodiment of the adaptation technique dynamically adapts sound based at least in part on spatial information determined from ambient or background sound. This is shown in FIG. 22, which presents a flow diagram illustrating an example of a method 2200 for calculating an acoustic radiation pattern. This technique may be performed by an electronic device (such as A/V hub 112), which may communicate with a second electronic device (such as one of speakers 118).

During operation, the electronic device may acquire sound measurements for an environment (operation 2210), which may include the second electronic device, where the sound measurements correspond to ambient noise in the environment. Thus, the sound measurements may correspond to the natural acoustic response of the environment (such as room modes). In some embodiments, the sound measurements specify 2D or 3D sound (i.e., the sound measurements may include information associated with a 2D or a 3D sound pattern or field).

Note that the electronic device may include an acoustic sensor (such as a microphone or an array of microphones) that acquires the sound measurements, and acquiring the sound measurements may involve performing a measurement using the acoustic sensor. Alternatively or additionally, acquiring the information may involve receiving the information that specifies the sound measurements in the environment, which is associated with the second electronic device (e.g., the second electronic device may measure the sound and provide the information). More generally, embodiments of how the electronic device may acquire the sound measurements were described previously with reference to FIG. 4.

Then, based at least in part on the sound measurements, the electronic device may determine a characteristic (operation 2212) of the environment. For example, the characteristic may include: a size of the environment (such as one or more lengths, an area or a volume), one or more an acoustic mode of the environment, a delay between a direct sound path and a first reflected sound path in the environment, and/or a reverberation time of the environment, which is associated with at least a frequency (such as 0.125, 0.5 or 2 kHz).

Moreover, based at least in part on the determined characteristics, the electronic device may calculate an acoustic radiation pattern (operation 2214), where the acoustic radiation pattern may include a beam having a principal direction.

Next, the electronic device may provide audio content and second information specifying the acoustic radiation pattern (operation 2216) for the second electronic device. The second electronic device may optionally output sound corresponding to the audio content using the acoustic radiation pattern.

In some embodiments, the electronic device optionally performs one or more additional operations (operation 2218). For example, the electronic device may provide an instruction for the second electronic device to output one or more acoustic signals in different directions. The measured sound may correspond to a response of the environment to the one or more acoustic signals. For example, the one or more acoustic signals may include one or more test signals associated with one or more carrier frequencies. Alternatively or additionally, the one or more acoustic signals may include music with one or more embedded test signals associated with one or more carrier frequencies. Thus, in these embodiments, the electronic device may use the second electronic device to excite or drive an acoustic response of the environment, which is then used to acoustically characterize the environment using subsequent sound measurements.

While the preceding discussion illustrated method 2200 being performed by the electronic device, in some embodiments the second electronic device may perform at least some of the aforementioned operations, either in conjunction with or instead of the electronic device. For example, the second electronic device and/or one or more other electronic devices in the environment may perform measurements of the sound.

In some embodiments, the electronic device uses the sound measurements to determine the characteristic. For example, the electronic device may perform the sound measurements along different directions (such as three orthogonal directions) based on ambient noise in an environment. Then, the electronic device may use the sound measurements to determine the characteristic, such as dimensions or lengths of a room, a volume of the room, a reverberation time, etc. Next, instead of operations 2214 and 2216, the electronic device may adjust one or more parameters associated with a set of speakers (which may be included in the second electronic device and/or another electronic device), such as one or more bass speakers, mid-band speakers, tweeters, etc. For example, the one or more parameters may specify relative volume settings of the speakers in the set of speakers (in essence, the characteristic may be used to dynamically determine equalization for the set of speakers). Thus, in these embodiments, the set of speakers may or may not use directional acoustic radiation patterns. Furthermore, the electronic device may provide, via the interface circuit, the audio content and information specifying the volume settings to the second electronic device and/or the other electronic device.

Figure 23:
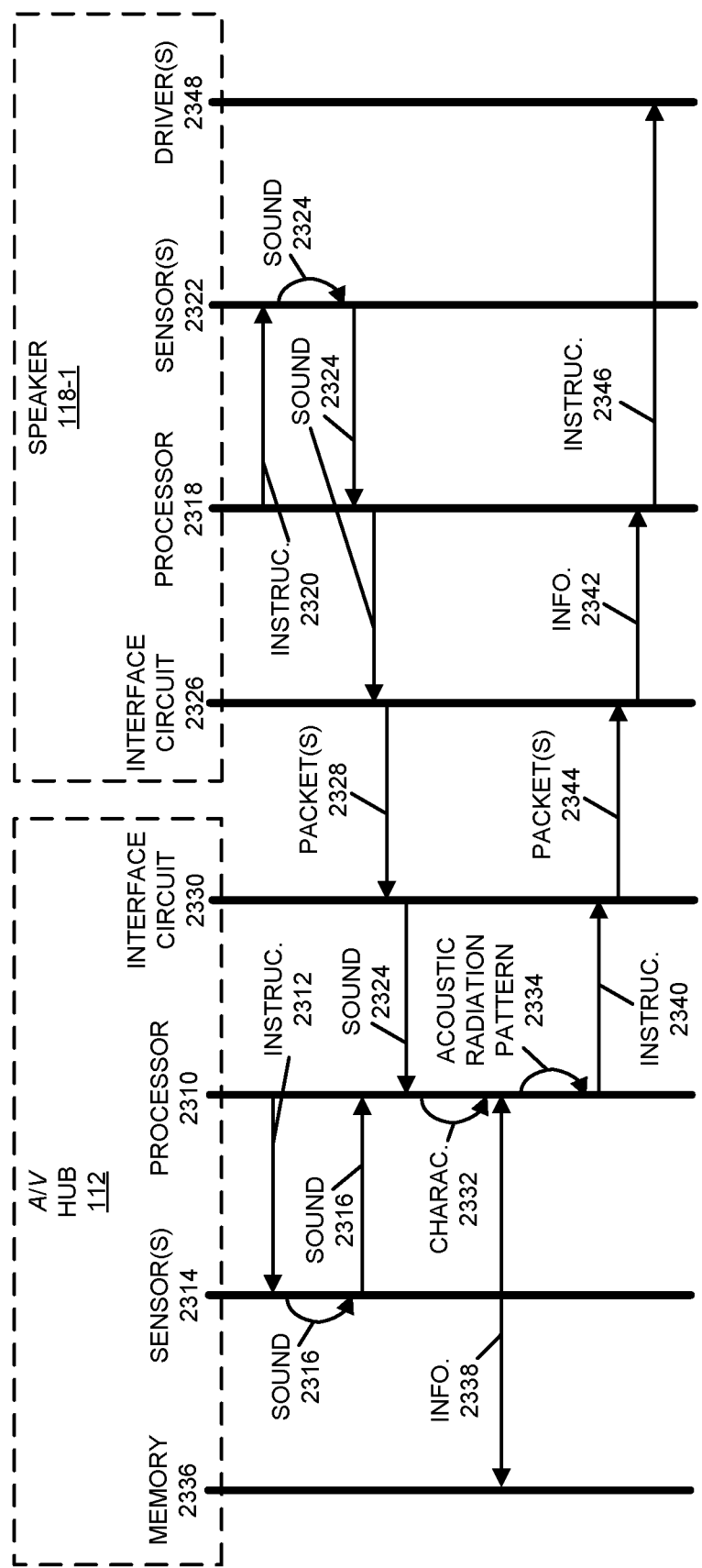
FIG. 23 is a drawing illustrating an example of communication among the electronic devices in FIG. 1 in accordance with an embodiment of the present disclosure.

FIG. 23 presents a drawing illustrating an example of communication between A/V hub 112 and speaker 118-1. In particular, processor 2310 in A/V hub 112 executing program instructions may instruct 2312 one or more sensors 2314 in A/V hub 112 to perform measurements to acquire sound 2316 (such sound corresponding to ambient or background noise) in an environment. Then, the one or more sensors 2314 may provide the sound measurements 2316 to processor 2310.

Alternatively or additionally, processor 2318 in speaker 118-1 executing program instructions may instruct 2320 one or more sensors 2322 in speaker 118-1 to perform measurements to acquire sound 2324 (such sound corresponding to ambient or background noise) in the environment. After receiving the sound measurements 2324, processor 2318 may provide the sound measurements 2324 2324 to interface circuit 2326 in speaker 118-1, which may transmit one or more packets 2328 or frames with information specifying the sound measurements 2324 to interface circuit 2330 in A/V hub 112, which after receiving the one or more packets 2328 may provide the sound measurements 2324 to processor 2310. Note that the sound measurements performed by A/V hub 112 and/or speaker 118-1 may be time stamped so that processor 2310 can associate and/or compare sound measurements 2316 and 2324.

After receiving sound measurements 2316 and/or 2324, processor 2310 may determine a characteristic 2332 of the environment.

Furthermore, based at least in part on the characteristic 2332, processor 2310 may calculate an acoustic radiation pattern 2334. In some embodiments, acoustic radiation pattern 2334 is calculated based at least in part on information 2338 about the environment or the characteristic 2332, which is stored in memory 2336.

Next, processor 2310 may instruct 2340 interface circuit 2330 to provide information 2342 with audio content and information specifying the acoustic radiation pattern 2334 to speaker 118-1 in one or more packets 2344 or frames. After receiving information 2342, interface circuit 2326 may provide this information to processor 2318, which may instruct 2346 one or more acoustic transducers or drivers 2348 to output sound corresponding to the audio content using the acoustic radiation pattern 2334.

Figure 24:
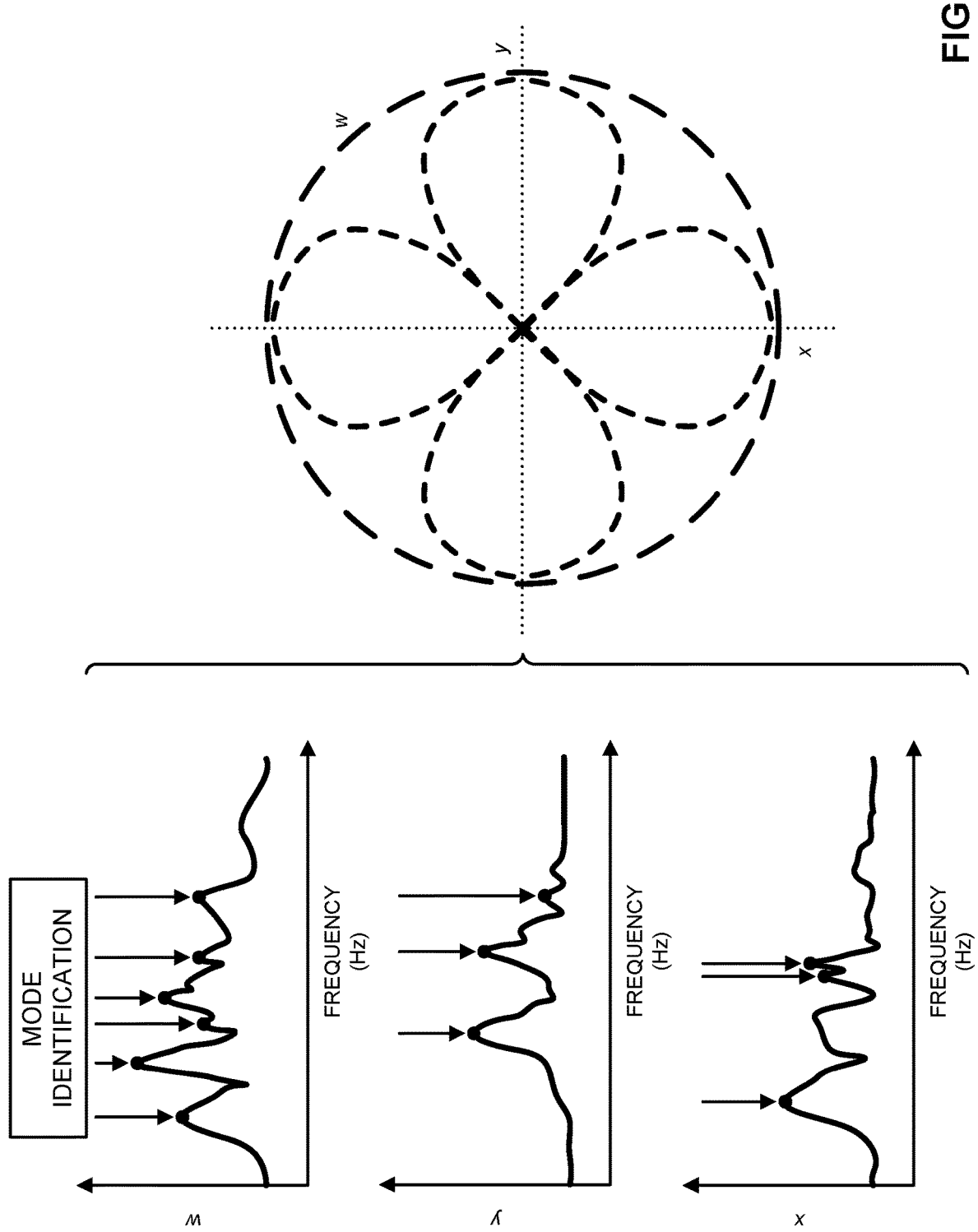
FIG. 24 is a drawing illustrating an example of dynamically adapting sound based at least in part on environmental characterization in accordance with an embodiment of the present disclosure.

FIG. 24 presents a drawing illustrating an example of dynamically adapting sound based at least in part on environmental characterization, such as based at least in part on spatial information determined from ambient or background sound. A/V hub 112 may use a microphone or an array of microphones (such as a beamforming array of microphones) to infer one or more characteristics of an acoustic space, such as the environment. For example, sound measurements may be performed by optionally discretely embedding test tones in reproduced music or by passively monitoring ambient or background noise levels when the speaker is not being used to play music (such as during quiet time intervals during or between songs). By monitoring the acoustic energy in the environment (in particular, by monitoring the acoustic pressures and different velocities, such as along an x, y and/or z axis), one or more acoustic modes (and, more generally, an acoustic modal distribution) at associated frequencies may be identified and/or a physical size of the environment (such as one or more dimensions) may be determined. Note that the coupling of energy between sound output along a particular direction or axis and the sound that is measured along this and other axes may allow the acoustic modes to be determined. Thus, in some embodiments, the adaptation technique involves directional output of the test tones and/or directional measurement of the sound. Consequently, in some embodiments the adaptation technique involves determining acoustic transfer functions along different directions.

For example, a speaker may output one or more test tones (e.g., a log sweep between 0.1-10 kHz or one or more discrete sinusoidal tones between 0.1-10 kHz, and having an amplitude that may be below human hearing perception, such as relative to an amplitude of music that is being played) into a room. The one or more test tones may be masked by the music currently being played. Alternatively, the music being played can be the test signal that is used to acoustically excite the room. In some embodiments, predefined or predetermined spectral content of the music being played is used when determining the characteristic. Furthermore, diffuse acoustic energy is often coupled into a room by weather conditions (such as wind), road noise etc., and this ambient or background noise may be used in the adaptation technique.

Then, a microphone or an array of microphones may listen in different directions for the acoustic response of the room. In this way, the reverberation time of the space or another acoustic characteristic can be determined discretely. Once the environment has been characterized, A/V hub 112 may map or project the identified acoustic modes or energy into corresponding components of a sound field, such as a monopole, a dipole, a quadupole along different axis. For example, there may be dipoles along the x and y axes, and a monopole w that radiates in all directions. The weights of these components may be inverted and used to correct or accordingly adapt an acoustic radiation pattern, so that the sound output by speaker 118-1 uniformly excites the environment.

As noted previously, a listener in the environment may be unaware that the characterization or the adaptation is occurring. Moreover, the sound measurements may be performed over a long period of time, such as minutes, hours, or even days to improve accuracy and to ensure that the measurements are discrete (i.e., without listener awareness). For example, signal analysis of the sound measurements may be at ultralow levels (ambient or background noise levels are typically 40-50 dB). Long discrete Fourier transforms or Fast Fourier Transforms may be used to determine energy levels in the audio band (such as between 0.1-10 kHz). Alternatively or additionally, multiple sound measurements may be averaged or combined over time to determine the characteristic. In some embodiments, incremental values of the characteristic may be determined multiple times using sound measurements over shorter time intervals, and these different instances or incremental values may be averaged or combined to determine the characteristic.

Another embodiment of the adaptation technique performs automatic de-baffling. This is shown in FIG. 25, which presents a flow diagram illustrating an example of a method 2500 for outputting audio content. This technique may be performed by an electronic device (such as one of speakers 118), which may include a set of drivers that output sound.

During operation, the electronic device may acquire information corresponding to a boundary (operation 2510) of an environment, which may include the second electronic device. Note that the electronic device may include a sensor that acquires the information, and acquiring the information may involve performing a measurement using the sensor. For example, the sensor may include an image sensor that acquires an image and/or an acoustic sensor that performs sound measurements when the set of drivers is not outputting the sound.

In some embodiments, the measured sound may correspond to 2D or 3D sound. For example, the sound measurements may be directional, such as sound measurements along one or more directions or axes.

Alternatively or additionally, acquiring the information may involve receiving the information, which is associated with a second electronic device such as A/V hub 112 (e.g., the second electronic device may measure and provide the information). Moreover, acquiring the information may involve the electronic device performing wireless ranging using an interface circuit and at least an antenna. Furthermore, the electronic device may include an acoustic transducer that outputs acoustic signals, and the electronic device may output the acoustic signals using the acoustic transducer and the information may correspond to reflections of the acoustic signals. More generally, embodiments of how the electronic device may acquire the information were described previously with reference to FIG. 4.

Then, based at least in part on the information, the electronic device may determine a location of the boundary (operation 2512), which is proximate to the electronic device.

Moreover, based at least in part on the location, the electronic device may calculate a modified acoustic radiation pattern (operation 2514) of the electronic device, where a superposition of the modification acoustic radiation pattern and acoustic reflections from the boundary approximately matches (such as within 5 or 10%) a target acoustic radiation pattern of the electronic device. Note that the modification may include a change in frequency spectrum of the audio content in a band of frequencies, such as between 40-200 Hz. In some embodiments, the modified acoustic radiation pattern includes a beam having a principal direction. For example, the modification may include a change in the principal direction of the beam. Alternatively or additionally, the modification may include a change in a width of the beam, such as from 0 dBi to 6 dBi.

Next, the electronic device may output, using the modified acoustic radiation pattern, sound (operation 2516) corresponding to audio content from the set of drivers.

While the preceding discussion illustrated method 2200 being performed by the electronic device, in some embodiments a second electronic device (such as A/V hub 112) may perform at least some of the aforementioned operations, either in conjunction with or instead of the electronic device. For example, the second electronic device and/or one or more other electronic devices in the environment may perform measurements of the image and/or the sound.

Figure 26:
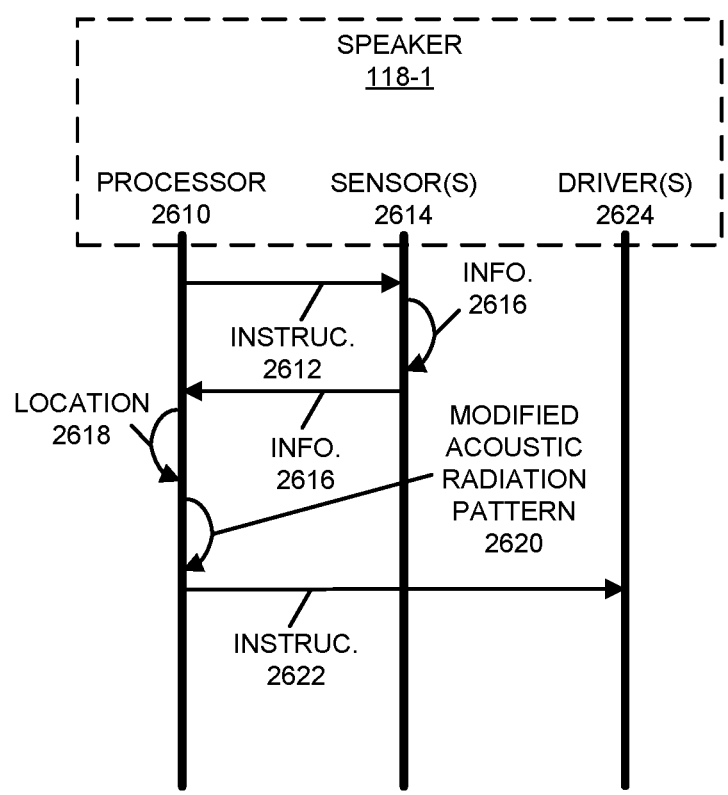
FIG. 26 is a drawing illustrating an example of communication within one of the electronic devices in FIG. 1 in accordance with an embodiment of the present disclosure.

FIG. 26 presents a drawing illustrating an example of communication within speaker 118-1. In particular, processor 2610 in speaker 118-1 executing program instructions may instruct 2612 one or more sensors 2614 in speaker 118-1 to perform measurements to acquire information 2616 (such as one or more images or sound) in an environment. Then, the one or more sensors 2614 may provide the information 2616 to processor 2610.

After receiving information 2616, processor 2610 may determine a location 2618 of a boundary in the environment.

Furthermore, based at least in part on location 2618, processor 2610 may calculate a modified acoustic radiation pattern 2620.

Next, processor 2610 may instruct 2622 one or more acoustic transducers or drivers 2624 to output sound corresponding to audio content using the modified acoustic radiation pattern 2620.

Figure 27:
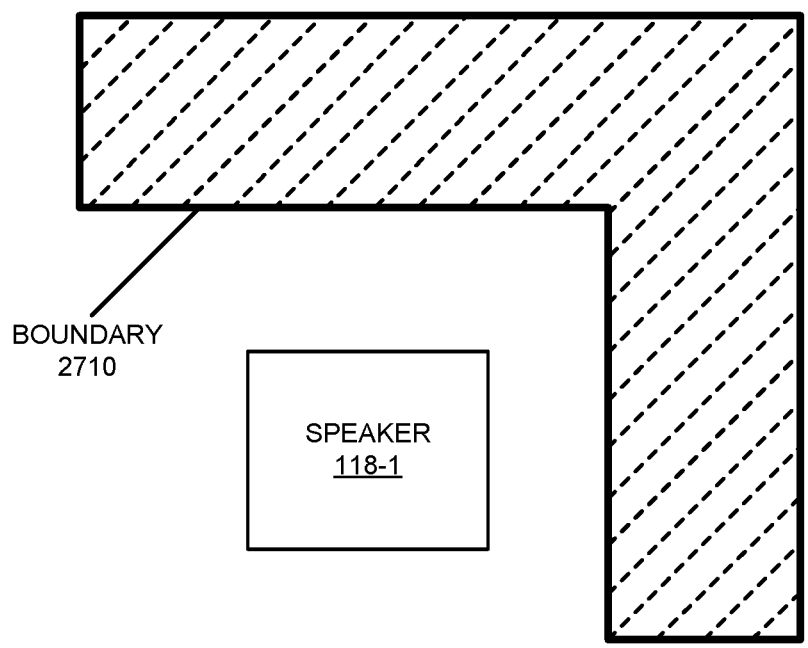
FIG. 27 is a drawing illustrating an example of automatic de-baffling in accordance with an embodiment of the present disclosure.

FIG. 27 presents a drawing illustrating an example of automatic de-baffling. By performing optical or acoustic measurements, an intelligent speaker (such as speaker 118-1) can identify a nearby boundary 2710, such as a wall, a corner in a room, furniture or a window. Then, the speaker may appropriately compensate or correct the spectral balance of output sound from the speaker. For example, the bass output from a speaker may be dependent on its placement near to boundaries, so the perceived balance can significantly changed depending on the physical location of the speaker. In particular, being close to a boundary (such as within 12-18 in) can significantly increase the bass output/efficiency of the speaker. Consequently, by selectively adjusting the output sound when this effect is present, the speaker can provide a consistent 'balance' or 'tone' independent of where it is placed.

For example, the automatic de-baffling can reduce the boundary gain experienced by a listener when a speaker is placed close to either one, two or three walls or large surfaces. The boundary-gain effect typically occurs at low frequencies (such as up to 200 Hz) and the gain can be considerable. In the worst-case scenario, a speaker placed close to a corner in a hard-surfaced room may experience theoretical gains of up to 18 dB (and 6 or 12 dB when placed close to a one or two surfaces). In practice, the boundary gain is often lower, with a maximum of approximately 12 dB.

Note that the boundary gain is typically observed at low frequencies and can cause significant changes in the presentation or balance of any sound being radiated or output by the speaker. By adapting the directivity of the acoustic radiation pattern of the speaker depending on how it has been placed, the boundary gain can be significantly reduced, such as by at least 6 dB. In this way, automatically adjusting the directivity can help make the bass output of the speaker (and, therefore, its perceived balance) more consistent for a listener.

Another embodiment of the adaptation technique dynamically adapts sound based at least in part on content and context. This is shown in FIG. 28, which presents a flow diagram illustrating an example of a method 2800 for calculating an acoustic radiation pattern. This technique may be performed by an electronic device (such as A/V hub 112), which may communicate with a second electronic device (such as one of speakers 118).

During operation, the electronic device may acquire information about an environment (operation 2810), which may include the second electronic device. Note that the electronic device may include a sensor that acquires the information, and acquiring the information may involve performing a measurement using the sensor. For example, the sensor may include an image sensor and/or an acoustic sensor. Alternatively or additionally, acquiring the information may involve receiving the information, which is associated with the second electronic device (e.g., the second electronic device may measure and provide the information). Moreover, acquiring the information may involve the electronic device performing wireless ranging using an interface circuit and at least an antenna. Furthermore, the electronic device may include an acoustic transducer that outputs acoustic signals, and the electronic device may output the acoustic signals using the acoustic transducer and the information may correspond to reflections of the acoustic signals. More generally, embodiments of how the electronic device may acquire the information were described previously with reference to FIG. 4.

Then, based at least in part on the information, the electronic device may determine a context (operation 2812) associated with the environment. For example, the context may include a number of individuals in the environment. Alternatively or additionally, the context may be associated with a type of lighting in the environment, such as bright lighting, dim lighting, sun light, candle light, or artificial light (e.g., an LED or fluorescent lighting). In some embodiments, the context may include at least: a time of day, and/or a location of the environment. Note that the context may be based at least in part on: listening behavior of an individual, and/or predefined listening preferences of an individual. Thus, the context may depend on or may be associated with information about one or more individuals in the environment. Consequently, in some embodiments determining the context may involve accessing predetermined context information associated with an individual, which may be stored in memory.

Moreover, based at least in part on the determined context and a characteristic of audio content, the electronic device may calculate an acoustic radiation pattern (operation 2814).

Furthermore, the acoustic radiation pattern may include a beam having a principal direction, where a width of the acoustic radiation pattern may be based at least in part on at least: the characteristic, and/or the context. For example, the width of the acoustic radiation pattern may be narrower when the characteristic includes ambience. Alternatively or additionally, the width of the acoustic radiation pattern may be narrower when the context is associated with an intimate listening experience, such as when there is one listener, when the listeners are on a date, or when the music is romantic.

Next, the electronic device may provide the audio content and second information specifying the acoustic radiation pattern (operation 2816) for the second electronic device. The second electronic device may optionally output sound corresponding to the audio content using the acoustic radiation pattern.

In some embodiments, the electronic device optionally performs one or more additional operations (operation 2818). For example, the electronic device may determine the characteristic of the audio content. In some embodiments, the determination of the characteristic may involve performing spectral analysis of a Fourier transform of the audio content, and comparing the spectral content with a predefined or predetermined look-up table or data structure of spectral content and associated types of music. Alternatively or additionally, the electronic device may access the characteristic in memory (therefore, the characteristic may be predefined or predetermined). Moreover, the characteristic may include a type of music, metadata associated with the music, descriptive adjectives associated with the music, etc.

While the preceding discussion illustrated method 2800 being performed by the electronic device, in some embodiments the second electronic device may perform at least some of the aforementioned operations, either in conjunction with or instead of the electronic device. For example, the second electronic device and/or one or more other electronic devices in the environment may perform measurements of the information.

Figure 29:
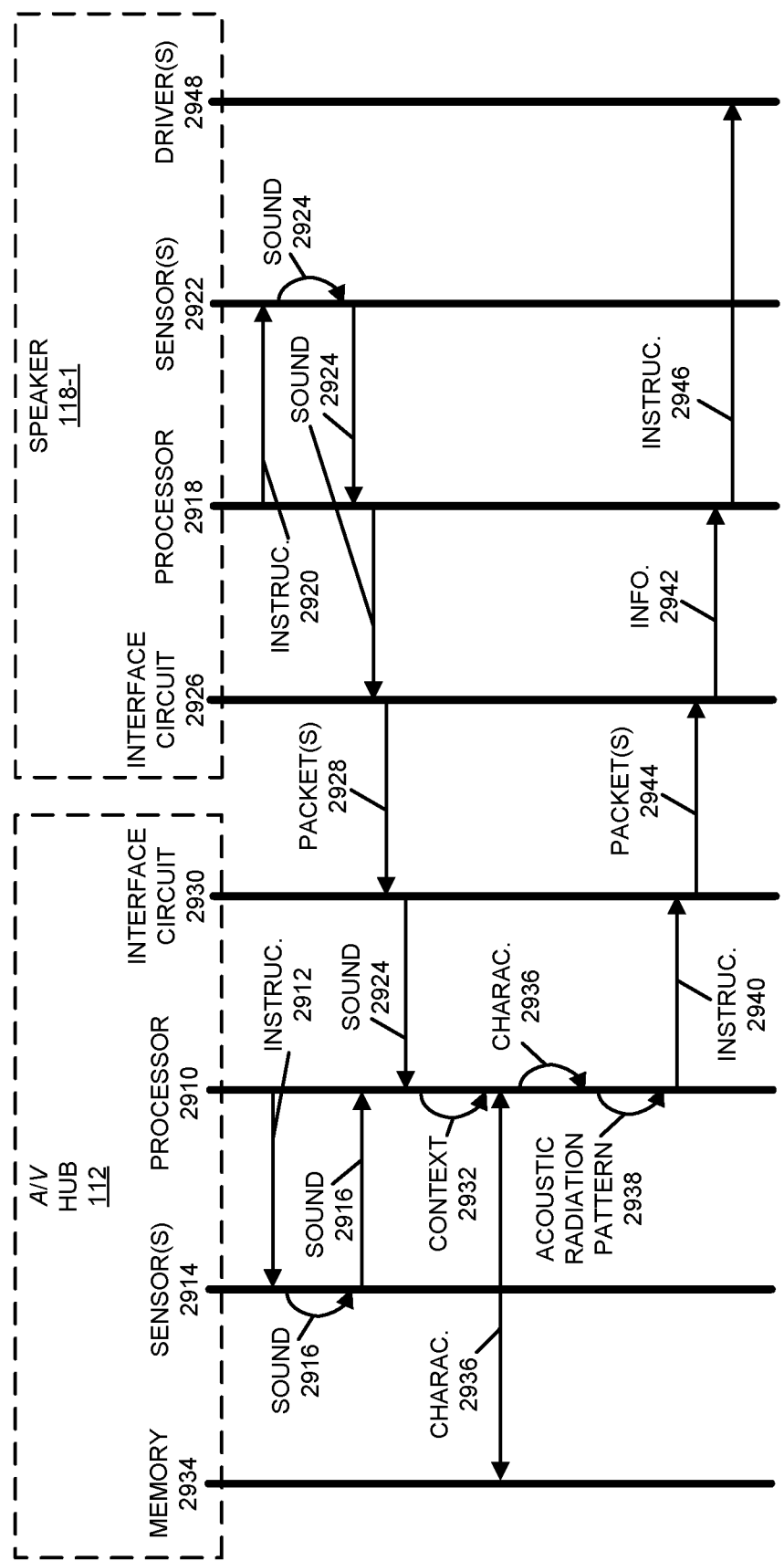
FIG. 29 is a drawing illustrating an example of communication among the electronic devices in FIG. 1 in accordance with an embodiment of the present disclosure.

FIG. 29 presents a drawing illustrating an example of communication between A/V hub 112 and speaker 118-1. In particular, processor 2910 in A/V hub 112 executing program instructions may instruct 2912 one or more sensors 2914 in A/V hub 112 to perform measurements to acquire information 2916 (such as one or more images or sounds) about an environment. Then, the one or more sensors 2914 may provide information 2916 to processor 2910.

Alternatively or additionally, processor 2918 in speaker 118-1 executing program instructions may instruct 2920 one or more sensors 2922 in speaker 118-1 to perform measurements to acquire information 2924 (such as one or more additional images or sounds) about the environment. After receiving information 2924, processor 2918 may provide information 2924 to interface circuit 2926 in speaker 118-1, which may transmit one or more packets 2928 or frames with information 2924 to interface circuit 2930 in A/V hub 112, which after receiving the one or more packets 2928 may provide information 2924 to processor 2910. Note that the measurements performed by A/V hub 112 and/or speaker 118-1 may be time stamped so that processor 2910 can associate and/or compare information 2916 and 2924.

After receiving information 2916 and/or 2924, processor 2910 may determine a context 2932 associated with the environment.

Furthermore, based at least in part on the determined context 2932 and a characteristic 2936 of audio content, processor 2910 may calculate an acoustic radiation pattern 2938. For example, characteristic 2936 may be stored in memory 2934 and/or may be determined by processor 2910.

Next, processor 2910 may instruct 2940 interface circuit 2930 to provide information 2942 with audio content and information specifying the acoustic radiation pattern 2938 to speaker 118-1 in one or more packets 2944 or frames. After receiving information 2942, interface circuit 2926 may provide this information to processor 2918, which may instruct 2946 one or more acoustic transducers or drivers 2948 to output sound corresponding to the audio content using the acoustic radiation pattern 2938.

Figure 30:
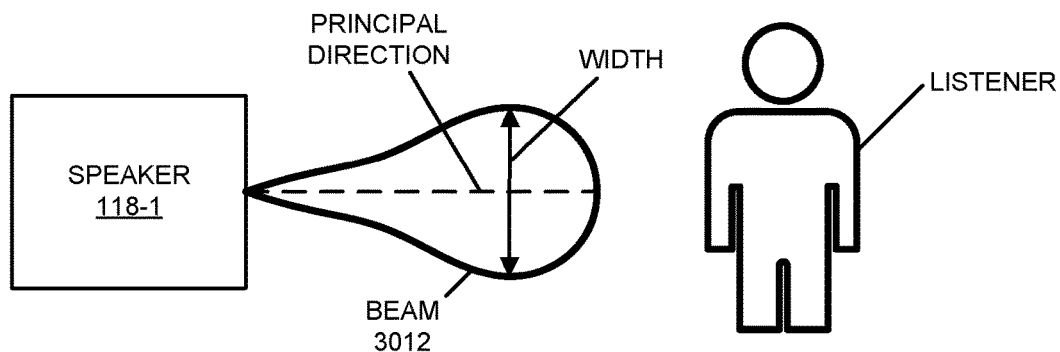
FIG. 30 is a drawing illustrating an example of dynamically adapting sound based at least in part on content and context in accordance with an embodiment of the present disclosure.
Figure 30:
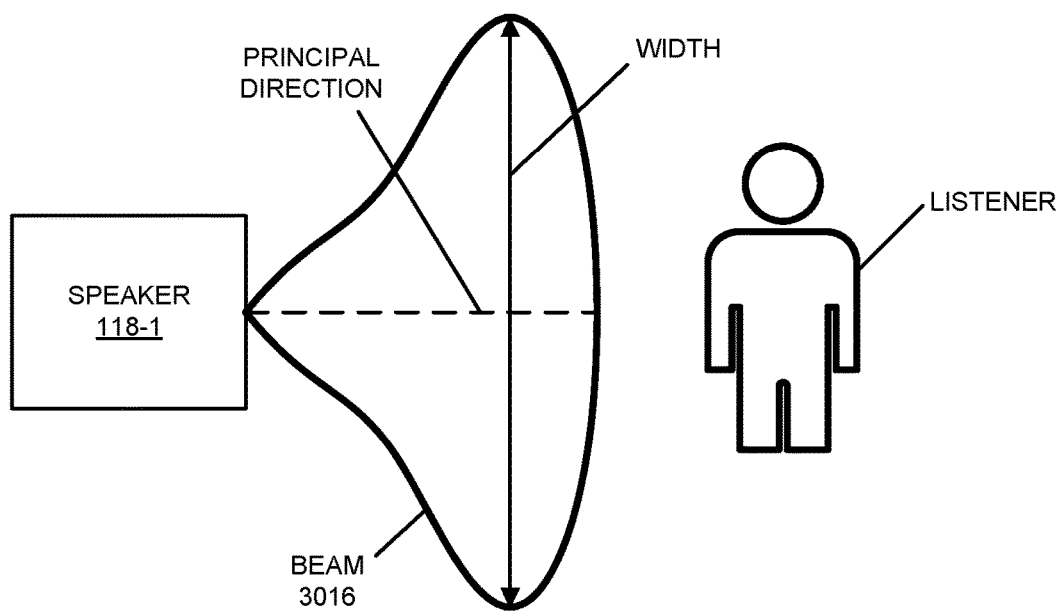

FIG. 30 presents a drawing illustrating an example of dynamically adapting sound based at least in part on content and context. A/V hub 112 may analyze the environment and may categorize a musical input stream to determine how best to output or radiate this sound into an environment or to a particular listener or a group of listeners. For example, for context and characteristic 3010 (such as an intimate listening experience), speaker 118-1 may use acoustic radiation pattern having beam 3012. Then, for context and characteristic 3014 (such as a 'big sound' listening experience), speaker 118-1 may use acoustic radiation pattern having beam 3016.

Note that the context and the characteristic of the audio content may include: quality, spatial content and/or relevance to a neighboring networked speaker that is radiating other channels in a multichannel stream (such as stereo or 5.1 surround sound). For example, A/V hub 112 may calculate an acoustic radiation pattern that outputs sound at appropriate angles and widths for the various discrete channels of a multichannel stream. Alternatively or additionally, A/V hub 112 may extract ambience from two or more discrete channels, may synthesize ambience and/or may use a blind-source separation technique to create multiple audio channels from a single mono channel.

In some embodiments, A/V hub 112 may categorize or characterize the audio content using one or more techniques in different frequency bands. For example, A/V hub 112 may compare the difference between channels in a stereo or multichannel stream. Using this analysis, A/V hub 112 may determine the quality of music, the spaciousness or spatial information available in music, and/or a type of music or a music category.

Furthermore, A/V hub 112 may use dynamically modify the acoustic experience based at least in part on the content and the context of a listening scenario. For example, the acoustic radiation pattern may be calculated based at least in part on a particular listener's preferences, a music type or genre, or when music is being played back at different times of day or days of the week.

Figure 31:
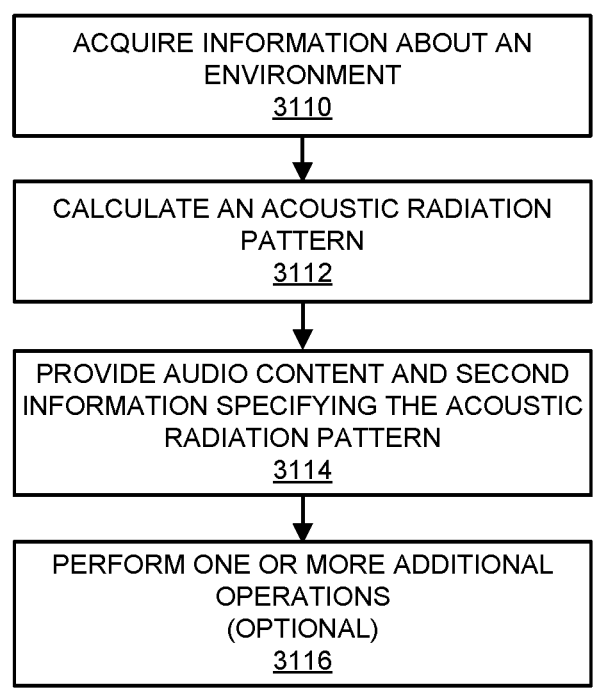
FIG. 31 is a flow diagram illustrating an example of a method for calculating an acoustic radiation pattern in accordance with an embodiment of the present disclosure.

Another embodiment of the adaptation technique performs active room shaping and/or noise control. This is shown in FIG. 31, which presents a flow diagram illustrating an example of a method 3100 for calculating an acoustic radiation pattern. This technique may be performed by an electronic device (such as A/V hub 112), which may communicate with a second electronic device (such as one of speakers 118) and a third electronic device (such as another one of speakers 118).

During operation, the electronic device may acquire information about an environment (operation 3110), which may include the second electronic device and the third electronic device. Note that the electronic device may include a sensor that acquires the information, and acquiring the information may involve performing a measurement using the sensor. For example, the sensor may include an image sensor and/or an acoustic sensor. Alternatively or additionally, acquiring the information may involve receiving the information, which is associated with the second electronic device and/or the third electronic device (e.g., the second electronic device and/or the third electronic device may measure and provide the information). Moreover, acquiring the information may involve the electronic device performing wireless ranging using an interface circuit and at least an antenna. Furthermore, the electronic device may include an acoustic transducer that outputs acoustic signals, and the electronic device may output the acoustic signals using the acoustic transducer and the information may correspond to reflections of the acoustic signals. More generally, embodiments of how the electronic device may acquire the information were described previously with reference to FIG. 4.

Then, based at least in part on audio content (such as audio content that is to be output by the second electronic device and the third electronic device), locations of the second electronic device and the third electronic device and a location of a boundary of the environment, the electronic device may calculate acoustic radiation patterns (operations 3112) of the second electronic device and the third electronic device, where the acoustic radiation patterns selectively modify a reverberation characteristic of the environment (such as a reverberation time). For example, the boundary includes a wall of a room, and the selective modification may at least partially cancel acoustic reflections from the boundary, which may make it seem, at least acoustically, that the wall is not present. In some embodiments, the modification is based at least in part on: a type of the audio content, and/or a context associated with the environment. Note that at least one of the location of the second electronic device, the location of the third electronic device, or the location of the boundary may be specified by the information.

Next, the electronic device may provide the audio content and second information specifying the acoustic radiation patterns (operations 3114) for the second electronic device and the third electronic device. The second electronic device and the third electronic device may optionally output sound corresponding to the audio content using the acoustic radiation patterns.

In some embodiments, the electronic device optionally performs one or more additional operations (operation 3116). For example, the electronic device may determine the reverberation characteristic, and the modification may reduce changes in the reverberation characteristic relative to a target reverberation characteristic. Note that the target reverberation characteristic may include: a predetermined reverberation characteristic of the environment, or a reverberation characteristic associated with an individual (such as a preferred reverberation time of the individual).

Moreover, based at least in part on the information, the electronic device may determine changes in a characteristic associated with the environment. For example, the changes may be associated with at least: changing a state of a window, changing a state of a window covering, changing a state of a door, changing a number of individuals in the environment, and/or changing a position of a piece of furniture in the environment.

Furthermore, the electronic device may determine, based at least on the information, at least one of the location of the second electronic device, the location of the third electronic device, or the location of the boundary. In some embodiments, one or more of the location of the second electronic device, the location of the third electronic device, or the location of the boundary is predefined or predetermined.

Note that the locations of the second electronic device and the third electronic device may be proximate to opposite ends of a room, which is defined at least in part by the boundary.

While the preceding discussion illustrated method 3100 being performed by the electronic device, in some embodiments the second electronic device and/or the third electronic device may perform at least some of the aforementioned operations, either in conjunction with or instead of the electronic device. For example, the second electronic device and/or the third electronic device in the environment may perform measurements of the information.

Figure 32:
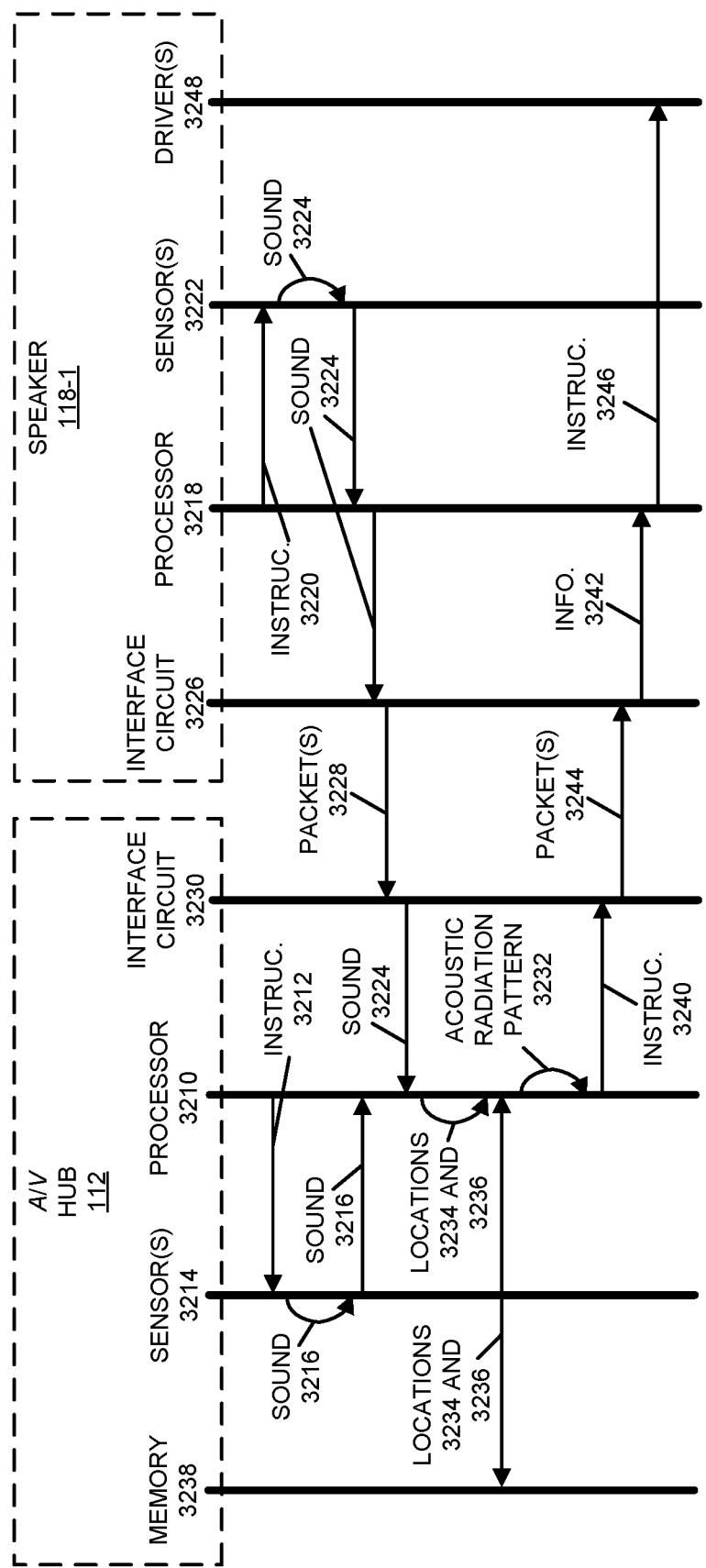
FIG. 32 is a drawing illustrating an example of communication among the electronic devices in FIG. 1 in accordance with an embodiment of the present disclosure.

FIG. 32 presents a drawing illustrating an example of communication among A/V hub 112 and speakers 118-1 and 118-2 (not shown). In particular, processor 3210 in A/V hub 112 executing program instructions may instruct 3212 one or more sensors 3214 in A/V hub 112 to perform measurements to acquire information 3216 (such as one or more images or sounds) about an environment. Then, the one or more sensors 3214 may provide information 3216 to processor 3210.

Alternatively or additionally, processor 3218 in speaker 118-1 executing program instructions may instruct 3220 one or more sensors 3222 in speaker 118-1 to perform measurements to acquire information 3224 (such as one or more additional images or sounds) about the environment. After receiving information 3224, processor 3218 may provide information 3224 to interface circuit 3226 in speaker 118-1, which may transmit one or more packets 3228 or frames with information 3224 to interface circuit 3230 in A/V hub 112, which after receiving the one or more packets 3228 may provide information 3224 to processor 3210. Note that the measurements performed by A/V hub 112 and/or speaker 118-1 may be time stamped so that processor 3210 can associate and/or compare information 3216 and 3224.

In some embodiments, in addition to or instead of speaker 118-1, speaker 118-2 (not shown) may acquire information (such as one or more additional images or sounds), which are then provided to A/V hub 112.

After receiving information 3216 and/or 3224, processor 3210 may calculate acoustic radiation patterns 3232 for speakers 118-1 and 118-2, where the acoustic radiation patterns 3232 selectively modify a reverberation characteristic of the environment. This calculation may be based at least in part on audio content, locations 3234 of speakers 118-1 and 118-2 and a location 3236 of a boundary in the environment. Note that at least one of location 3234-1 of speaker 118-1, location 3234-2 of speaker 118-2, or location 3236 of the boundary may be specified by the information. For example, processor 3210 may determine locations 3234 and/or 3236 based at least in part on information 3216 and/or 3224. Alternatively or additionally, one or more of location 3234-1 of speaker 118-1, location 3234-2 of speaker 118-2, or location 3236 of the boundary may be predefined or predetermined, and may be stored in memory 3238.

Next, processor 3210 may instruct 3240 interface circuit 3230 to provide information 3242 with the audio content and information specifying the acoustic radiation patterns 3232 to speakers 118-1 and 118-2 in one or more packets 3244 or frames. After receiving information 3242, interface circuit 3226 may provide this information to processor 3218, which may instruct 3246 one or more acoustic transducers or drivers 3248 to output sound corresponding to the audio content using the acoustic radiation pattern 3232. Note that speaker 118-2 (not shown) may perform similar operations after receiving information 3242.

Figure 33:
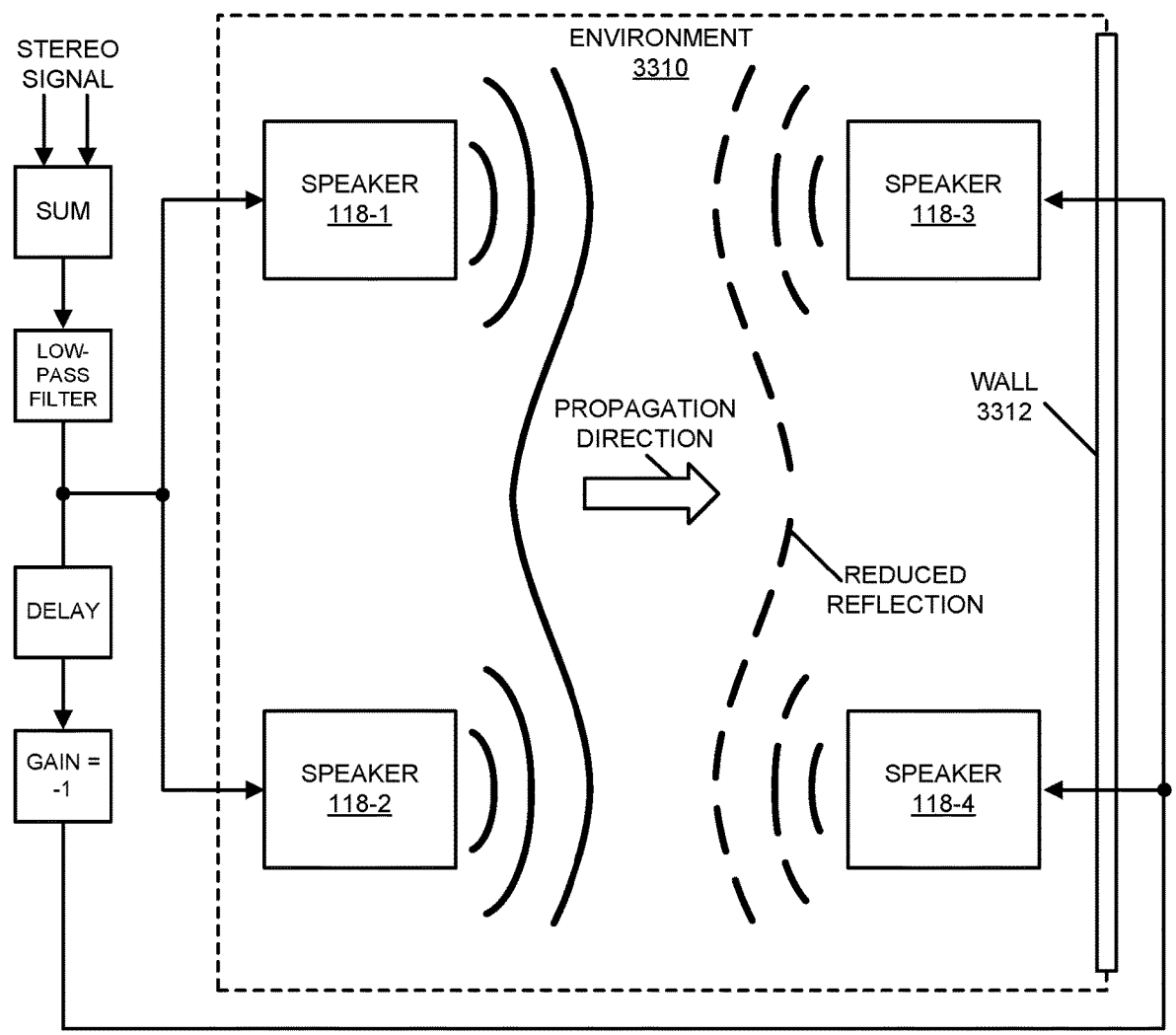
FIG. 33 is a drawing illustrating an example of active room shaping and/or noise control in accordance with an embodiment of the present disclosure.

FIG. 33 presents a drawing illustrating an example of active room shaping and/or noise control. Using more than one networked and spatially adaptive speaker (such as speakers 118), the acoustic properties of an environment 3310 may be changed. In some embodiments, the speakers have access to each other's audio streams or content, metadata that specifies modes of operation and/or measurements about or of the environment.

For example, two adaptive speakers can work together to negate the response of one or more boundaries or surfaces, such as one or more walls of the environment (such as wall 3312). Thus, the two speakers may effectively work as acoustic absorbers of reflections from the one or more boundaries. In particular, a first speaker may reduce or cancel the reflections from a proximate first boundary that are associated with the sound output by a second speaker, and the second speaker may reduce or cancel the reflections from a proximate second boundary that are associated with the sound output by the first speaker. In this way, each of the speakers may cancel out or, effectively, absorb some of the acoustic energy from the opposing speaker(s) so that reflections associated with a proximate boundary are reduced or eliminated. In some embodiments, there may be up to four speakers, which can change the modal response of a room. In this way, A/V hub 112 and two or more speakers 118 can change the perceived 'closeness' or acoustic size of a room. Consequently, a room can be made to appear larger than it is or so that it supports less resonant energy.

More generally, the adaptation technique may allow A/V hub 112 and one or more speakers 118 to modify a sound field in an environment. For example, a single speaker may use pressure feedback to force its local pressure to approximately zero, or to linearize and control its own pressure response to a prescribed level. In this mode the speaker may function as an acoustic absorber to external sounds/acoustic energy, or it may normalize its own power output into a room in a time-dependent manner.

When more than one speaker is used in an environment, the location and knowledge of the other speaker(s) output(s) can be used. For example, at low frequencies (such as less than 200 Hz) in most listening spaces the first couple of acoustic room modes can be driven, or considered to be, plane waves. As more speakers are used in the listening space, the frequency below which the acoustic room modes are considered to be plane waves increases. At frequencies where the acoustic room modes are considered to be plane waves, opposing speakers in the listening space can be used to reduce or cancel out reflections from one or more boundaries or walls. A listener may perceive the net effect as equivalent to the walls being removed from the listening space.

Figure 34:
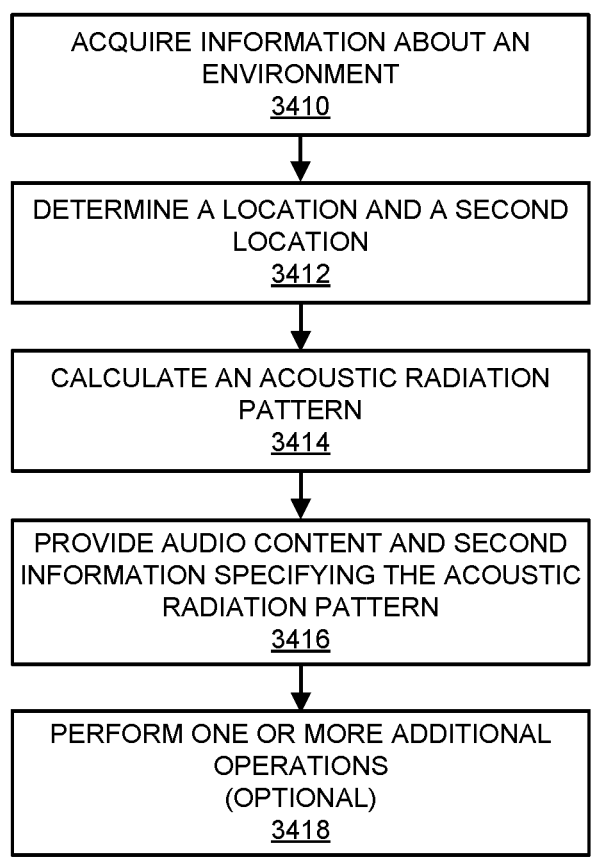
FIG. 34 is a flow diagram illustrating an example of a method for calculating an acoustic radiation pattern in accordance with an embodiment of the present disclosure.

Another embodiment of the adaptation technique performs dynamic cross-talk cancellation. This is shown in FIG. 34, which presents a flow diagram illustrating an example of a method 3400 for calculating an acoustic radiation pattern. This technique may be performed by an electronic device (such as A/V hub 112), which may communicate with a second electronic device (such as one of speakers 118).

During operation, the electronic device may acquire information about an environment (operation 3410), which may include the second electronic device. Note that the electronic device may include a sensor that acquires the information, and acquiring the information may involve performing a measurement using the sensor. For example, the sensor may include an image sensor that acquires one or more images and/or an acoustic sensor that measures sound. Note that the measured sound may specify 2D or 3D sound. Alternatively or additionally, acquiring the information may involve receiving the information, which is associated with the second electronic device (e.g., the second electronic device may measure and provide the information). Moreover, acquiring the information may involve the electronic device performing wireless ranging using an interface circuit and at least an antenna. Furthermore, the electronic device may include an acoustic transducer that outputs acoustic signals, and the electronic device may output the acoustic signals using the acoustic transducer and the information may correspond to reflections of the acoustic signals. More generally, embodiments of how the electronic device may acquire the information were described previously with reference to FIG. 4.

Then, based at least in part on the information, the electronic device may determine a location of an individual and a second location of a second individual (operation 3412) in the environment.

Moreover, based at least in part on the location and the second location, the electronic device may calculate an acoustic radiation pattern (operation 3414) of the second electronic device, where the acoustic radiation pattern may include a beam having a principal direction and an exclusion zone in which an intensity of output sound is reduced below a threshold value. Furthermore, the principal direction may be approximately directed towards the location and the second location is included in the exclusion zone. Additionally, the exclusion zone may be based at least in part on a predefined preference of the second individual.

Next, the electronic device may provide audio content and second information specifying the acoustic radiation pattern (operation 3416) for the second electronic device. The second electronic device may optionally output sound corresponding to the audio content using the acoustic radiation pattern.

In some embodiments, the electronic device optionally performs one or more additional operations (operation 3418). For example, the electronic device may dynamically steer the principal direction towards the location of the individual while keeping the second location of the second individual in the exclusion zone by performing, as a function of time, the aforementioned operations.

While the preceding discussion illustrated method 3400 being performed by the electronic device, in some embodiments the second electronic device may perform at least some of the aforementioned operations, either in conjunction with or instead of the electronic device. For example, the second electronic device and/or one or more other electronic devices in the environment may perform measurements of the information.

Figure 35:
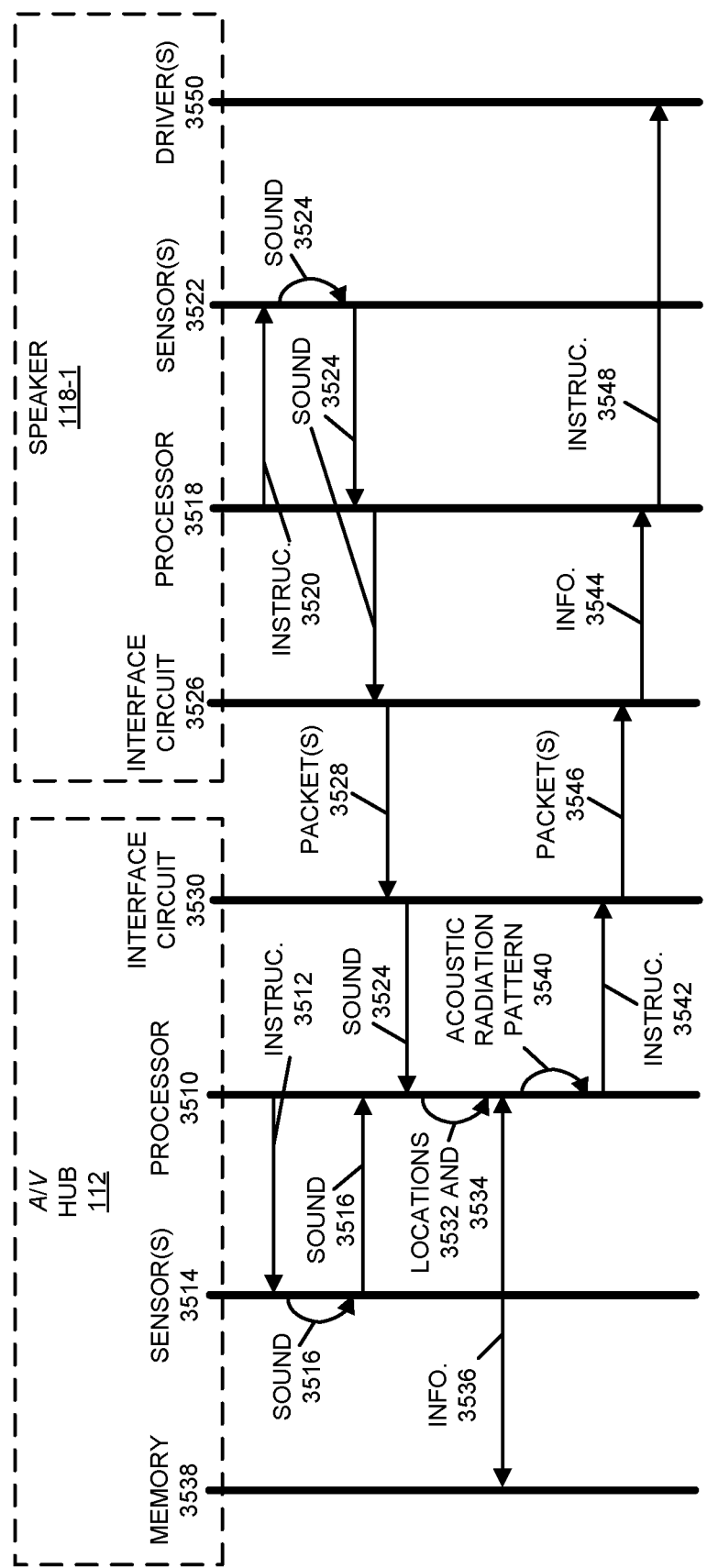
FIG. 35 is a drawing illustrating an example of communication among the electronic devices in FIG. 1 in accordance with an embodiment of the present disclosure.

FIG. 35 presents a drawing illustrating an example of communication among A/V hub 112 and speaker 118-1. In particular, processor 3510 in A/V hub 112 executing program instructions may instruct 3512 one or more sensors 3514 in A/V hub 112 to perform measurements to acquire information 3516 (such as one or more images or sounds) about an environment. Then, the one or more sensors 3514 may provide information 3516 to processor 3510.

Alternatively or additionally, processor 3518 in speaker 118-1 executing program instructions may instruct 3520 one or more sensors 3522 in speaker 118-1 to perform measurements to acquire information 3524 (such as one or more additional images or sounds) about the environment. After receiving information 3524, processor 3518 may provide information 3524 to interface circuit 3526 in speaker 118-1, which may transmit one or more packets 3528 or frames with information 3524 to interface circuit 3530 in A/V hub 112, which after receiving the one or more packets 3528 may provide information 3524 to processor 3510. Note that the measurements performed by A/V hub 112 and/or speaker 118-1 may be time stamped so that processor 3510 can associate and/or compare information 3516 and 3524.

After receiving information 3516 and/or 3524, processor 3510 may determine a location 3532 of an individual and a second location 3534 of a second individual in the environment. In some embodiments, locations 3532 and/or 3534 are determined using predefined or predetermined information 3536, which is stored in memory 3538.

Moreover, based at least in part on location 3532 and the second location 3534, processor 3510 may calculate an acoustic radiation pattern 3540 of the second electronic device.

Next, processor 3510 may instruct 3542 interface circuit 3530 to provide information 3544 with the audio content and information specifying the acoustic radiation pattern 3540 to speaker 118-1 in one or more packets 3546 or frames. After receiving information 3544, interface circuit 3526 may provide this information to processor 3518, which may instruct 3548 one or more acoustic transducers or drivers 3550 to output sound corresponding to the audio content using the acoustic radiation pattern 3540.

Figure 36:
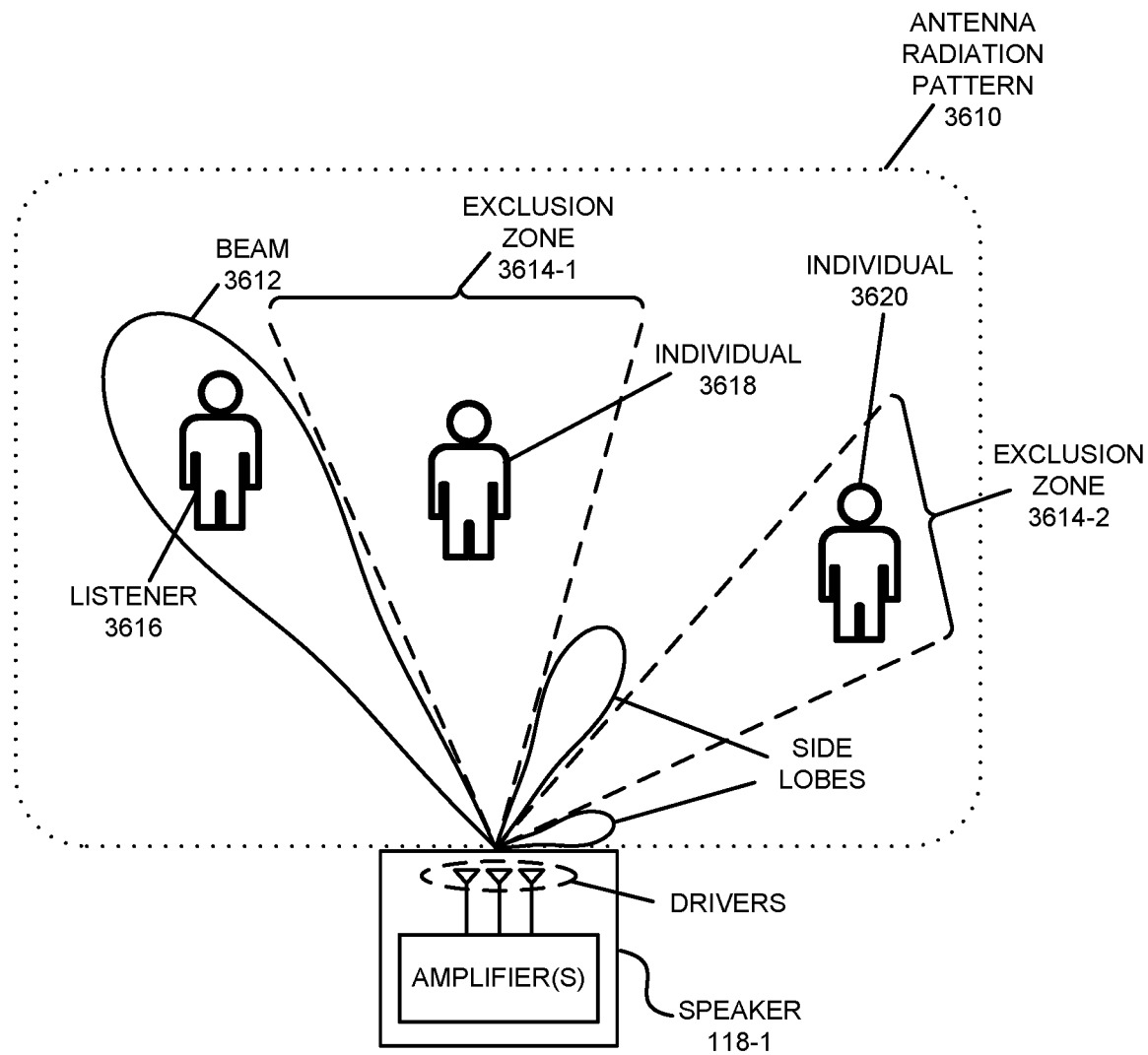
FIG. 36 is a drawing illustrating an example of dynamic cross-talk cancellation in accordance with an embodiment of the present disclosure.

FIG. 36 presents a drawing illustrating an example of dynamic cross-talk cancellation. In particular, acoustic radiation pattern 3610 may include a beam 3612 having a principal direction and one or more intended exclusion zones 3614 in which an intensity of output sound is reduced below a threshold value (e.g., taking into account auditory masking, the cross-talk between the zones may be reduced below at least 20-30 dB). Furthermore, the principal direction may be approximately directed towards location of an individual (such as listener 3616) and a location of an individual 3618 may be included in the exclusion zone 3614-1 and/or a location of an individual 3620 may be included in the exclusion zone 3614-2. Note that the exclusion zone(s) 3614 may be based at least in part on a predefined preference of the second individual and/or a predefined preference of the third individual. For example, the predefined preference of the second individual may specify how much (if any) cross-talk the second individual is willing to hear or experience.

In some embodiments, by using one or more adaptive speakers and tracking the location of one or more listeners, it may be possible to present 3D sound with a prescribed control. For example, such speakers can potentially beam sound in a defined direction while also ensuring that there is an associated null of energy in another specific direction.

While the preceding discussion illustrated the use of the adaptation technique to provide the beam to one listener and the null to another listener, in other embodiments the adaptation technique is used to beam sound (and a dedicated audio channel) from a first speaker to a first ear of the listener and to ensure that their second ear is at a null of the first speaker. Similarly, a second speaker may beam sound (and another channel) to the second ear of the listener and to ensure that their first ear is at a null of the second speaker. Consequently, the adaptation technique may be used to beam two channels of information directly to the listener's ears without them wearing headphones and maintaining reduced (or, ideally, approximately zero) cross-talk between these channels. Note that the two channels of audio may be preprocessed using head-related transfer functions (HRTFs) in order to simulate 3D audio. Therefore, the adaptation technique may be used to provide an extended version of binaural audio.

In some embodiments, the amount of cross-talk reduction or attenuation needed for headphone-free listening by a listener to audio content output by one or more remote adaptive speakers may be at least 10 dB. This may be achieved using an array of drivers, such as at least 20 drivers.

Figure 37:
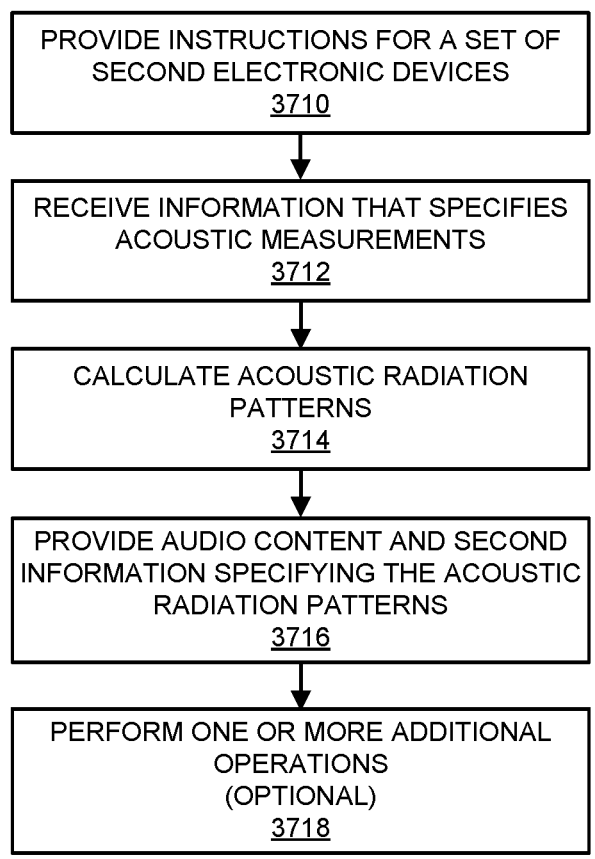
FIG. 37 is a flow diagram illustrating an example of a method for calculating at least an acoustic radiation pattern in accordance with an embodiment of the present disclosure.

Another embodiment of the adaptation technique facilitates or participates in self-configuration of a group of speakers. This is shown in FIG. 37, which presents a flow diagram illustrating an example of a method 3700 for calculating at least an acoustic radiation pattern. This technique may be performed by an electronic device (such as A/V hub 112), which may communicate with a set of second electronic device (such as one or more of speakers 118).

During operation, the electronic device may provide instructions for the set of second electronic devices (operation 3710) to perform round-robin measurements in which, iteratively, each of the set of second electronic devices outputs sound while a remainder of the set of second electronic devices perform acoustic measurements.

Then, the electronic device may receive information that specifies the acoustic measurements (operation 3712) associated with the set of second electronic devices.

Based at least in part on locations of the set of second electronic devices (which may be predefined or predetermined, or which may be included in the information received from the set of second electronic devices) and the acoustic measurements, the electronic device may calculate acoustic radiation patterns (operation 3714) of the set of second electronic devices, where a given acoustic radiation pattern includes a beam having a principal direction.

Next, the electronic device provides audio content and second information specifying the acoustic radiation patterns (operation 3716) for the set of second electronic devices. The set of second electronic devices may optionally output sound corresponding to the audio content using the acoustic radiation patterns.

In some embodiments, the electronic device optionally performs one or more additional operations (operation 3718). For example, the sound output by a given second electronic device in the set of second electronic devices may include third information that specifies the given second electronic device. Moreover, the sound output by the given second electronic device may include a tone at a particular frequency or a particular pattern that identifies the given second electronic device, and different second electronic devices may be assigned and/or may use different tones or patterns. Alternatively, the tone or pattern may be the same and it may be associated with the given second electronic device at a particular time, such as a time slot when the given second electronic device is outputting sound. Note that the tone or pattern may include a log sweep between 0.1-10 kHz or one or more discrete sinusoidal tones between 0.1-10 kHz. In some embodiments, the sound output by the set of second electronic devices includes a particular song or music that has a predefined or predetermined spectral content.

Moreover, prior to a given second electronic device outputting the sound in the round-robin measurements, the electronic device may receive third information that specifies the given second electronic device. In some embodiments, the instructions may specify a predefined order of the set of second electronic devices in which the set of second electronic devices output the sound in the round-robin measurements. Alternatively or additionally, the instructions may specify time slots in which the set of second electronic devices output the sound in the round-robin measurements.

While the preceding discussion illustrated method 3700 being performed by the electronic device, in some embodiments one or more of the set of second electronic device may perform at least some of the aforementioned operations, either in conjunction with or instead of the electronic device.

Moreover, while the preceding discussion illustrates the speakers 118 outputting sound sequentially and separately, in some embodiments speakers 118 concurrently output sounds that can be uniquely associated with speakers 118.

Figure 38:
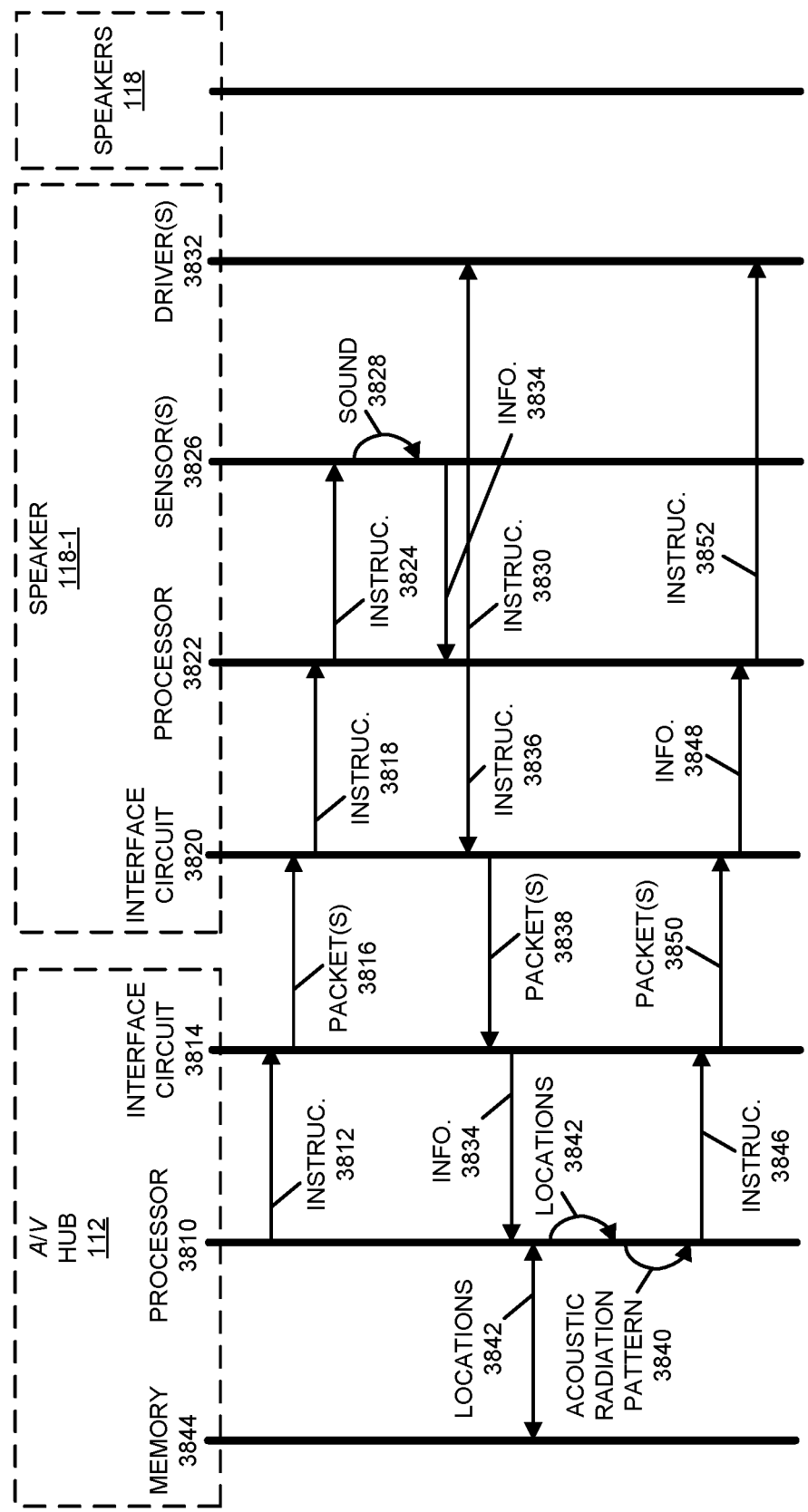
FIG. 38 is a drawing illustrating an example of communication among the electronic devices in FIG. 1 in accordance with an embodiment of the present disclosure.

FIG. 38 presents a drawing illustrating an example of communication among A/V hub 112 and speakers 118 (which, in this example, are the set of second electronic devices). In FIG. 38, speaker 118-1 is used to illustrate a given one of speakers 118. In particular, processor 3810 in A/V hub 112 executing program instructions may instruct 3812 interface circuit 3814 to transmit one or more packets 3816 or frames to speakers 118. The one or more packets 3816 may include instructions 3818 that speakers 118 are to perform round-robin measurements in which, iteratively, each of speakers 118 outputs sound while a remainder of speakers 118 perform acoustic measurements.

After receiving the one or more packets 3816, interface circuit 3820 in speaker 118-1 may provide instructions 3818 to processor 3822 in speaker 118-1. Processor 3822 may execute program instructions. Based at least in part on instructions 3818, processor 3822 may instruct 3824 one or more acoustic sensors 3826 in speaker 118-1 to perform acoustic measurements of sound 3828, which are provided to processor 3822. These acoustic measurements may correspond to sound output from a remainder of speakers 118. Moreover, at an appropriate time (such as a time specified in instructions 3818 or a time that is determined based at least in part by ad-hoc communication/negotiation among speakers 118), processor 3822 may instruct 3830 one or more acoustic transducers or drivers 3832 to output sound, which is measured by the remainder of speakers 118. Note that, at appropriate times, the remainder of speakers 118 may perform similar operations in response to receiving the one or more packets 3816.

After receiving information 3834 that specifies sound measurements 3828, processor 3822 may provide instructions 3836 to interface circuit 3820 in speaker 118-1 to transmit one or more packets 3838 or frames with information 3834 to interface circuit 3814 in A/V hub 112, which after receiving the one or more packets 3838 may provide information 3834 to processor 3810. Note that the acoustic measurements performed by speaker 118 may be time stamped or may include identifiers of speakers 118, so that processor 3810 can associate particular acoustic measurements with a corresponding one of speakers 118 that was outputting sound.

Then, processor 3810 may calculate acoustic radiation patterns 3840 of speakers 118 based at least in part on locations 3842 of speakers 118. Note that locations 3842 may be predefined or predetermined. Moreover, locations 3842 may be stored in memory 3844 in A/V hub 112. Alternatively or additionally, locations 3842 may be included in the one or more packets 3838.

Next, processor 3810 may instruct 3846 interface circuit 3814 to provide information 3848 with the audio content and information specifying the acoustic radiation patterns 3840 to speakers 118 in one or more packets 3850 or frames. After receiving information 3848, interface circuit 3820 may provide this information to processor 3822, which may instruct 3852 one or more acoustic transducers or drivers 3832 to output sound corresponding to the audio content using the acoustic radiation pattern 3840.

Figure 39:
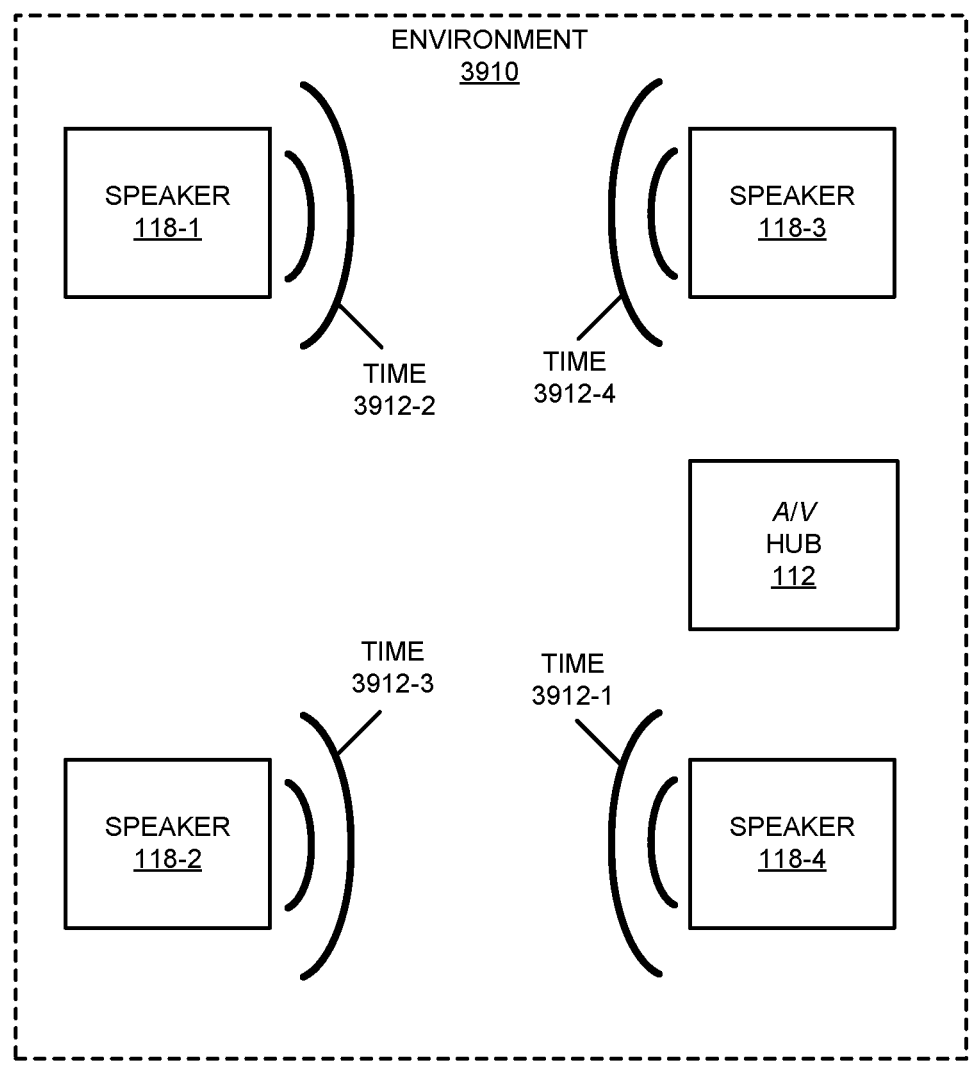
FIG. 39 is a drawing illustrating an example of self-configuration of a group of speakers in accordance with an embodiment of the present disclosure.

FIG. 39 presents a drawing illustrating an example of self-configuration of a group of speakers. When more than one adaptive speaker 118 is located within an environment 3910, the speakers may be used to implement a measurement and information network to acquire knowledge about the physical and/or acoustic characteristics of the environment. This network may communicate information among the speakers and/or an A/V hub, such as current acoustic measurements. In particular, each one of speakers 118 may be capable of outputting sound and/or measuring sounds output by a remainder of the speakers. For examples, speakers 118 may output sound at times 3912, while the remainder of speakers 118 perform sound measurements. Speakers 118 may share the acoustic measurements in a distributed manner to the remainder of speakers 118 and/or A/V hub 112.

In some embodiments of any of the embodiments discussed previous or subsequently, the speakers may be included neighboring or adjacent rooms in a building house. Each of the speakers may be configured to monitor movement of a listener through the rooms. As the listener leaves a first room and enters a second room, a first speaker in the first room may stop playing music and a second speaker in the second room may start playing the music. In this way, the speakers may present music in an automated and consistent manner to the listener as they move through the rooms (and, more generally, a living space), without requiring further action by the listener.

Figure 40:
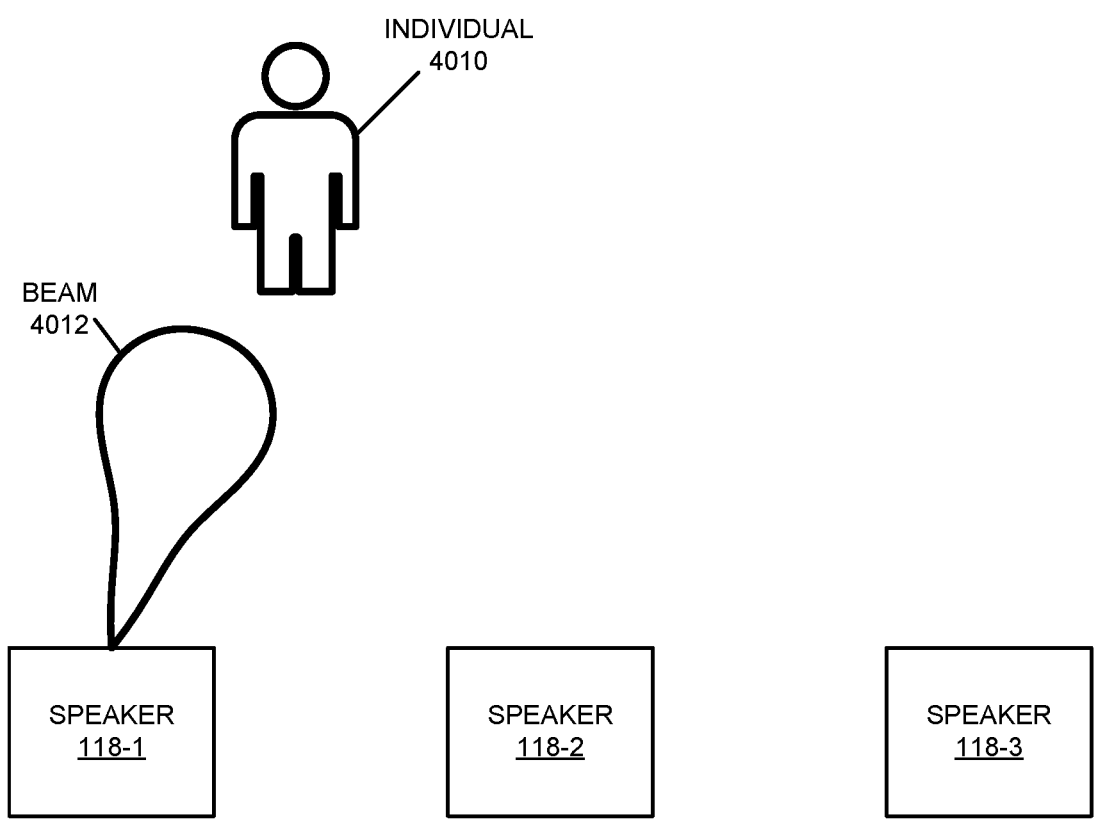
FIG. 40 is a drawing illustrating an example of self-configuration of an intelligent headphone-free conversation in accordance with an embodiment of the present disclosure.

Another embodiment of the adaptation technique facilitates an intelligent headphone-free conversation. This is shown in FIG. 40, which presents a drawing illustrating an example of self-configuration of an intelligent headphone-free conversation (which is sometimes referred to as 'teleconferencing'). This technique may be performed by an electronic device (such as A/V hub 112), which may communicate with a set of second electronic device (such as one or more of speakers 118).

Notably, an adaptive speaker may improve privacy and intelligibility during a teleconference or a hands-free telephone conversation. In some embodiments, A/V hub 112 may acquire information that identifies an individual in an environment (e.g., using one or more techniques, such as: based at least in part on an identifier of their cellular telephone, face recognition, voice recognition, biometric identification, etc.).

Then, upon acceptance of an incoming call or initiating a phone call, and use a hands-free or speakerphone mode, A/V hub 112 may use a location of the individual 4010 to select a nearest or proximate speaker, such as speaker 118-1. In some embodiments, the location may be determined using one or more directional microphones and/or image sensors when the individual is speaking. Moreover, A/V hub 112 may calculate an acoustic radiation pattern having beam 4012 for speaker 118-1, so that speaker 118-1 can beam sound to the individual during the phone call using one or more acoustic transducers or drivers. Furthermore, speaker 118-1 can receive sound from or associated with the individual during the phone call using the one or more directional microphones (such as a beam-formed microphone) and the acoustic radiation pattern. Note that using techniques described previously with reference to FIG. 4 (such as using optical and/or acoustic measurements), A/V hub 112 may track changes in the location of the individual, and may dynamically modify or update the acoustic radiation pattern.

The resulting telephone conversation may provide or offer improved intelligibility and privacy as the audio to and from the individual may be maintained as a narrow beam. This may reduce or eliminate cross-talk with other individuals in the environment, as well as reducing pick up off reverberant sound in the environment (such as ambient or background noise).

In some embodiments of methods 200 (FIG. 2), 400 (FIG. 4), 900 (FIG. 9), 1300 (FIG. 13), 1600 (FIG. 16), 1900 (FIG. 19), 2200 (FIG. 22), 2500 (FIG. 25), 2800 (FIG. 28), 3100 (FIG. 31), 3400 (FIG. 34) and/or 3700 (FIG. 37) there are additional or fewer operations. Moreover, the order of the operations may be changed, and/or two or more operations may be combined into a single operation. Furthermore, one or more operations may be modified. For example, operations performed by the electronic device (such as A/V hub 112 in FIG. 1) may be performed by the second electronic device (such as speaker 118-1 in FIG. 1) and/or vice versa.

We now describe embodiments of an electronic device. FIG. 41 presents a block diagram illustrating an example of an electronic device 4100, such as portable electronic device 110, A/V hub 112, one of A/V display devices 114, receiver device 116 or one of speakers 118 in FIG. 1. This electronic device includes processing subsystem 4110, memory subsystem 4112, networking subsystem 4114, optional feedback subsystem 4134, timing subsystem 4136 and measurement subsystem 4140. Processing subsystem 4110 includes one or more devices configured to perform computational operations. For example, processing subsystem 4110 can include one or more microprocessors, application-specific integrated circuits (ASICs), microcontrollers, programmable-logic devices, graphics processing units (GPUs) and/or one or more digital signal processors (DSPs). One or more of these components in processing subsystem are sometimes referred to as a 'control logic' or a 'control circuit.'

Memory subsystem 4112 includes one or more devices for storing data and/or instructions for processing subsystem 4110 and networking subsystem 4114. For example, memory subsystem 4112 can include dynamic random access memory (DRAM), static random access memory (SRAM), and/or other types of memory. In some embodiments, instructions for processing subsystem 4110 in memory subsystem 4112 include: one or more program modules (e.g., sets of program instructions) or, more generally, program instructions (such as program instructions 4122 or operating system 4124), which may be executed by processing subsystem 4110. Note that the one or more computer programs, program modules or program instructions may constitute a computer-program mechanism. Moreover, instructions in the various modules in memory subsystem 4112 may be implemented in: a high-level procedural language, an object-oriented programming language, and/or in an assembly or machine language. Furthermore, the programming language may be compiled or interpreted, e.g., configurable or configured (which may be used interchangeably in this discussion), to be executed by processing subsystem 4110.

In addition, memory subsystem 4112 can include circuits or functionality for controlling access to the memory. In some embodiments, memory subsystem 4112 includes a memory hierarchy that comprises one or more caches coupled to a memory in electronic device 4100. In some of these embodiments, one or more of the caches is located in processing subsystem 4110.

In some embodiments, memory subsystem 4112 is coupled to one or more high-capacity mass-storage devices (not shown). For example, memory subsystem 4112 can be coupled to a magnetic or optical drive, a solid-state drive, or another type of mass-storage device. In these embodiments, memory subsystem 4112 can be used by electronic device 4100 as fast-access storage for often-used data, while the mass-storage device is used to store less frequently used data.

Networking subsystem 4114 includes one or more devices configured to couple to and communicate on a wired and/or wireless network (i.e., to perform network operations), including: control logic 4116, interface circuits 4118 and associated antennas 4120 (which are sometimes referred to as 'wireless antennas'). (While FIG. 41 includes antennas 4120, in some embodiments electronic device 4100 includes one or more nodes, such as nodes 4108, e.g., pads, which can be coupled to antennas 4120. Thus, electronic device 4100 may or may not include antennas 4120.) For example, networking subsystem 4114 can include a Bluetooth networking system, a cellular networking system (e.g., a 3G/4G network such as UMTS, LTE, etc.), a universal serial bus (USB) networking system, a networking system based at least in part on the standards described in IEEE 802.11 (e.g., a Wi-Fi networking system), an Ethernet networking system, and/or another networking system. Note that the combination of a given one of interface circuits 4118 and at least one of antennas 4120 may constitute a radio. In some embodiments, networking subsystem 4114 includes a wired interface, such as HDMI interface 4130.

Networking subsystem 4114 includes processors, controllers, radios/antennas, sockets/plugs, and/or other devices used for coupling to, communicating on, and handling data and events for each supported networking system. Note that components used for coupling to, communicating on, and handling data and events on the network for each network system are sometimes collectively referred to as a 'network interface' for the network system. Moreover, in some embodiments a 'network' between the electronic devices does not yet exist. Therefore, electronic device 4100 may use the components in networking subsystem 4114 for performing simple wireless communication between the electronic devices, e.g., transmitting advertising or beacon frames and/or scanning for advertising frames transmitted by other electronic devices as described previously.

Within electronic device 4100, processing subsystem 4110, memory subsystem 4112, networking subsystem 4114, optional feedback subsystem 4134, timing subsystem 4136 and measurement subsystem 4140 are coupled together using bus 4128. Bus 4128 may include an electrical, optical, and/or electro-optical connection that the subsystems can use to communicate commands and data among one another. Although only one bus 4128 is shown for clarity, different embodiments can include a different number or configuration of electrical, optical, and/or electro-optical connections among the subsystems.

In some embodiments, electronic device 4100 includes a display subsystem 4126 for displaying information on a display (such as a request to clarify an identified environment), which may include a display driver, an I/O controller and the display. Note that a wide variety of display types may be used in display subsystem 4126, including: a two-dimensional display, a three-dimensional display (such as a holographic display or a volumetric display), a head-mounted display, a retinal-image projector, a heads-up display, a cathode ray tube, a liquid-crystal display, a projection display, an electroluminescent display, a display based on electronic paper, a thin-film transistor display, a high-performance addressing display, an organic light-emitting diode display, a surface-conduction electronic-emitter display, a laser display, a carbon-nanotube display, a quantum-dot display, an interferometric modulator display, a multi-touch touchscreen (which is sometimes referred to as a touch-sensitive display), and/or a display based on another type of display technology or physical phenomenon.

Furthermore, optional feedback subsystem 4134 may include one or more sensor-feedback components or devices, such as: a vibration device or a vibration actuator (e.g., an eccentric-rotating-mass actuator or a linear-resonant actuator), a light, one or more speakers (such as an array of speakers), etc., which can be used to provide feedback to a user of electronic device 4100 (such as sensory feedback). Alternatively or additionally, optional feedback subsystem 4134 may be used to provide a sensory input to the user. For example, the one or more speakers may output sound, such as audio. Note that the one or more speakers may include an array of transducers that can be modified to adjust a characteristic of the sound output by the one or more speakers. This capability may allow the one or more speakers to modify the sound in an environment to achieve a desired acoustic experience for a user, such as by changing equalization or spectral content, phase and/or a direction of the propagating sound waves. Thus, in some embodiments, one or more acoustic radiation patterns of the one or more speakers may be adapted (e.g., dynamically) based at least in part on one or more criteria, which may be determined based at least in part on one or more measurements performed by measurement subsystem 4140 and/or content, context or both of audio content output by the one or more speakers.

Additionally, timing subsystem 4136 may include one or more clock circuits 4138 that are used to generate clocks in electronic device 4100, such as based at least in part on one or more reference clocks.

Measurement subsystem 4140 may include one or more sensors 4142.

The one or more sensors 4142 may include: one or more image sensors (such as a CMOS image sensor, a CCD, a camera, an infrared sensor, etc.), an optical ranging device (such as an LED, a laser, etc.), a wireless-ranging device, a microphone, an array of microphones, a phased acoustic array, an acoustic transducer that selectively outputs sound or test signals, and/or another type of sensor.

Electronic device 4100 can be (or can be included in) any electronic device with at least one network interface. For example, electronic device 4100 can be (or can be included in): a desktop computer, a laptop computer, a subnotebook/ netbook, a server, a tablet computer, a smartphone, a cellular telephone, a smartwatch, a consumer-electronic device (such as a television, a set-top box, audio equipment, a speaker, a headset, in-ear or over-ear headphones, video equipment, etc.), a remote control, a portable computing device, an access point, a router, a switch, communication equipment, test equipment, and/or another electronic device.

Although specific components are used to describe electronic device 4100, in alternative embodiments, different components and/or subsystems may be present in electronic device 4100. For example, electronic device 4100 may include one or more additional processing subsystems, memory subsystems, networking subsystems, display subsystems, feedback subsystems, timing subsystems and/or measurement subsystems. Moreover, while one of antennas 4120 is shown coupled to a given one of interface circuits 4118, there may be multiple antennas coupled to the given one of interface circuits 4118. For example, an instance of a 3×3 radio may include three antennas. Additionally, one or more of the subsystems may not be present in electronic device 4100. Furthermore, in some embodiments, electronic device 4100 may include one or more additional subsystems that are not shown in FIG. 41. Also, although separate subsystems are shown in FIG. 41, in some embodiments, some or all of a given subsystem or component can be integrated into one or more of the other subsystems or component(s) in electronic device 4100. For example, in some embodiments program instructions 4122 are included in operating system 4124.

Moreover, the circuits and components in electronic device 4100 may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

An integrated circuit may implement some or all of the functionality of networking subsystem 4114 (such as one or more radios) or one or more other components in electronic device 4100. Moreover, the integrated circuit may include hardware and/or software components that are used for transmitting wireless signals from electronic device 4100 and receiving signals at electronic device 4100 from one or more other electronic devices. Aside from the components, circuits and functionality herein described, radios are generally known in the art and hence are not described in detail. In general, networking subsystem 4114 and/or the integrated circuit can include any number of radios.

In some embodiments, networking subsystem 4114 and/or the integrated circuit include a configuration component (such as one or more hardware and/or software components) that configures the radios to transmit and/or receive on a given channel (e.g., a given carrier frequency). For example, in some embodiments, the configuration component can be used to switch the radio from monitoring and/or transmitting on a given channel to monitoring and/or transmitting on a different channel. (Note that 'monitoring' as used herein comprises receiving signals from other electronic devices and possibly performing one or more processing operations on the received signals, e.g., determining if the received signal comprises an advertising frame, calculating a performance metric, performing spectral analysis, etc.) Furthermore, networking subsystem 4114 may include at least one port (such as an HDMI port 4132) to receive and/or provide the information in the data stream to at least one of A/V display devices 114 (FIG. 1), at least one of speakers 118 (FIG. 1) and/or at least one of content sources 120 (FIG. 1).

While a communication protocol compatible with Wi-Fi was used as an illustrative example, the described embodiments may be used in a variety of network interfaces. For example, in some embodiments the adaptation technique is used with an Ethernet communication protocol instead of a wireless communication protocol. In particular, the Ethernet communication protocol may be used for room-to-room communication (i.e., communication over distance larger than 10-30 m). In these embodiments, the Wi-Fi communication protocol may be used for intra-room communication and playback coordination of multiple devices in the room, and the clocks used by the Wi-Fi interface circuit and the Ethernet interface circuit may be coordinated, so that there is end-to-end coordination (i.e., from an I$^2$S circuit in a content source to an I$^2$S circuit in a receiver, such as a speaker). Note that with room-to-room communication via an Ethernet communication protocol, the coordination technique may be compatible with an IEEE 802.11v, such that the transmit time may be provided to the receiver after an ACK is received.

Furthermore, while some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the coordination technique and/or the adaptation technique may be implemented using program instructions 4122, operating system 4124 (such as drivers for interface circuits 4118) and/or in firmware in interface circuits 4118. Alternatively or additionally, at least some of the operations in the coordination technique and/or the adaptation technique may be implemented in a physical layer, such as hardware in interface circuits 4118.

Moreover, while the preceding embodiments included a touch-sensitive display in the portable electronic device that the user touches (e.g., with a finger or digit, or a stylus), in other embodiments the user interface is display on a display in the portable electronic device and the user interacts with the user interface without making contact or touching the surface of the display. For example, the user's interact(s) with the user interface may be determined using time-of-flight measurements, motion sensing (such as a Doppler measurement) or another non-contact measurement that allows the position, direction of motion and/or speed of the user's finger or digit (or a stylus) relative to position(s) of one or more virtual command icons to be determined. In these embodiments, note that the user may activate a given virtual command icon by performing a gesture (such as 'tapping' their finger in the air without making contact with the surface of the display). In some embodiments, the user navigates through the user interface and/or activates/deactivates functions of one of the components in system 100 (FIG. 1) using spoken commands or instructions (i.e., via voice recognition) and/or based at least in part on where they are looking at one a display in portable electronic device 110 or on one of A/V display devices 114 in FIG. 1 (e.g., by tracking the user's gaze or where the user is looking).

Furthermore, while A/V hub 112 (FIG. 1) were illustrated as separate components from A/V display devices 114 (FIG. 1), in some embodiments an A/V hub and an A/V display device are combined into a single component or a single electronic device.

While the preceding embodiments illustrated the coordination technique and/or the adaptation technique with audio and/or video content (such as HDMI content), in other embodiments the coordination technique and/or the adaptation technique is used in the context of an arbitrary type of data or information. For example, the coordination technique and/or the adaptation technique may be used with home-automation data. In these embodiments, A/V hub 112 (FIG. 1) may facilitate communication among and control of a wide variety of electronic devices. Thus, A/V hub 112 (FIG. 1) and the coordination technique and/or the adaptation technique may be used to facilitate or implement services in the so-called Internet of things.

While numerical values are provided in some of the preceding embodiments, these are illustrative values and are not intended to be limiting. Consequently, different numerical values may be used.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:
1. An electronic device, comprising:
an interface circuit configured to communicate with a second electronic device; and
a set of drivers configured to output sound, wherein the electronic device is configured to:
receive, at the interface circuit, audio content and an acoustic radiation pattern associated with the second electronic device, wherein the acoustic radiation pattern has a beam with a principal direction;
determine drive signals for the set of drivers based at least in part on the audio content and the acoustic radiation pattern;
adjust the drive signals for at least a subset of the set of drivers based at least in part on a distortion margin in at least the subset of the drivers, wherein the distortion margin is based at least in part on the drive signals, a distortion threshold of at least the subset of the drivers and a volume setting, wherein the adjustment trades off directivity of the acoustic radiation pattern and sound distortion in a band of audio frequencies below 400 Hz based at least in part on the drive signals, the distortion threshold and the volume setting, and wherein, when the volume setting exceeds a first threshold, a quadrupole component of an acoustic radiation pattern is removed from the adjusted drive signals and, when the volume setting exceeds a second threshold that is larger than the first threshold, a dipole component of the acoustic radiation pattern is removed from the adjusted drive signals; and output, based at least in part on the adjusted drive signals and the acoustic radiation pattern, the sound corresponding to the audio content using the set of drivers.

2. The electronic device of claim 1, wherein the adjusted drive signals limit displacement of cones in at least the subset of the drivers to reduce sound distortion.

3. The electronic device of claim 1, wherein the volume setting corresponds a sound pressure level (SPL).

4. The electronic device of claim 1, wherein the adjustment backs off from a directional acoustic radiation pattern toward an omnidirectional acoustic radiation pattern in the band of audio frequencies based at least in part on the distortion margin, the first threshold and the second threshold.

5. The electronic device of claim 1, wherein the adjustment reduces an amplitude of the drive signals in a second band of audio frequencies based at least in part on the distortion margin and a third threshold.

6. The electronic device of claim 1, wherein, when the volume setting exceeds a first third threshold, frequencies in the band of audio frequencies below 400 Hz are removed from the adjusted drive signals.

7. The electronic device of claim 1, wherein, when the volume setting is below the first threshold, the adjusted drive signals are associated with a directional acoustic radiation pattern.

8. A non-transitory computer-readable storage medium for use with an electronic device, the computer-readable storage medium storing program instructions that, when executed by the electronic device, causes the electronic device to perform one or more operations comprising:

receiving, at an interface circuit in the electronic device, audio content and an acoustic radiation pattern associated with a second electronic device, wherein the acoustic radiation pattern has a beam with a principal direction;

determining drive signals for a set of drivers in the electronic device based at least in part on the audio content and the acoustic radiation pattern;

adjusting the drive signals for at least a subset of the set of drivers based at least in part on a distortion margin in at least the subset of the drivers, wherein the distortion margin is based at least in part on the drive signals, a distortion threshold of at least the subset of the drivers and a volume setting, wherein the adjustment trades off directivity of the acoustic radiation pattern and sound distortion in a band of frequencies below 400 Hz based at least in part on the drive signals, the distortion threshold and the volume setting, and wherein, when the volume setting exceeds a first threshold, a quadrupole component of an acoustic radiation pattern is removed from the adjusted drive signals and, when the volume setting exceeds a second threshold that is larger than the first threshold, a dipole component of the acoustic radiation pattern is removed from the adjusted drive signals; and outputting, based at least in part on the adjusted drive signals and the acoustic radiation pattern, sound corresponding to the audio content using the set of drivers.

9. The computer-readable storage medium of claim 8, wherein the adjusted drive signals limit displacement of cones in at least the subset of the drivers to reduce sound distortion.

10. The computer-readable storage medium of claim 8, wherein the volume setting corresponds a sound pressure level (SPL).

11. The computer-readable storage medium of claim 8, wherein the adjustment backs off from a directional acoustic radiation pattern toward an omnidirectional acoustic radiation pattern in the band of audio frequencies based at least in part on the distortion margin, the first threshold and the second threshold.

12. The computer-readable storage medium of claim 8, wherein the adjustment reduces an amplitude of the drive signals in a second band of audio frequencies based at least in part on the distortion margin and a third threshold.

13. The computer-readable storage medium of claim 8, wherein, when the volume setting exceeds a third threshold, frequencies in the band of audio frequencies below 400 Hz are removed from the adjusted drive signals.

14. The computer-readable storage medium of claim 8, wherein, when the volume setting is below the first threshold, the adjusted drive signals are associated with a directional acoustic radiation pattern.

15. A method for adjusting drive signals, comprising:

by an electronic device:

receiving, at an interface circuit in the electronic device, audio content and an acoustic radiation pattern associated with a second electronic device, wherein the acoustic radiation pattern has a beam with a principal direction;

determining the drive signals for a set of drivers in the electronic device based at least in part on the audio content and the acoustic radiation pattern;

adjusting the drive signals for at least a subset of the set of drivers based at least in part on a distortion margin in at least the subset of the drivers, wherein the distortion margin is based at least in part on the drive signals, a distortion threshold of at least the subset of the drivers and a volume setting, wherein the adjustment trades off directivity of the acoustic radiation pattern and sound distortion in a band of frequencies below 400 Hz based at least in part on the drive signals, the distortion threshold and the volume setting, and wherein, when the volume setting exceeds a first threshold, a quadrupole component of an acoustic radiation pattern is removed from the adjusted drive signals and, when the volume setting exceeds a second threshold that is larger than the first threshold, a dipole component of the acoustic radiation pattern is removed from the adjusted drive signals; and outputting, based at least in part on the adjusted drive signals and the acoustic radiation pattern, sound corresponding to the audio content using the set of drivers.

16. The method of claim 15, wherein the adjusted drive signals limit displacement of cones in at least the subset of the drivers to reduce sound distortion.

17. The method of claim 15, wherein the volume setting corresponds a sound pressure level (SPL).

18. The method of claim 15, wherein the adjustment backs off from a directional acoustic radiation pattern toward an omnidirectional acoustic radiation pattern in the band of audio frequencies based at least in part on the distortion margin, the first threshold and the second threshold.

19. The method of claim 15, wherein the adjustment reduces an amplitude of the drive signals in a second band of audio frequencies based at least in part on the distortion margin and a third threshold.

20. The method of claim 15, wherein, when the volume setting exceeds a third threshold, frequencies in the band of audio frequencies below 400 Hz are removed from the adjusted drive signals.

* * * * *